(12) United States Patent
Izadian

(10) Patent No.: US 8,212,580 B2
(45) Date of Patent: Jul. 3, 2012

(54) SCALABLE WIDEBAND PROBES, FIXTURES, AND SOCKETS FOR HIGH SPEED IC TESTING AND INTERCONNECTS

(75) Inventor: Jamal S. Izadian, San Jose, CA (US)

(73) Assignee: Google Inc., Mountain View, CA (US)

( * ) Notice: Subject to any disclaimer, the term of this patent is extended or adjusted under 35 U.S.C. 154(b) by 274 days.

(21) Appl. No.: 12/061,552

(22) Filed: Apr. 2, 2008

(65) Prior Publication Data

US 2008/0265919 A1    Oct. 30, 2008

Related U.S. Application Data

(60) Provisional application No. 60/909,685, filed on Apr. 2, 2007.

(51) Int. Cl.
*G01R 1/067* (2006.01)
(52) U.S. Cl. .................................................. 324/755.02
(58) Field of Classification Search ........................ None
See application file for complete search history.

(56) References Cited

U.S. PATENT DOCUMENTS

| | | | | |
|---|---|---|---|---|
| 4,673,904 A * | 6/1987 | Landis | ........................... | 333/238 |
| 6,523,252 B1 * | 2/2003 | Lipponen | ........................ | 29/828 |
| 6,847,274 B2 * | 1/2005 | Salmela et al. | ................ | 333/222 |
| 7,259,640 B2 * | 8/2007 | Brown et al. | .................. | 333/160 |

* cited by examiner

*Primary Examiner* — Paresh Patel
(74) *Attorney, Agent, or Firm* — McDonnell Boehnen Hulbert & Berghoff LLP

(57) ABSTRACT

We introduce a new Periodic micro coaxial transmission line (PMTL) that is capable of sustaining a TEM propagation mode up to THz band. The PMTL can be manufactured using current photolithographic processes. This transmission line can be embedded in microscopic layers that allow many new applications. We further use the embedded PMTL to develop a modular, scaleable and fully automated Universal Test Fixture for testing chips in various stages of development mainly for digital IC chips that can be utilized in production lines with pick and place of chips on tape to test every chip before insertion into circuits. The PMTL can also provide Confined Field Interconnects between various elements on semiconductor wafers to reduce parasitic and radiation losses and practically eliminating cross talk, thus, increasing the speed of digital IC's. The PMTL is also used to develop a Universal Test Socket, and a Hand Probe.

19 Claims, 38 Drawing Sheets

FIG. 7A
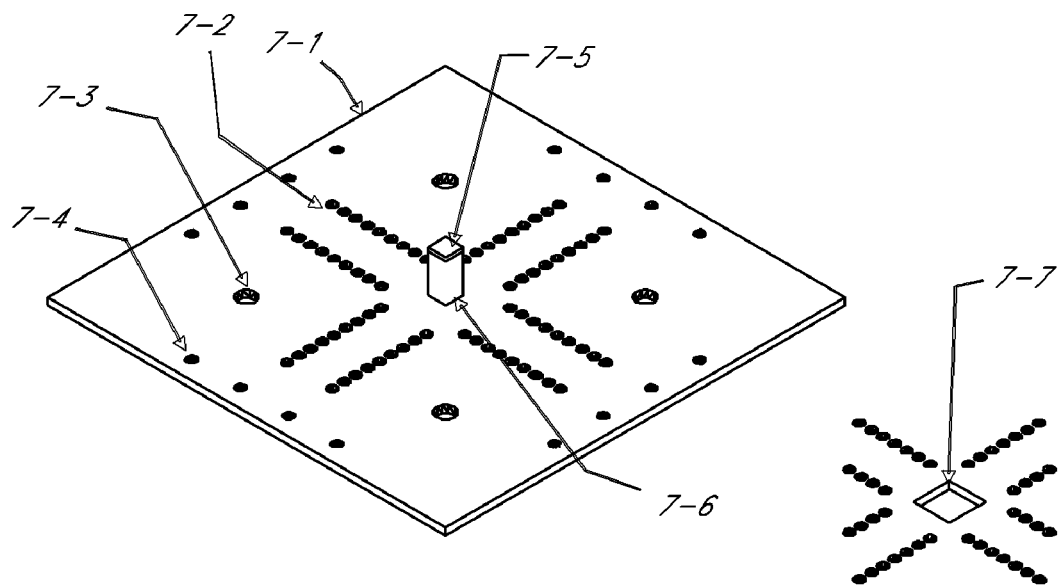
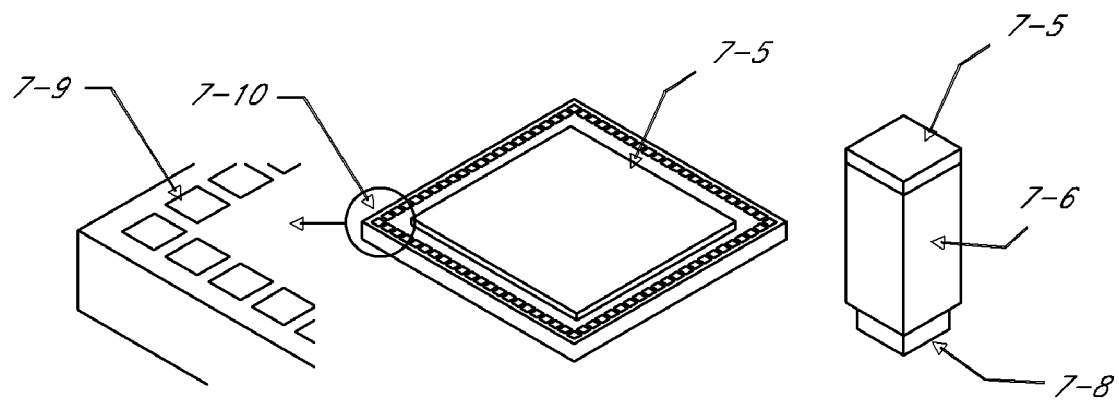
FIG. 7B

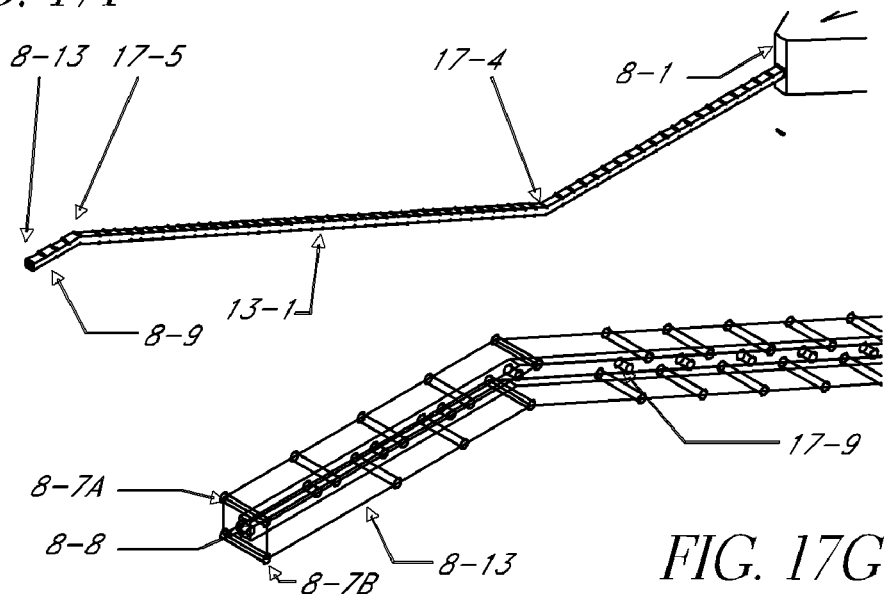
FIG. 17F
FIG. 17G
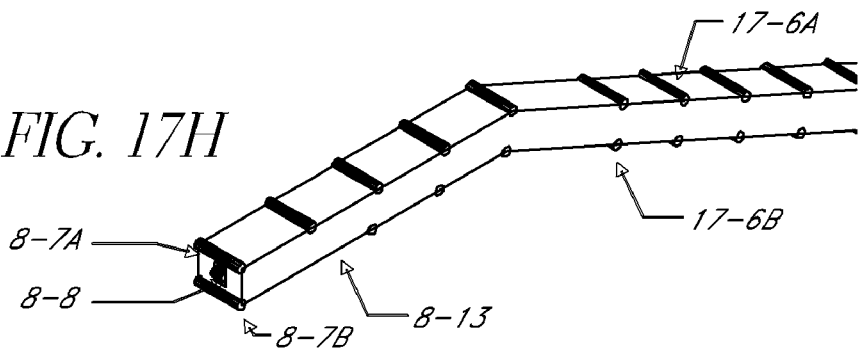
FIG. 17H
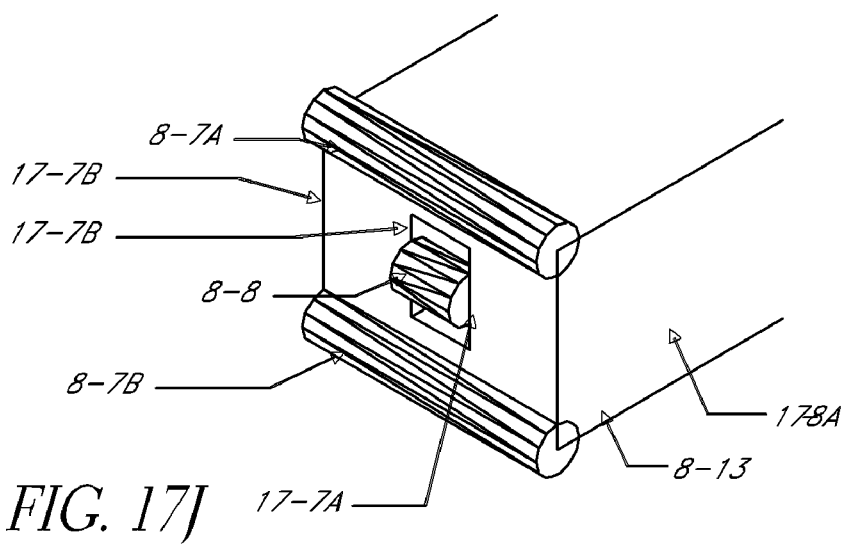
FIG. 17J

FIG. 34A
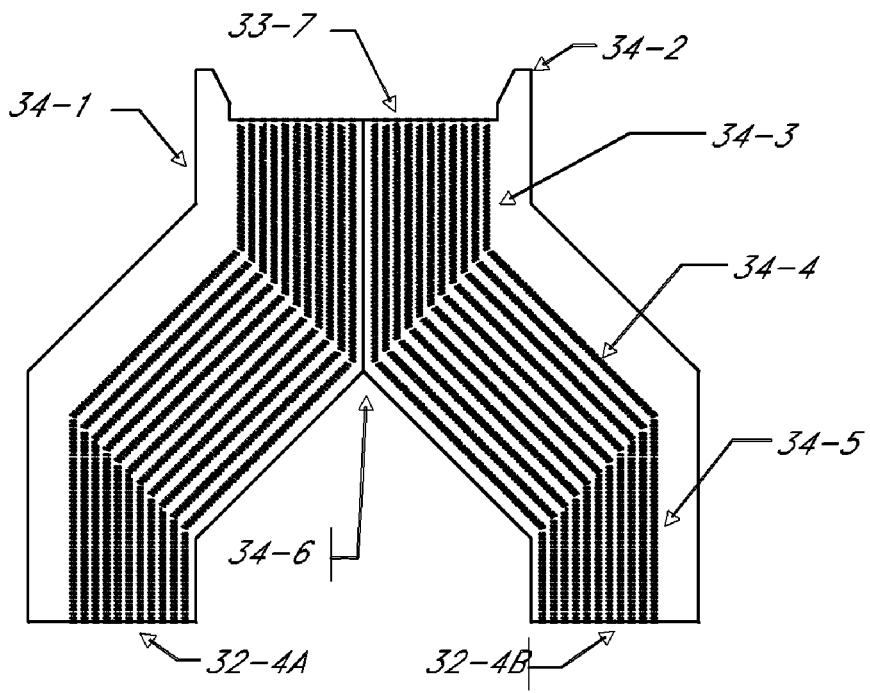
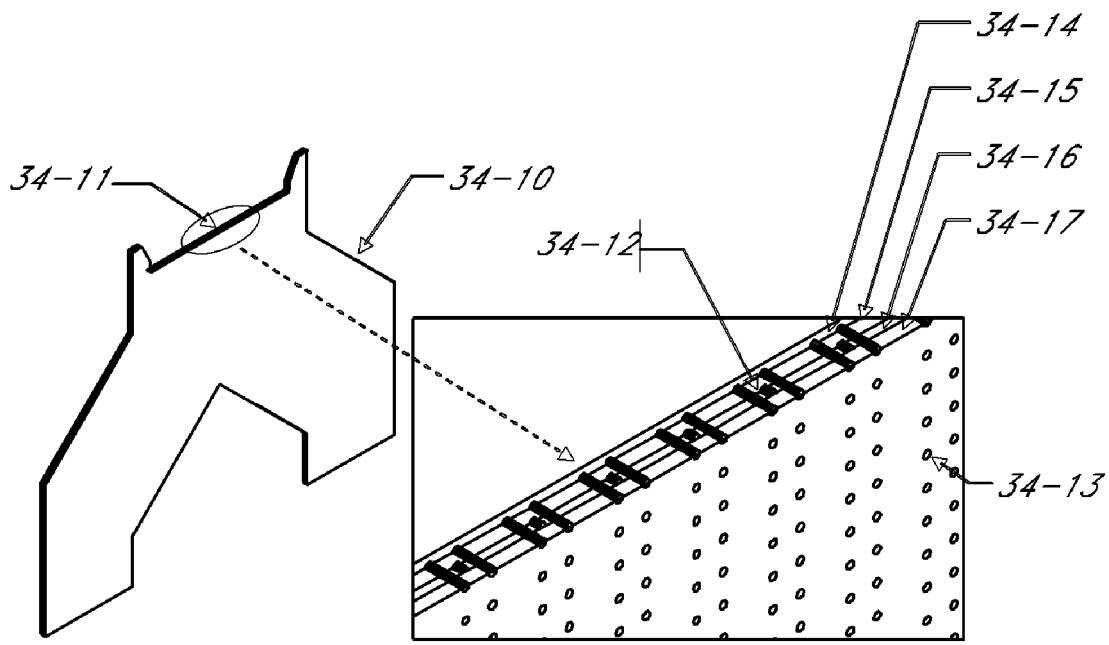
FIG. 34B  FIG. 34C

FIG. 35A
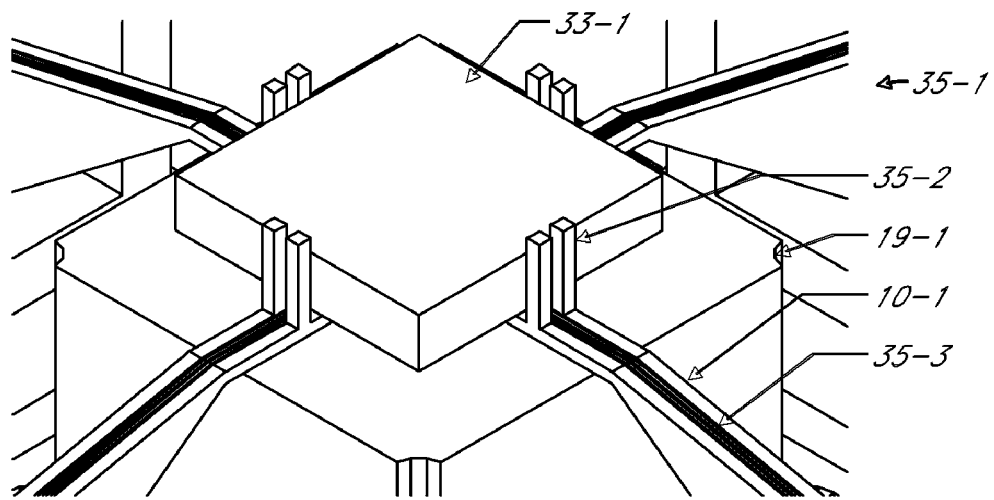
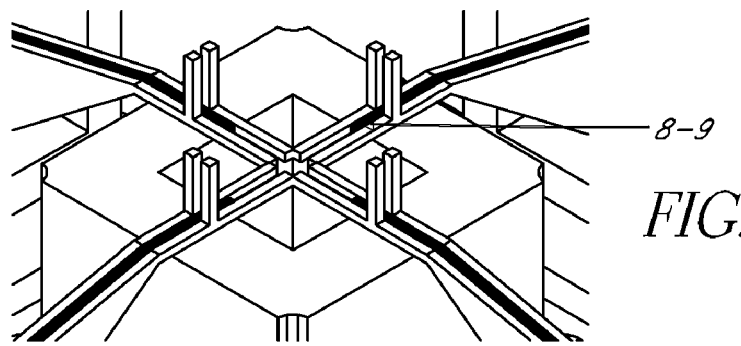
FIG. 35B
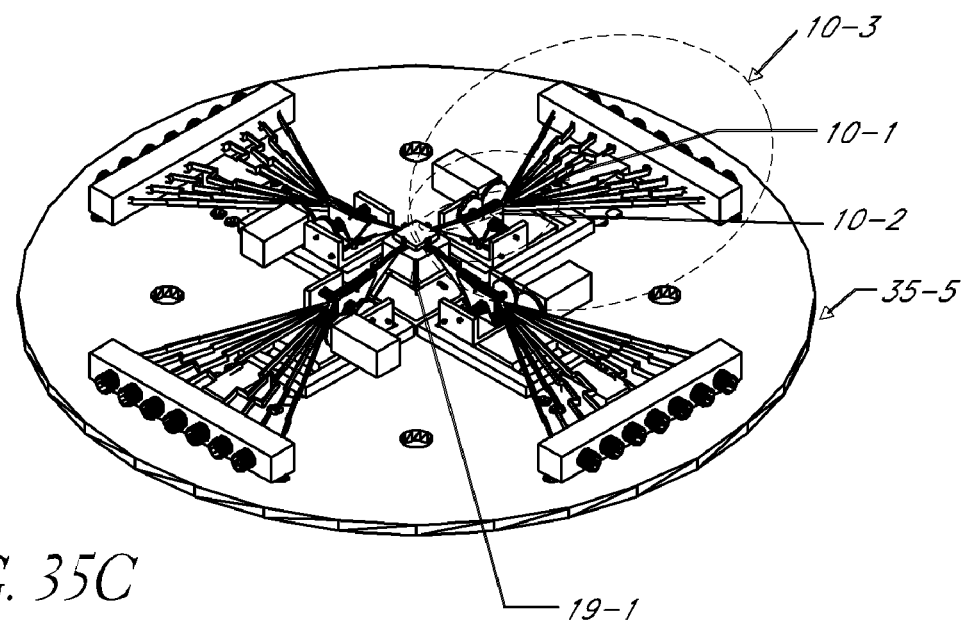
FIG. 35C

SCALABLE WIDEBAND PROBES, FIXTURES, AND SOCKETS FOR HIGH SPEED IC TESTING AND INTERCONNECTS

REFERENCE TO RELATED APPLICATIONS

The present application claims priority to U.S. Provisional Application No. 60/909,685, filed Apr. 2, 2007, titled "SCALABLE WIDEBAND PROBES, FIXTURES, AND SOCKETS FOR HIGH SPEED IC TESTING AND INTERCONNECTS," the entire contents of which is hereby incorporated by reference.

BACKGROUND OF THE INVENTION

1. Field of the Invention

The invention relates to probes and/or fixtures for testing and using integrated circuits.

2. Description of the Related Art

The cycle of the semiconductor product development includes: wafer processing, wafer testing, probing, cutting into single devices/chips, packaging devices, circuit insertion, module insertion, subsystem insertion, and system integration. A failure of semiconductor chip in any of these stages can be rather damaging. But the earlier the problem is identified, the sooner and less disastrous the consequence will be. In the product cycle, the chips are bare and easy to get to, even if they're Micronics in dimensions, but as they get integrated into the product hierarchy, they become embedded deep within other components. If they fail, the whole system will fail, and the remedies, if any, are fewer and more costly. The failure is often more catastrophic and costly as the level of integration increases. It is preferable if the chip fails before use, rather than during use. As the designers build more complexities into these chips, the need for improved test equipment becomes even more critical.

SUMMARY OF THE INVENTION

These and other problems are solved by a Periodic Micro Coaxial Transmission Line (PMTL) described herein provides Confined Field Interconnection (CFI) between devices in wafer and on a high speed board, thus, substantially reducing cross talk and prasitics and allowing relatively higher speeds and wider bandwidth. In one embodiment, the PMTL is used in connection with semiconductor test and evaluation of wafers and single chips resulting from wafer cutting in various stages of development including packaging, wire bounding, socket and the like.

One embodiment includes a unified process for testing of semiconductor chips from wafer probing to cutting, to individual chips, chip carriers, packaged devices and multi chip modules, and high speed PCB boards.

The TEM microwave transmission line disclosed herein can be manufactured using the existing printed circuit board processes. It provides a low cost approach to developing high performance very wideband TEM transmission lines that can be operated from DC to at least 220 GHz in a practical manner within the reach of the current manufacturing tolerances of the semiconductor processing technologies. This can be implemented on many types of circuit materials, including a micro coaxial transmission line on flexible circuit board materials that allows flexing of the transmission line with stable electrical characteristics up to 220 GHz and beyond. For example, in the transmission lines disclosed here, it is possible to manufacture a micro coax with dimensions on the order of a few tens of microns or less that can support TEM waves up to 500 GHz or more relatively free of higher order modes. Reducing dimensions to the hundreds of 100 of nanometers will allow use of waves of frequencies in the terahertz range. As the dimensions become large with respect to wavelength, the mediums behave like an optical guide. As the wavelength becomes comparable to the size of the molecular structures of the lattice structure of the material it is constructed from, the line becomes a periodic structure that may be able to sustain some modes of wave propagation. At these regions, contact-less transmission becomes more dominant.

These devices are useful for testing and evaluation of semiconductor chips which are of the order of dimensions of tens of microns. The industry still uses contacted I/O ports for testing. Thus, in order to be able to evaluate these Micronics chips, it is necessary to make reliable and highly repeatable connections to their I/O terminal pads. These terminal pads are of the order of tens of microns.

In one embodiment, pads can be connected to test instrumentations of various sizes and shapes with terminal connectors and interfaces of a few tens of millimeters in dimension. These highly specialized instrumentations usually need to be sent in a wideband signal or swept frequencies, or sharp digital pulses of spectral contents of several hundreds of gigahertz to the chip terminal pads, and take the response back to the instrument for further data processing. This is a normal test process for high speed semiconductors of today and ever-increasing bandwidth of semiconductors of the futures, extending ultimately into micrometer and nanometer regions.

Although many of the traditional high-speed semiconductor chips had only a few RF connections (e.g., input and output ports), many of the new sophisticated chips have a multiplicity of high bandwidth RF ports, a multiplicity of mixed signal sharp digital signals, many control signals and command, and several DC power lines to bias the chips.

There has never been a systematic and unified approach to testing these sophisticated chips. This is mainly because there has not been a very wide band transmission line at the Micronics scales to provide performance from DC to hundreds of GHz.

The Micronics coaxial transmission line approach disclosed herein, in one embodiment, solves these and other problems. This in turn provides a uniform approach to testing, thus allowing any transmission line to be used uniformly for DC power line, mixed signal digital control lines, or high speed digital signals, and/or very wide band RF Transmission lines.

One embodiment includes DC surge protection by incorporating lumped chip capacitors in strategic locations on the line, (e.g., designing integrated wideband bias tees, or other devices). Since the Micro (co)axial lines disclosed here are microscopic in dimension, it is possible to manufacture well-behaved TEM transmission lines that can be as thin as threads, and which can be as flexible to bending and with very stable phase and amplitude response over very wide band from DC to THz regions.

In one embodiment, the Micro (co)axial transmission line disclosed here emulates a stable type of transmission line capable of supporting a TEM transmission line to upper mm wave regions in a (co)axial transmission line. The micro (co)axial line takes advantage of the multilayer circuit board technology to construct a periodic structure that can support and maintain a TEM mode on local levels. So, if the line bends and twists and vibrates, the integrity of TEM wave is preserved up to a very high frequency limit.

At lower frequencies, the same unified approach can be used in more traditional manufacture process such as metal stamping manufacturing technology with photo fabrication and chemical etching and chemical machining of sheet metals to produce Micro (co)axial transmission lines. One embodiment combines the advantages of both manufacturing technologies to provide probes and transmission lines that have a relatively thin profile compared to the current state of wafer probes and connector technologies.

One embodiment uses multilayer technology to realize controlled impedance lines of wide range, of typically fifty, seventy five and hundreds of ohms to provide impedance control and matching to the instrumentation transmission lines and I/O terminals.

This allows accommodating any connection patterns of the chip terminals in a variety of transmission media such as microstrip line, strip line, Coplanar lines, etc. For example, in high speed semiconductor chips and dies, a coplanar line technology employs lines pads that usually have a pattern of G-S-G-S-G-S-G-S . . . or a combination thereof of G and S unit cells (where G stands for Ground, and S stands for Signal) that can be repeated as desired.

One of the major challenges of semiconductor testing is that every die footprint is different. A viable industry standard for connection pad is not possible without the versatile connection scheme disclosed herein. The Micro (co)axial lines disclosed herein allow scaling of the connections by stacking a basic unit element of G-S-G, as a basic building block that can be used to match a desired footprint or die connection. This building block can be used for die pad standards for DC power lines, Digital control line, High speed digital lines of mix signals, and wide band RF lines, etc. This allows standardization of testing procedures and processes that will reduce the product development cycle and accelerate time to market.

By way of example, and not limitation, consider a simple plan called herein a 555-50 standard, configured as lines G-S-G to pads of each five mils with a "G", Gap adjusted to give 50 Ohms. This basic pattern can be used around the chip regardless of the frequency of the signal and its nature. If it can be used for DC, digital control lines, mixed signals and very high speed lines, etc., to facilitate coaxial connection pads which confines the fields within the tips of the probe and pads as described in detail below as (CFP) Confined Filed Probes, and (CFC) Confined Field Connectors pads, and the like.

Because the Micro (co)axial line can be printed in any desired pattern, connectivity to a non-standard chip can be accommodated and very useful new possibilities become apparent. For example, in semiconductor test fixtures, coaxial connector pins have been extensively used, but such connector pins hinder access for viewing and workability. Disclosed herein is a universal test fixture that brings the most important element, namely the DUT chip to a top level, and moves the ancillary elements to a lower level away from the chip. This provides a reliable, safer and repeatable test environment amenable to high-speed production testing and automation such that chips can be tested through an automated test system and pick-and-place system. This will help bring the cost of semiconductor testing down to make it possible to test relatively larger numbers of chips instead of a small random sample.

In the prior art, the process of obtaining a probe to make a connection is rather time consuming and tedious. This is due to the present state of the art that requires highly accurate machining and circuit printing. The probes rely on high precision mechanical tips to make reliable connection, making each probe very expensive and highly customized. In various embodiments disclosed herein, low-cost high-precision photolithographic PCB processes are used to provide disposable probes. In various embodiments, medium-precision low-cost sheet metal chemical machining or etching is used to provide intermediate stages and layers, and standard sheet metal stamping, is used to provide lower precision parts that are used for rigidity and mechanical strength (e.g., for brackets, flanges and other fastening applications).

Testing typically requires high mechanical stability. The cables connecting from the test instrumentation to the test apparatus and ultimately to the DUT are rather expensive, and very bulky and heavy. This requires cables that are highly phase and amplitude stable, a goal that is met only by heavy mechanical reinforcement of the cables and jigs, and the environment.

At least one embodiment provides for separation of the rigidity away from the most sensitive element of DUT to the edge of a universal test fixture. Mechanical movements and vibration are decoupled by the test fixture mechanism from the DUT. The micro (co)axial technology provides a flexible TEM transmission mechanism that fans out from a central probe with multiplicity of connection pattern matching the chip pads on Micronics scale on one end, and the coaxial connectors of centimeter scale dimension on the other end. The mechanical movement or vibration of the testing cables on the other side is entirely isolated from the DUT. Furthermore, the flexibility of micro (co)axial fanned out lines allow fine movement and fine rotation of the probe connection near the DUT, thus providing new possibilities for testing of semiconductor chips.

This changes the philosophy of semiconductor testing. Traditionally, semiconductor testing has mainly concentrated on how to connect to a Micronics scale chip, get a signal in, get the response out, while powering the chip, and connect control lines, with limited possibility of calibration, in a process that takes a few weeks to achieve. By contrast, using embodiments disclosed herein, virtually every chip can be tested in a high-speed environment. This will improve the reliability of productions for various markets, especially for those with high reliability requirements such as communication, space, aviation, defense, etc.

At least one embodiment includes printed transmission line that allows a flexible connection to very small footprint semiconductor chips. Since this new transmission line uses printed circuit processes, it can be very low-cost and produced in high volumes. Thus, this disclosure describes the design and manufacture of this transmission line, as well as example designs for test fixtures and probes using these new devices for testing semiconductor IC's. The fixtures introduced here provide a range of possibility for single manual testing to fully automated high speed testing of digital semiconductor chips with very wide operational bandwidth. Furthermore, a very wideband multi-connector alligator type RF Clip and a new flush top signal launcher for quick connect/disconnect high speed PCB's are disclosed.

In one embodiment, probes that are at a tenth of the profile of the current probes and with much greater flexibility are provided. The probes can be designed to connect to a single input and output port or a plurality of input and output ports of various signal characteristics, with a uniform wideband impedance match. This alleviates the need for expensive machining processes used in the manufacture of RF test fixtures and probes today.

In addition to the use of multilayer printed circuit technology, metal stamping manufacturing process and chemical etching of sheet metal can be used. This allows one to use the very accurate process of photolithography for delicate high precision components of the probes, such as the probe tips, and precision transmission lines and to use the less precise metal photo fabrication chemical machining of thin sheet metal for intermediate precision and moderate strength, and heavier sheet metal stampings process for strength and lesser precision. The multilayer manufacturing described herein can be described as a layered system, as the inner layers are much smaller in features and much more delicate, and as one moves to the outer layers, they become larger in feature and thickness, and tougher in strength. The inner layers function as electrical interface while the outer layer serves as the structural and mechanical interface and support to the rest of the fixtures.

This process provides the ability to make excellent probe tips, a scalable and flexible micro transmission line with a few additional degrees of design freedom for connectivity, and in one embodiment, a vertical structure that holds it together firmly and that can be mounted in other structures and holders. There are currently no standards for the footprint of the die connection pad on chips. Thus, universal probe tips are not found in the prior art. At least one embodiment herein is configured to match any die pad connection patterns in a natural and scalable manner. The prior art systems are confined to 2D systems, whereas the disclosed embodiments provide 3D movement and a multiplicity of other degrees of freedom.

The disclosed probes allow a much greater degree of scalability in fixture design. The higher precision parts of the connector can be manufactured by high quality microwave substrates with refined texture or flexible circuit materials. This connector can be made as a disposable part of a test fixture, the rest of the test fixture can be made to be standard and reusable; As will be shown, the embodiment provides a module building block that can be used in various applications, for inter-device interconnects, edge launchers, alligator clips, wafer probes, test fixture, etc.

One embodiment includes a Periodic Micro (co)axial Transmission Line PMTL.

One embodiment includes a Flexible micro cable using the embedded PMTL, a multi stand flexible cable.

One embodiment includes a Processes for manufacture of Embedded PMT.

One embodiment includes a Multilayer Photolithographic Printed Circuit Board Technology (PCB) and/or CMOS type, and process.

One embodiment includes sheet metal chemical machining (e.g., photolithographic precision for traces) chemical etching precision.

One embodiment includes Sheet metal stamping, hole, tabs, patterns, brackets, flanges, slots, bends, shaping, etc.

One embodiment includes a Cannon-type Hub assembly.

One embodiment includes a Wide band Flush Top, Signal Launcher (FTL).

One embodiment includes a Peacock-like connector assembly with multiplicity of One embodiment includes a connectors and flexible PMTL's.

One embodiment includes a Pencil like vertical Probe.

One embodiment includes a Endoscope Pencil Probe.

One embodiment includes a UTF (Universal Test Fixture).

One embodiment includes a Flush Top Test Fixture (FTTF).

One embodiment includes one or more L, C, IC's and components.

One embodiment includes a Combination of Hybrid manufacturing processes Metal stamping/photo fabrication chemical etching, sheet metal processing, etc.

One embodiment includes a Confined Fields Probe CFP.

One embodiment includes Coaxial Chip Pads.

One embodiment includes an Alligator-Type RF Clip.

One embodiment includes an Alligator Type wide jawed RF Clip connector strip array.

One embodiment includes an RF Clipboard with attachable and PCB/DUT RF Clip connected to one end of a flexible PMTL Cable and with the other end of the PMTL flexible cable connected to a fixed (on Clipboard) coaxial connector, (similar to the way a pencil is attached to a clipboard via a string to keep it with the board) thus, allowing the RF Clip the freedom to move around for connection to a PCB/DUT connection points.

One embodiment includes a Flexible PMTL with high phase and amplitude stability and over bends, loops, twists, vibration de-coupler.

One embodiment includes a PMTL for Semiconductor device interconnects for confined field interconnection (CFI) for higher speed digital Integrated Circuits.

One embodiment includes a Confined Field Interconnects (CFI).

One embodiment includes a UTS (Universal Test Socket) using stratified layer construction.

One embodiment includes a Hand held Probe.

One embodiment includes a Flexible PMTL Cable Strand and Array for Board to Board connection and chip to chip.

BRIEF DESCRIPTION OF THE DRAWINGS

FIG. 7a shows a generic Base plate for a Universal Test Fixture (UTF) for a Center Pedestal with a Chip or chip carrier as DUT.

FIG. 7b shows details for one type of high speed semiconductor chip with connection pads and mounting on the pedestal for testing.

FIG. 17b shows removal of a layer from the multilayer connector of FIG. 17a.

FIG. 17f shows removal of a layer from the multilayer connector of FIG. 17e.

FIG. 17g shows removal of a layer from the multilayer connector of FIG. 17f.

FIG. 17h shows removal of a layer from the multilayer connector of FIG. 17g.

FIG. 17j shows removal of a layer from the multilayer connector of FIG. 17h to expose the final micro coaxial transmission line and needle-like connector with the tail that becomes a set of flexible micro coaxial transmission line that fans out like a peacock's tail to connect to coaxial connector strips.

FIG. 34 shows a single slice as a building block of a UTS showing how a single slice hosts N PMTL transmission lines that connects the top to bottom in equal paths.

FIG. 35 shows how a UTF can be adapted to be a UTS with slight modification of the connector module 10-1 and providing alignment mechanism that can set on top of an ATE load card and be adapted to current ATE without much modification of the tower top of the ATE.

DETAILED DESCRIPTION OF THE PREFERRED EMBODIMENT

Figure 1:
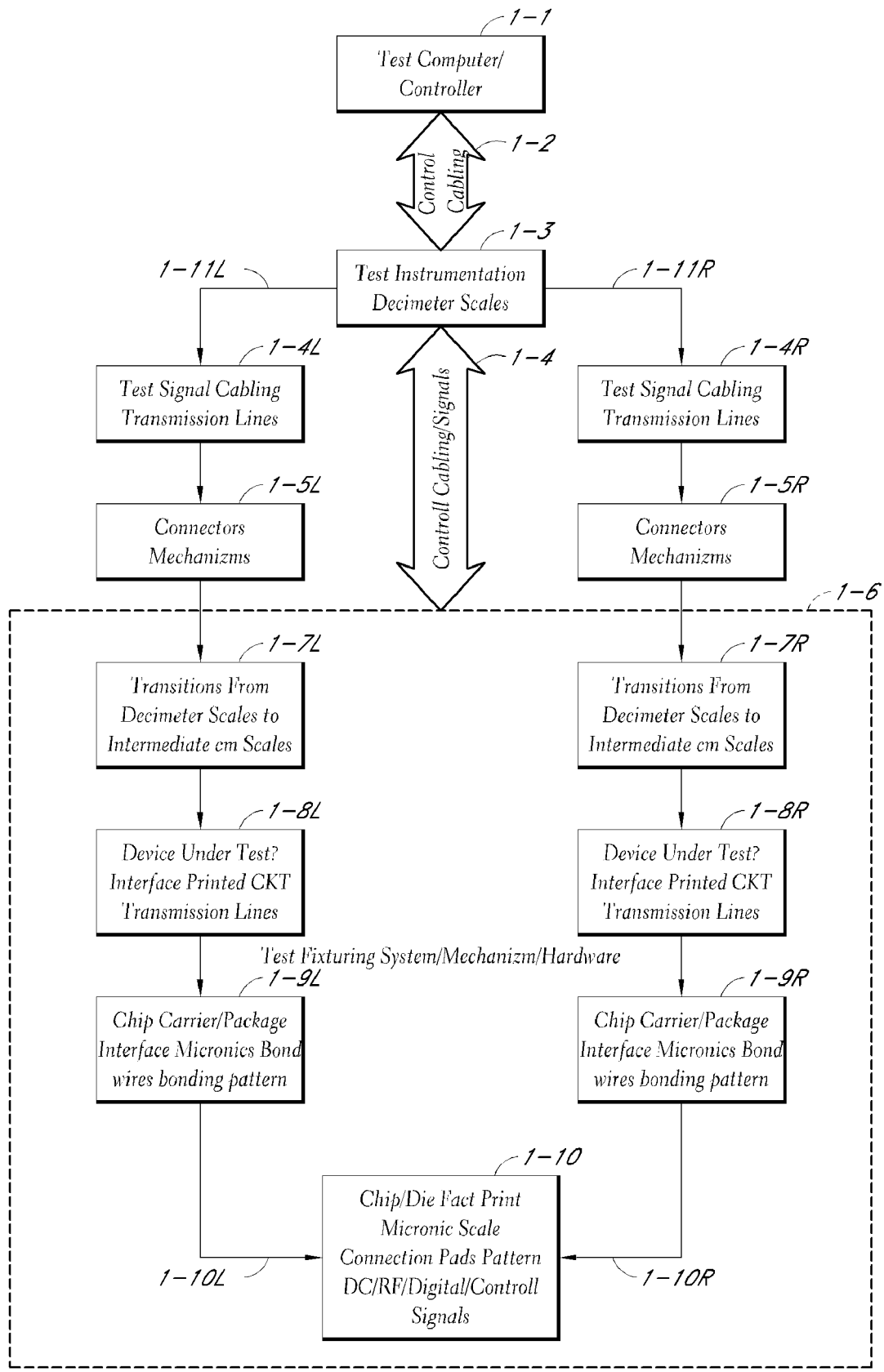
FIG. 1 is a block diagram showing the Semiconductor Test Process and Fixture setup, test signal paths, control path, and DUT (Device Under Test), and the interaction of DUT with the external test instrumentation.

The block diagram of FIG. 1 summarizes the process of semiconductor chip testing and evaluation. On the top level, the test system includes test instrumentation that generates the signal stimulus, typically an HP8510 vector network analyzer or other similar equipment. This instrumentation usually has high-precision input and output ports that are of coaxial nature. This is represented by block 1-3 in FIG. 1. This instrumentation can be controlled by a test computer 1-1 for automation purposes connected to the test instrumentation 1-3 through control bus 1-2. The test signals are provided by the test instrument 1-3 through cable 1-11L to the test signal cabling 1-4L, which is then supplied to a connector mechanism 1-5L. The functional test fixture System Mechanism and Hardware is lumped into a block 1-6 to indicate a boundary beyond which the test instrument signal will interconnect. The connections on the left represent the flow path of the input of the stimulus from the test instrument 1-2, and on the right is the output of the stimulus or response from the DUT (Device Under Test) 1-10. Control signal connections from the test system to this functional block as indicated by the control bus 1-4 that supply control signaling to stepping motors or actuators for positioning of the probe and to engage and disengage the chip or device under test. The functional fixture box 1-6 can be viewed as being symmetric about the center. The signal from 1-5L connector is coupled to the transition interface 1-7L inside the block 1-6 which is still of the dimensions of the order of decimeters. On one side it mates with connectors, and on the other side makes transitions into a proper transmission line to the Device Under Test Interface 1-8L. Depending on the type of device being tested, the signal is coupled to the chip carrier, interface, or directly to die pads of Micronics scale as indicated by 1-9L. The signal is then coupled to the chip/die input pads and thus, to the various functional blocks of the chip/die device under test 1-10. So far the signal stimulus 1-11L coming from left has reached the device under test 1-10. The device processes these signals according to its transfer characteristics and outputs signal responses 1-10R from the right port. This signal then travels upward in the symmetrical path similar to left up to chip Interface 1-9R, to Device CKT interface 1-8R, and to Transition Intermediate 1-7R, and out of the functional box 1-6 into connector mechanism 1-5R, and then to test signal Cabling Transmission line 1-4R, and finally to the test instrumentation 1-3 port. In a full bidirectional test setup the direction of the signal stimulus and response is reversed and the device input and output ports reflection and transmission are fully characterized in the form of a Scattering Matrix over a wide frequency range, or impedance matrix or many other forms.

The test process is managed by the test controller 1-1 with connection to test the instrumentation and fixture block through control cabling 1-2 and 1-4 respectively.

In one embodiment, the system of FIG. 1 provides added functionality and process improvements. The functionalities in blocks of 1-7, 1-8, and 1-9 are described below.

In a much more simplified way, a microwave device test fixture can be made as shown in FIG. 2. The apparatus of FIG. 2 can be one embodiment of the block 1-6 in FIG. 1. The DUT is placed on a pedestal 2-7, placed on a block 2-9. The signals are input to the fixture through the connector 2-5, then through the transmission line transition 2-2 that converts the signal in the coaxial TEM mode from the circular coaxial line 2-5 in one side and to the tips 2-11 of the this transition on the other side near the chip that is in Coplanar Waveguide Mode (CPW). The transverse dimensional transition achieved by device 2-2 is of tens of mm on the coaxial side to fractions of mm on the chip side (typically measured in microns).

The transition 2-2 brings the signal to the level of the chip. The block 2-4 serves as a mechanism to support the coaxial connector 2-5 on one side and the transition 2-2 on the other side while providing a pivotal mounting on the shaft 2-6, which is supported by two brackets 2-3 on the sides of base block 2-9. This test fixture allows the positioning of the test connector CPW tips on the DUT in the +/−Y direction by sliding the block 2-4 along the shaft 2-6. This can accommodate various sized pedestal blocks 2-7 with various sized DUT chip 2-1 that can have connection pads along the edge in any desired locations laterally.

Figure 2A:
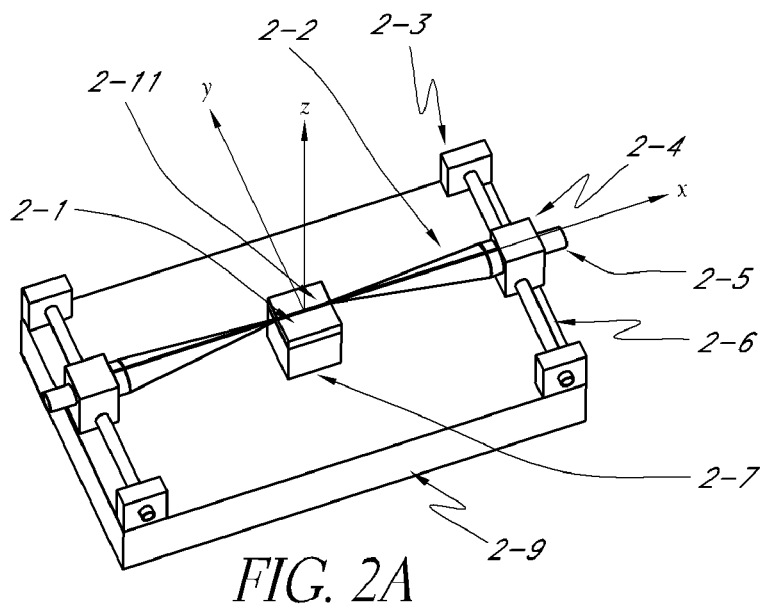
FIG. 2a shows a microwave test fixture with lateral positioning and angular probe tip movement: isometric view of the test fixture showing central pedestal, device under test, probes and transitions.

The coordinate system introduced in FIG. 2a is used throughout this disclosure. The center of the coordinate system is at the center of the block 2-7. As shown in FIG. 2a, The X direction is along the axis of the probe assembly defined by transition 2-2, the block 2-4 and coaxial connector 2-5 refer to this as the axial direction. The Z direction or vertical direction is defined as upward from the coordinate origin, and the Y direction is defined by the right hand rule as shown. This is called a lateral direction.

Figure 2B:
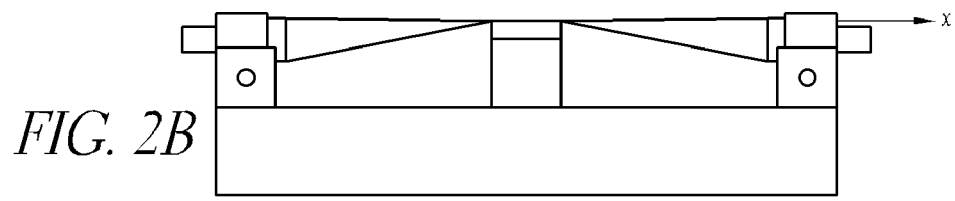
FIG. 2b shows a microwave test fixture with lateral positioning and angular probe tip movement: the side view.
Figure 2C:
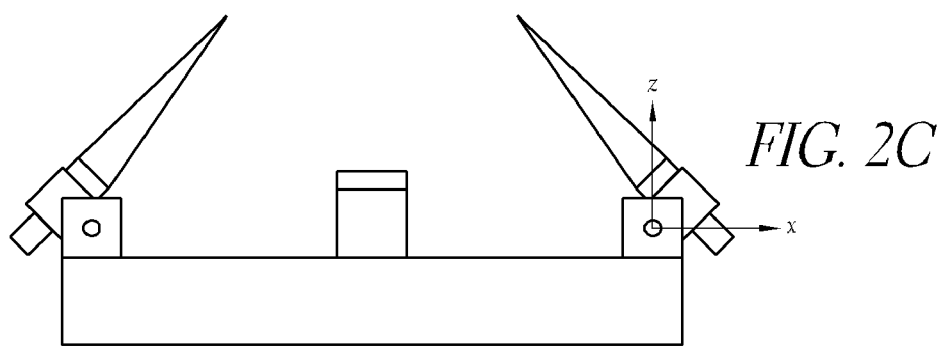
FIG. 2c shows a microwave test fixture with lateral positioning and angular probe tip movement: side view with probes tips rotated up to disengage the DUT.

FIG. 2b shows a side view of the test fixture of FIG. 2a, showing that the DUT can be at any vertical level as needed. In this case, it is at the level of connector, 2-2, but can be designed to accommodate any height of the pedestal test block 2-7. This makes for easier access to device under test for in line inspection via a microscope and in process inspection during test and experimental or production wire bonding processes. FIG. 2c shows the side view of the test fixture of FIG. 2b, showing another degree of freedom in adjustability and versatility of this fixture. As shown in FIG. 2c, the connector transition 2-2 can be rotated up away from the DUT 2-2 thus, allowing it to be replaced manually or automatically. This feature is desirable in R&D environment as the device is often removed and wire bond and replaced. This feature can be incorporated into production line equipped with pick and place equipment that allows millions of devices on a tape to be picked and placed into the test fixture and tested rapidly, thus providing the possibility of high speed testing of the chips in a production line. The Universal Test Fixture (UTF) embodiment disclosed herein provides many other degrees of freedom in testing in R&D and production.

Figures 2D, 2E, 2F:
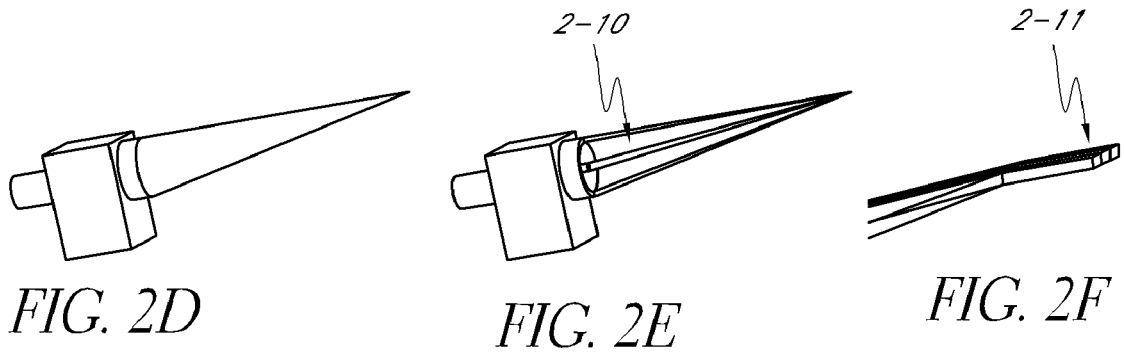
FIG. 2d shows a microwave test fixture with lateral positioning and angular probe tip movement: close up of the probe and tips transitioning from a coaxial transmission line to a CPW tips.
FIG. 2e shows a cut view exposing the center conductor.
FIG. 2f shows the needle-like CPW tips.

FIG. 2d shows the connector probe assembly including the connector transition 2-2 as a needle-tipped transition from a coaxial line to a CPW 2-11 having inner and outer conic conductors. FIG. 2e shows a cut view exposing the center conductor 2-10 of the transition 2-2. FIG. 2f shows the needle-like CPW tips 2-11. The system of FIG. 2 is one possible embodiment of the functionality of the 1-6 fixture block in FIG. 1. As will be shown below, many other possible implementations are possible. The transition 2-2 illustrated in FIG. 2 performs well over a very wide bandwidth. However, it requires precision machining, such as NC, BDM, or wire cutting to achieve accurate mechanical tolerances that become much more critical in high mm frequencies. Other transitions are described below.

Coaxial transmission lines provide a very natural TEM (Transverse Electric and Magnetic) transmission mode up to a very high frequency, at which point the higher order modes begin to propagate. These higher order modes affect the upper frequency limit of operation. Moreover, coaxial lines provide stable electrical characteristics such as impedance levels of a few ohms to a few hundred ohms by simply varying the ratio of the inner and outer conductor radii. As outlined in "Microwave Transition Design", Izadian 1988, Artech House, coaxial lines provide a natural field match thus, providing an excellent and broadband impedance match. This principal has been used to develop many successful transitions and connectors for microwave equipment.

Many other structures can be made to support directly or emulate, a structure that can support a well-behaved TEM or quasi-TEM transmission line mode reliably for a wide bandwidth. Examples of these types of transmission lines include microstrip line, strip line, CPW, GCPW, etc.

Figure 3:
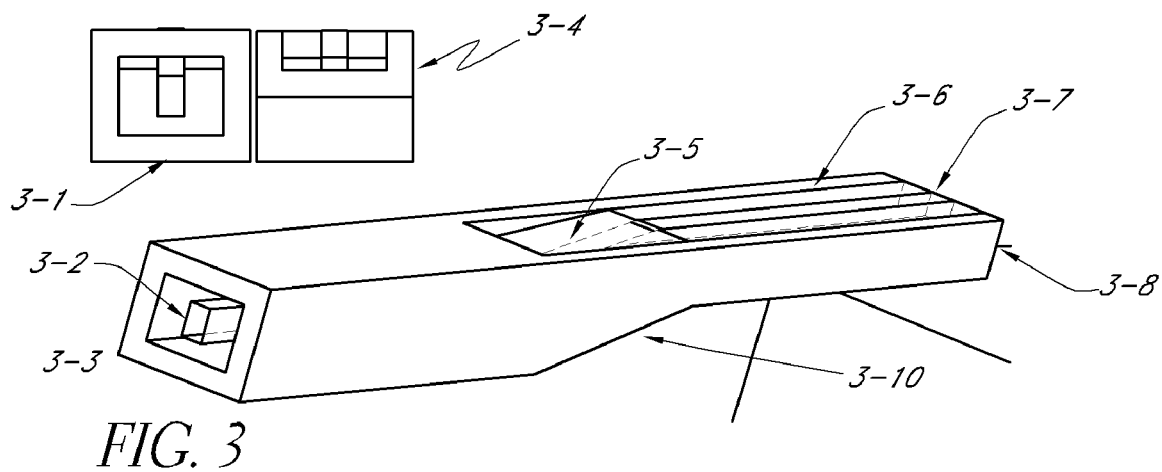
FIG. 3 shows a transition from a Rectangular Coaxial Transmission Line to Ground Backed Coplanar Waveguide-like Transmission Line (GCPW).

One such a useful transmission medium is Square (co)axial transmission line (note that transmission lines can be axial, but if the two axis coincide, they will be coaxial), or more generic rectangular (co)axial transmission line as shown in FIG. 3, illustrated by 3-1. Because of the field symmetry of this type of coaxial line, transversally, if this transmission line is split along the line of symmetry of E-fields, a cross section such as 3-4 can be obtained that results in an intrinsic impedance behavior very similar to its parent. If the same scale is maintained, this impedance should be approximately twice that of the parent, but some of the fields will fringe out as the structure is no longer closed, so capacitive and inductive parasitics will emerge. It is possible to establish at least a quasi-TEM mode of wave propagation in this structure over a reasonable bandwidth. This type of transmission line is used below in connection with one embodiment of a universal connector and/or a Universal Test Fixture. It is useful achieving transition from these types of transmission lines to the others, for example FIG. 3 shows a transition 3-10 from a rectangular coaxial transmission linen 3-1 type at the one side to the split coaxial transmission line 3-4 on the other side. On the left side of the FIG. 3, the rectangular coaxial transmission line 3-1 is established by a center conductor 3-2 and shield 3-3. on the top right side of FIG. 3, the transmission line similar to 3-4 is established by the center conductor 3-7 and shield 3-8. These two media transition through 3-10 tapering of the shield 3-6 and the center conductor. 3-5. As is shown in FIG. 3, the cut region on the right can be considered the plane of symmetry of parent of 3-8 (3-4), which is similar to 3-1 type transmission line originally. In the embodiment of 3-3, the fields are concentrated symmetrical around the center conductor 3-2. On the other side of the transition 3-10, the fields are concentrated between the center conductor 3-7 and shield 3-8, while on the top side fringing fields are established that extend into the space above the cut 3-6. The space in between the conductors can be filled by a suitable dielectric.

Figure 4:
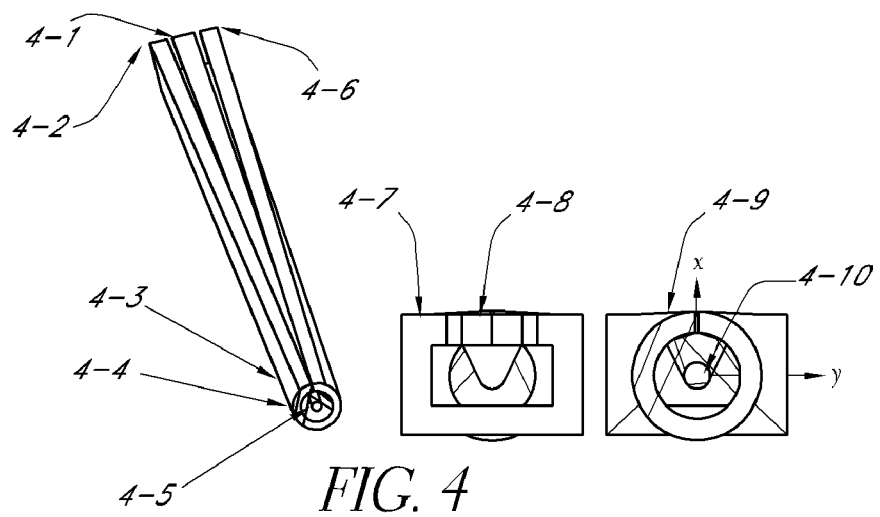
FIG. 4 shows a transition from a Ground Backed Coplanar Waveguide-like (GCPW) Transmission line to a Circular coaxial Transmission Line

In a similar manner to FIG. 3, the transition of FIG. 4 shows a transition between a circular coaxial transmission line as established by the center conductor 4-10 and shield 4-9, to a special type of Grounded Coplanar Waveguide (GCPW) as established by 4-8 as the center conductor and 4-7 as the ground shield. The fields are concentrated between 4-7 and 4-8 in this latter structure. The fields are, however, more uniformly distributed around the center conductor 4-10 in between shield 4-9 in the coax. The structure 4-3 shows the transition between these types of transmission lines. From a GCPW 4-2 to Coaxial line 4-5. This is achieved by transitioning of the outer shield from 4-4 circular shape to 4-6 split out rectangular cross section. And further transitioning a circular center conductor 4-5 to a rectangular conductor 4-1 offset to the top side gradually along the structure. This type of transition is also useful for test fixtures, but can be relatively costly to produce. These transitions typically require special machining such as NC machining, EDM and or wire cutting, which are of high precision and costly.

Figure 5:
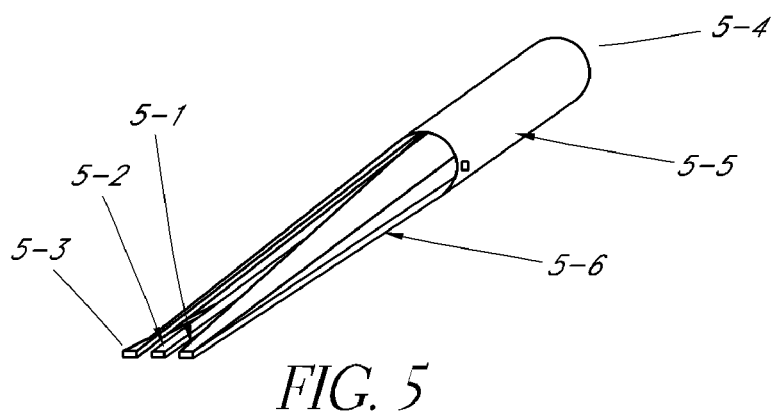
FIG. 5 shows a transition from a Circular Coaxial Transmission Line to a Coplanar Waveguide-Like (CPW) Transmission line.

A transition from a coaxial transmission line to a radial offset CPW was introduced in test fixture of FIG. 2, which provides a similar transition in FIG. 4. The CPW tips of the transition 2-2 was offset from the center of coaxial line, but here another transition is introduced as shown in FIG. 5 that stays aligned with the axis of the coaxial transmission line. As shown in FIG. 5, on one side, the coaxial line 5-4 transitions to a CPW type transmission line 5-3 on the other side. The shield 5-5 transitions gradually to 5-6 and ultimately to 5-1 fin-lines on either side of center conductor 5-2. Furthermore, the center conductor of coaxial line transitions to flat conductor 5-2, thus together with 5-1 pair establishing a CPW tips which is useful in microwave test fixture applications, and wafer probing. Again, the manufacturing of these types of transitions are normally only possible by use of expensive methods of EDM and Wire cutting or NC machine that require great care and high precision processes.

As disclosed herein, the cost of manufacturing the transitions described above can be reduced through a combination of normal PCB printed circuit board technology, chemical machining, and or sheet metal technologies.

Figure 6A:
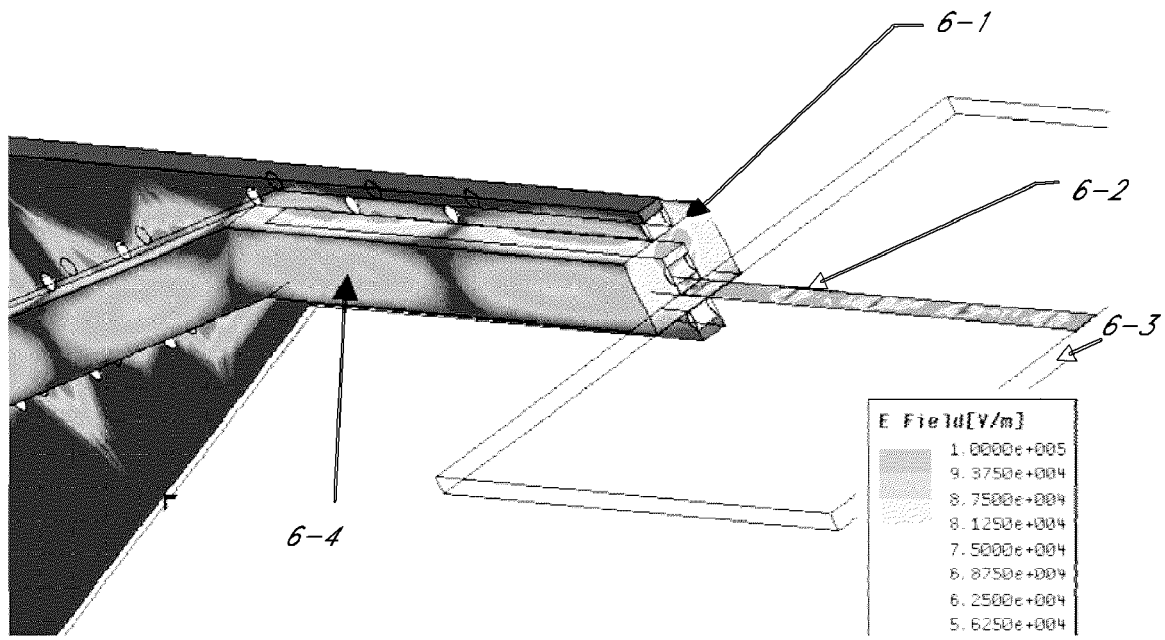
FIG. 6a shows electromagnetic simulation of one embodiment of the Periodic Micro coaxial Transmission line (PMTL) with connection to a Micro strip line: the geometry of model with 3D plots of E-filed distribution.

In one embodiment, a Periodic Micro (co)axial Transmission Line (PMTL) combines the properties of the rectangular coaxial transmission line, a CPW transmission line, and microstrip, or strip line technology. FIG. 6a shows computer simulations of the PMTL transmission line as it transitions at the tips to a microstrip transmission line thus emulating the way tips of microwave wafer probes connects to pads of die pad on a wafer or a single chip in a test fixtures such as that of FIG. 2.

FIG. 6a shows the 3D view of the magnetic surface current density as indicated by E field magnitude. The periodic pattern 6-4 shows a propagating wave along the transmission line to tip 6-1. The PMTL transmission line cross section 6-1 is representative of tips of a wafer probe which couples into a microstrip 6-2 supported by a microwave substrate 6-3 representative of a CHIP DUT.

Figure 6B:
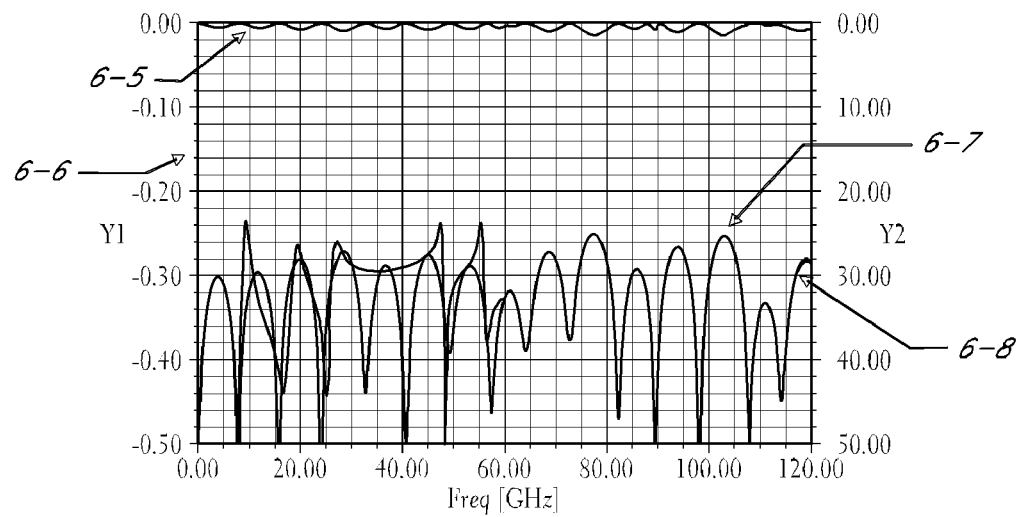
FIG. 6b shows electromagnetic simulation of one embodiment of the Periodic Micro coaxial Transmission line (PMTL) with connection to a Micro strip line: the return loss and insertion loss over a frequency band of DC to 120 GHz.

FIG. 6b shows the return loss and insertion loss of this transmission line and transition to chip up to 120 GHz. The computed results are shown to 120 GHz, and the trend shows good behavior to much higher frequencies (e.g., 220 GHz and beyond). In this Figure the 6-5 trace is the predicted insertion loss in dB with Y1 scale 6-6 at the right, and 6-7 traces are the Return losses in dB with Y2 6-8 scale to the right. These results show that a PMTL structure designed for 50 Ohm intrinsic impedance emulates the behavior of a TEM broadband transmission line with excellent impedance behavior of better than 25 dB return loss (some places are better than 30 dB), with excellent signal transmission with minimal losses. In fact, the plot of FIG. 6b, 6-5 shows that the loss over the entire bandwidth up to 110 GHz can be better than −0.01 dB.

As indicated above, one embodiment includes a universal test fixture that can accommodate various types of devices for testing. These devices can cover a wide range of possibilities, including wafers, dies, chips, chips on chip carriers, chips on circuit boards, packaged devices, such as sockets, and other ancillary housing of chips, and packaged multi module carriers, and other subsystems that can be made with some connection pads. The reason this is possible is that the PMTL technology provides a highly scalable connecting probe that can be readily made for each specific case and any footprint and any frequencies from DC to 220 GHz and beyond. The universal text fixture allows for a standardized connection pad or group of pads, that can reduce the variations in connectivity to a few basic patterns is disclosed.

FIG. 7 shows a basic building block of such a test fixture. 7-1 is a generic base of the test fixture shown with removable central pedestal 7-6 that can accommodate a device for testing designated by 7-5. The base 7-1, can include a series of hole patterns such as threaded holes patterns 7-2 for holding connector assemblies and X positioner, a series of edge holes pattern 7-4 for holding a coaxial connector strip, and a series of through holes 7-3 for bolting the base 7-1 to a work table or similar larger objects. The central pedestal 7-6 can be removable and accommodated by a central opening 7-7 in the base 7-1 to fix the pedestal in base as shown in inset. FIG. 7b shows a zoomed in section 7-10 of a chip under test 7-5, with connection pads 7-9. FIG. 7b further shows the various parts of a central pedestal 7-6, with chip or DUT 7-5 on top, and extrusion 7-8 that snugly fits into the opening 7-7 in the fixture base 7-1.

Figure 8A:
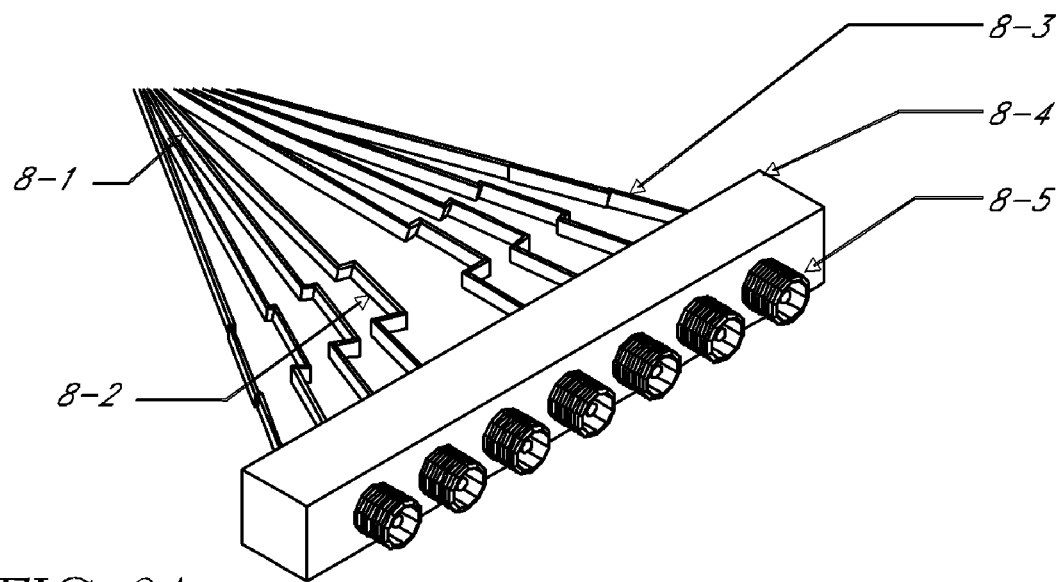
FIG. 8a shows details of connecting a centimeter scale external connectors to a much smaller Micronics scale chips pads for testing: a Coaxial Connector Strip on centimeter scales with flexible micro coaxial cables (with embedded PMTL Transmission Line) in the back.

FIG. 8 shows some elements of the universal test fixture assembly. The main objective is to provides connectivity from a set of centimeter scale connectors to points of micrometer scale tips. FIG. 8a shows a multiplicity of connectors 8-5, in an array secured in a connector strip block 8-4. These connectors are connected to a new type of flexible micro axial transmission line with embedded PMTL 8-3, as a single line, and 8-1 as a collection of these transmission lines. These special transmission lines have excellent phase and amplitude stability over the bandwidth of operation of DC to 220 Ghz and above, as described in the text in connection with FIG. 6. The lines 8-3 converge to a point where they become bunched into thin multilayer in a close proximity (as shown below) to be connected to a tapered connector assembly to serve as a probe. Furthermore, since these lines appear to emerge from a single point, and be connected to a linear strip connector arrays, the phase equalization principal dictates that some parts of the lines will have to bend 8-2 to maintain the same electrical length and thus, provide equal phase fronts at each of the connectors. This is similar to the way a lens operates. Thus, the bending features marked by 8-2 can be any looping or bending, or any other physical shaping to maintain equal phases from a point of convergence to a linear strips as in 8-4, and to provide flexibility and mobility and agility to either the probe or DUT as is used in Wafer probing and chip testing and further to a act as a decoupling mechanism of movements and vibration from the outside world to the DUT. One of ordinary skill in the art will recognize that the bends can be omitted and the phase corrected by adjusting the length of cables that connect to the test fixture, through processing, or using other techniques for phase correction.

Figure 8B:
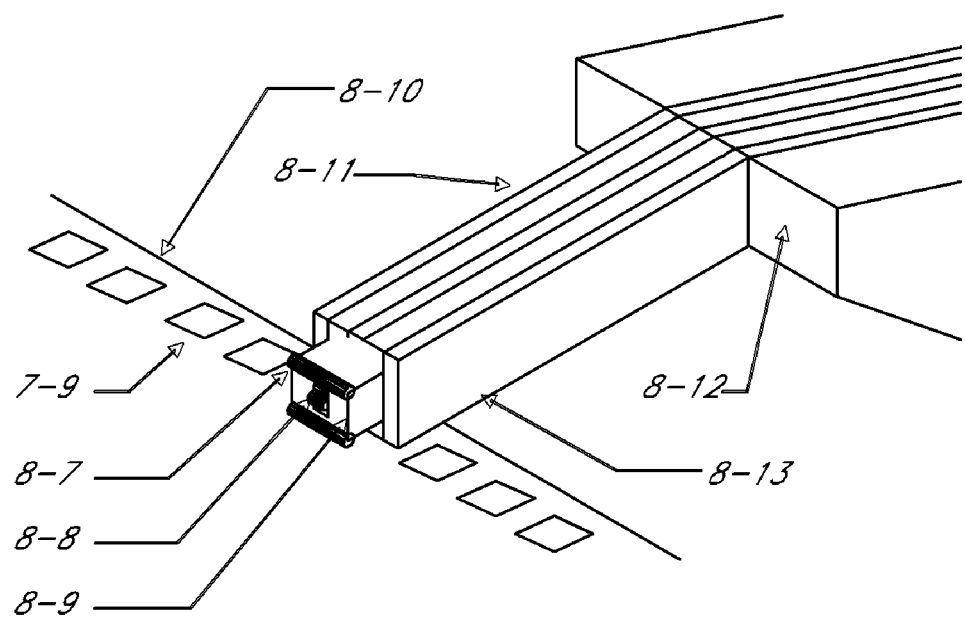
FIG. 8b shows details of connecting a centimeter scale external connectors to a much smaller Micronics scale chips pads for testing: Micronics scale probe tips and chip connection pads.

FIG. 8b shows the other end of the converging transmission lines 8-1 shown in FIG. 8a. On the other end of these converging flexible and agile micro transmission lines 8-1 including PMTL, they become part of a multilayer printed circuit board that brings them to a connection point tip to be connected to chip pad 7-9 on the edge 8-10 of the chip 7-5 as is shown in FIG. 8b.

FIG. 8b further shows a zoomed in section of the multilayer connector probe in a vertical layering configuration. The section of the tip circuitry 8-11 is sandwiched between two sheet metal sections tips of 8-12 for mechanical support and rigidity and low profile. Call-out 8-13 designates the multi layer circuit tip area where it is not supported by the sheet metal. The multilayer tip is shown by 8-11 which can be made of microwave laminates with flexible or rigid mechanical properties. As an integrated part of the probe tip 8-13, a simulated periodic rectangular micro coaxial transmission line PMTL is generated by an arrangement of conductive members and conductive strips. (For purposes of explanation, and not by way of limitation, the conductive members between the strip sections are referred to herein as plated through via holes. One of ordinary skill in the art will recognize that the conductive members are not limited to plated-through holes and can be constructed in various ways, including, but not limited to, plated-through vias, electroforming, electroplating, micromachining, etc.) Some blind vias as represented by 8-8 which electrically connect two strips on the sides constitute a simulated center conductor, as shown in FIG. 8b, and other longer vias 8-7 and 8-9 emulate the part of horizontal outer conductor of aforementioned coaxial line. The Electromagnetic simulation of this structure as presented in FIG. 6, shows that this types of structures emulate rectangular coaxial line from input to the tip. The details of connecting to the pad are not shown for clarity, but is achieved through transitions similar to the rectangular coaxial line to a GCPW as was illustrated in FIG. 3 (where 3-1 type of transmission line is shown in FIG. 8b, and transmission line 3-4 is desired to connect to the pads of the chip 8-10 and pads GSG 7-9 by simply cutting the output tip along the line of field symmetry in the connector of FIG. 8b. (Not shown) to achieve a connection similar to 3-4 in FIG. 3).

FIGS. 8a and 8b show one embodiment to achieve connection from a plurality of Micronics pads 7-9 of a chip to a number of centimeter scaled fanned out connections 8-5 to the test instrumentation. This disclosure describes highly flexible, and scalable mechanisms of placing the connector tips of FIG. 8b on the chip pads with precision and tight alignment.

Achieving this involves the ability to place tips within a few microns, so in some embodiments precision micro positioning is used. The mechanism to achieve these tasks is described herein. One embodiment uses commercially available micro sliders for positioning in X direction, and a new highly versatile mechanism for lateral Y positioning and angular rotation. Z positioning can be achieve it in a manual simple approach and/or by using a newly-developed vertical Z dimension positioning as described below.

Figure 9:
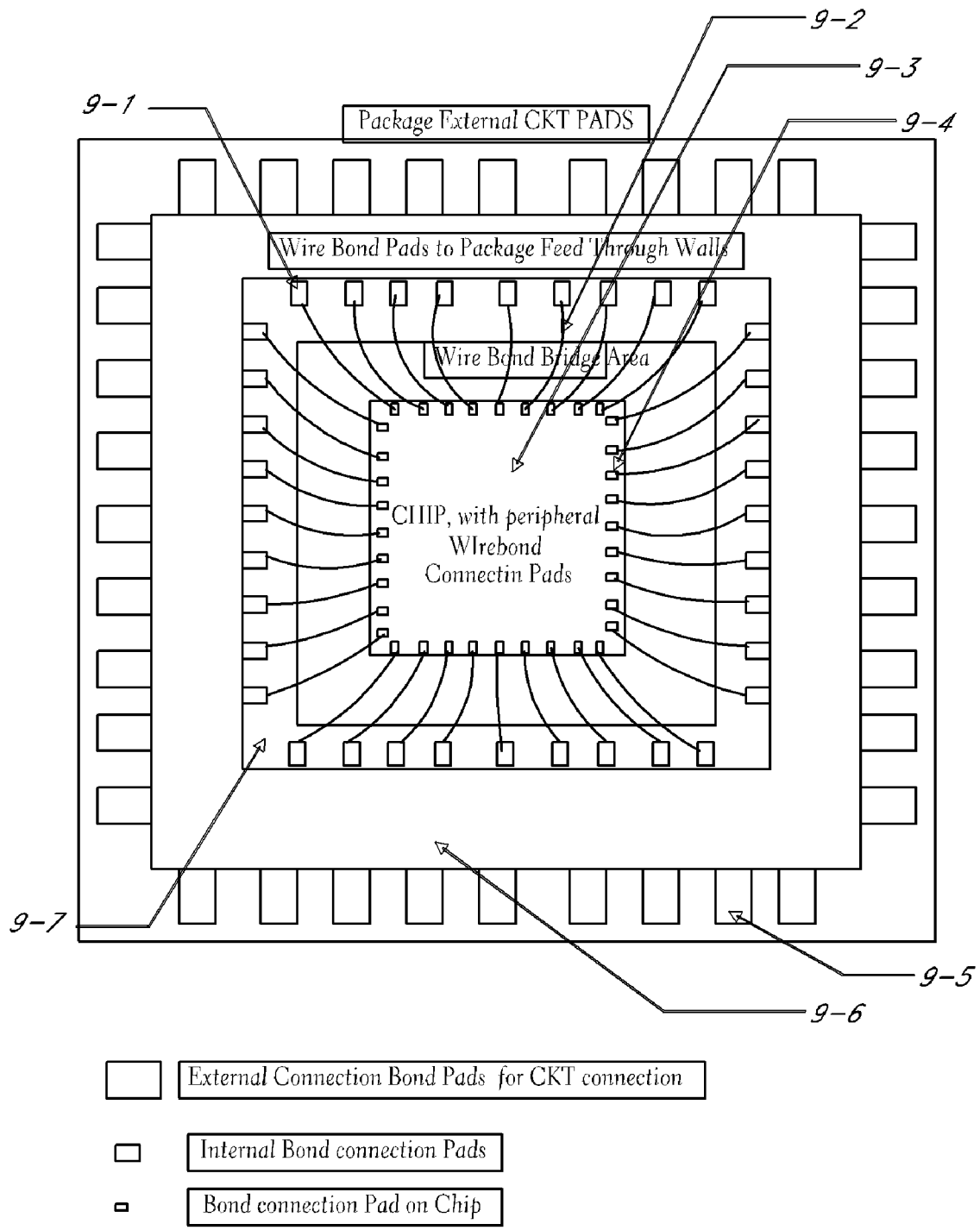
FIG. 9 shows a typical semiconductor chip in a package, pads at chip level, feed through level, and external to the package for comparison to embodiment of a universal test fixture.

FIG. 9 shows a typical hierarchy of high speed microelectronic packaging process in practice. It shows a top view of a typical packaged chip. This chip is cut from a wafer and then tested, sorted, and if acceptable, packaged, and wire bond, and hermitically sealed and used in circuits and component, sub modules, modules, multi chip modules MCM, subsystem, and eventually in electronic systems.

The universal test fixture copies this hierarchy in a much more scalable, flexible and versatile manner for multiple use and for a large verity of devices and over a wider frequency range.

Figure 10A:
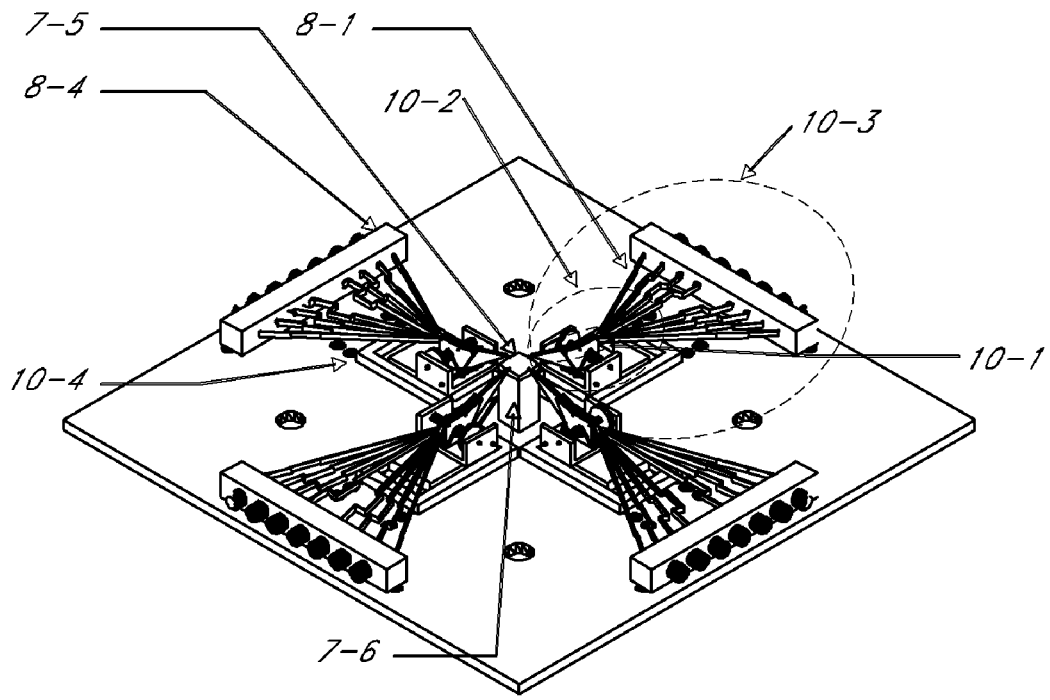
FIG. 10a shows a Universal Test Fixture (UTF) for testing of high speed semiconductor chips: an isometric view of a disclosed embodiment consisting of various parts shown for a four sided fixture with a connector assembly unit at each side, including tapered connector.

As shown in FIG. 9, the heart of the package is the chip die 9-3, with connection pad pattern 9-4 in the Micronics scale. The chip 9-3 is embedded centrally inside the package shown from the top with lid removed. The package includes wall 9-6, with feed through which is under the wall 9-6 not visible in FIG. 9, electrically connecting any of the external pads 9-5 outside the wall 9-6 to the corresponding internal pads of 9-1 inside the wall 9-6. Bond wires 9-2 are used to connect the chip pads 9-4 to internal feed through pads 9-1. This packaging method brings out the Micronics dimensions of the chip inside the package to the periphery of the package with connecting pad of larger dimensions, for permanent placement in each package. The universal test fixture is able to provide this level of connectivity on a routine basis for many times, and for a large number of chips dies and over a wide frequency range repeatable and reliably over and over. An embodiment of such a UTF is shown in an isometric view in FIG. 10 and top view 11a.

Figure 10B:
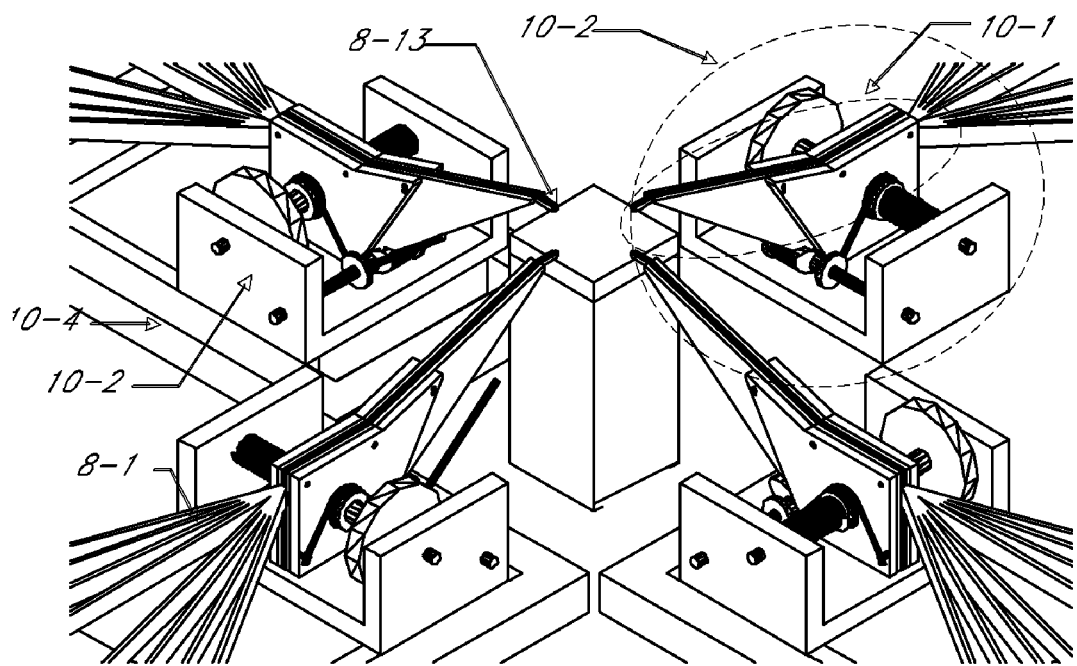
FIG. 10b shows a Universal Test Fixture (UTF) for testing of high speed semiconductor chips: a close up of the central pedestal and chip area.

As shown in FIG. 10, various parts of the Universal Test Fixture are grouped as a collection of components for future reference. For example, 10-1 represents the elements of the tapered connector probe as is encapsulated by the smallest dotted ellipse, more clearly shown in zoomed section in FIG. 10b. This part will be presented in more detail below. The next group is the components represented by 10-2 which included 10-1 as one of its integrated parts. This subcomponents includes a mechanism for lateral positioning of the 10-1 and rotation of the tapered connector 10-1 tips 8-13. The next group is the 10-3 which includes the elements of the 10-1, 10-2, additionally the connector strip 8-4, and connectors 8-5, and the micro coaxial flex lines collection 8-1, and the X-micro positioner 10-4. Altogether, the assembly of 10-3 represents one complete modular unit of the UTF that can be placed on any of the four sides of the universal test fixture base 7-1 shown in FIG. 7. FIG. 10 shows it deployed in four sides of the Base Plate 7-1. Therefore, each module 10-3 includes sub modules and elements that allows the capabilities to position the tips 8-13 of the tapered connector 10-1 in X direction by the X positioner 10-4, and laterally (+/−Y) and rotationally by the 10-2 about an axis of the connector to and vertically by height of the 7-7 pedestal to engage or to disengage the pads of the DUT. FIG. 10b shows a zoomed in section of FIG. 10 to further identify the various parts of the Universal Test Fixture. In this Figure the tip 8-13 of the tapered connector is shown engaged with the device under test. The pedestal 7-6 in this case is shown to be a simple fixed height. A vertical positioner is described below as an integrated part of this pedestal to allow positioning in the vertical direction (Z).

Figure 11A:
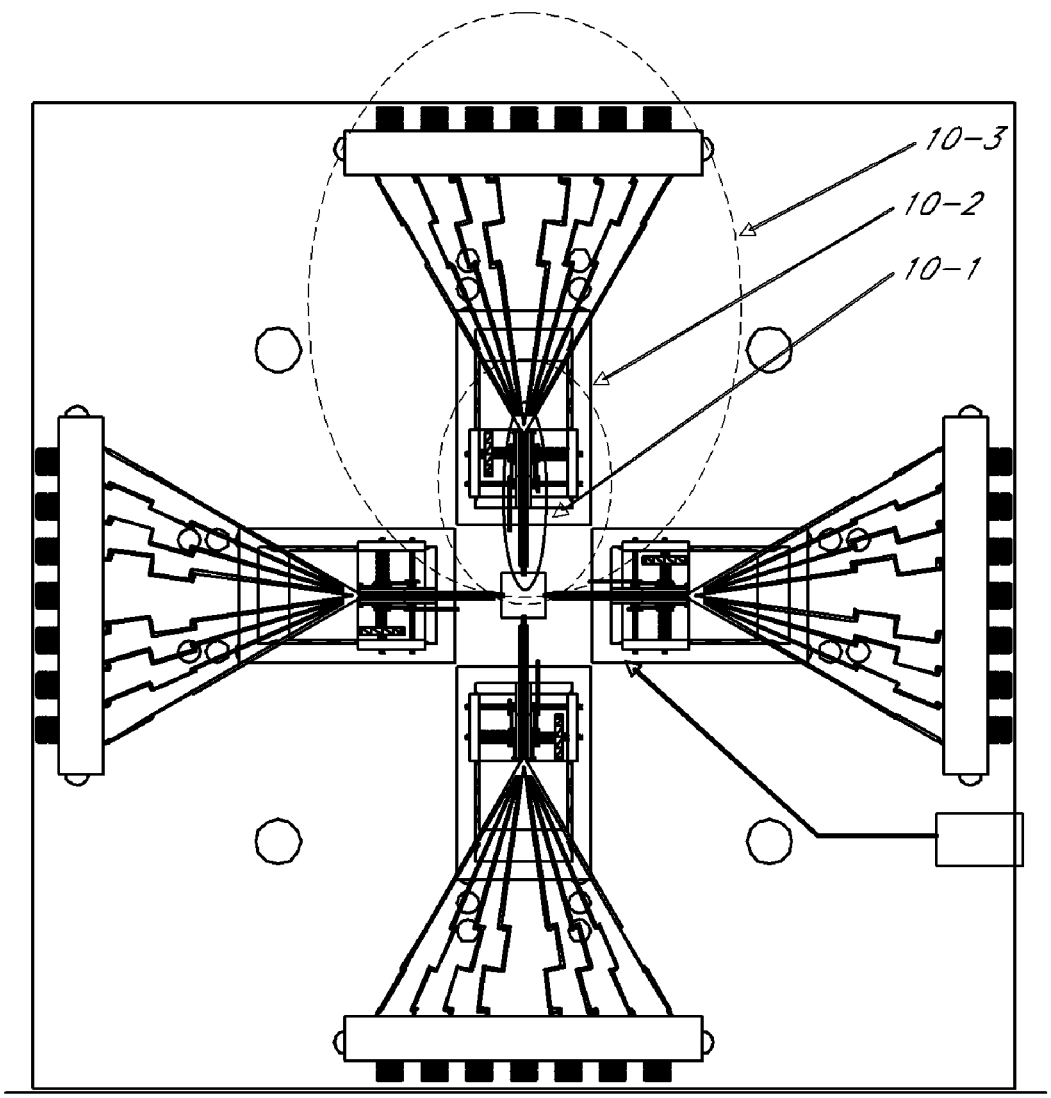
FIG. 11a shows a top plan view of the UTF of FIG. 10. The topology of this UTF is very similar to the topology of the packaged high speed semiconductor device in package shown in FIG. 9. The packaged device uses wire bonds for permanent use, but the UTF can make reliable connection to a chip DUT over and over to run through various testing and thermal cycling etc.

FIG. 11a shows a top view of the UTF of FIG. 10, further illustrating the grouping of the various elements in 10-1, 10-2 and 10-3 into modules. As shown, the connector assembly of 10-3 is deployed in four sides. The assembly of 10-2 is mounted on a positioner +/−X 10-4. Thus as it is shown, the connection point 8-13 can be positioned in +/−Y direction by 10-2, +/−X direction by 10-4 positioner, and rotated away from the DUT 7-5 by the rotational mechanism provided by 10-2.

The UTF of FIG. 11 provides many degrees of freedom in accommodating almost any possible DUT through these various designed positioning and movement. Comparing FIG. 11a with that of a packaged chip in FIG. 9, it becomes apparent that the universal test fixture is emulating the packaged chip hierarchy of the FIG. 9 in a versatile manner thus allowing the ability to insert a chip of many variations, or states of development in a test fixture and connect it reliably to the outside world for testing and evaluation without the need to go through tedious and time consuming wire bonding and package embedding, assemblies and disassemblies currently required. The pedestal 7-5 can be equipped with additional capabilities to allow temperature cycling of the DUT and monitoring its temperature with an integrated heater and thermocouple to monitor its performance for R&D and production development applications under realistic thermal conditions. One embodiment removes many of the testing and evaluation impediments and provide faster time to market and reducing the testing cycle from weeks and months to days, while providing increased product reliability.

Figure 11B:
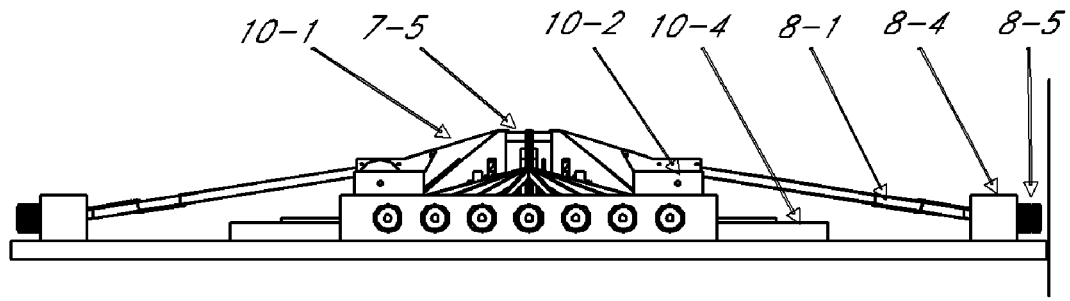
FIG. 11b shows a side view of the UTF showing various parts from the external coaxial connects to the central regions where chip is mounted on the pedestal, illustrating that the UTF is very low profile and compact.
Figure 11C:
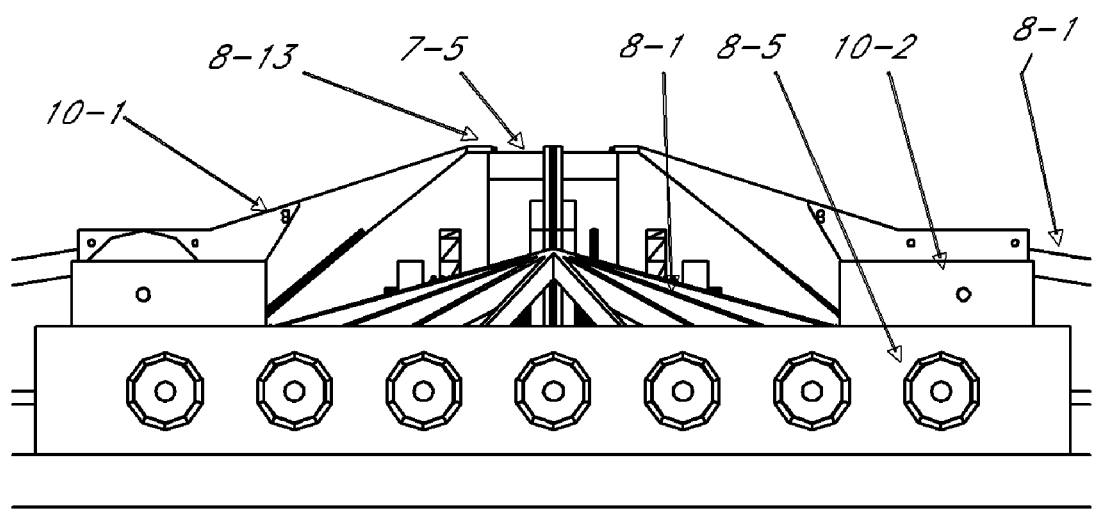
FIG. 11c shows a close-up view of a central area from FIG. 11b showing details of the tapered connectors and DUT.
Figure 11D:
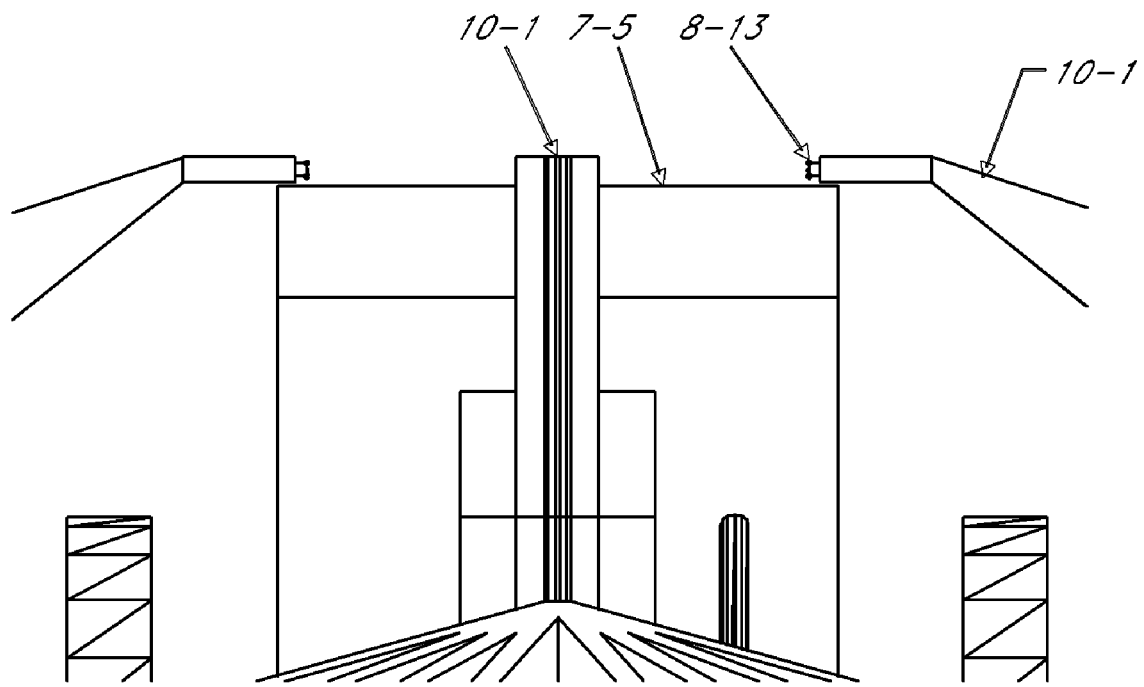
FIG. 11d shows a further close up view of the central area of the connector revealing the multilayer nature of the tapered connector shown in the center.

FIG. 11b shows a side view of the UTF of FIG. 11a showing the profile of the various components, From right to left, the 8-5, the connectors, the connector strip support 8-4, the flexible micro cable 8-1, the X positioner 10-4, the hub assembly 10-2, the DUT 7-5 on the central pedestal, and the tapered connector assembly 10-1. FIG. 11c shows a zoomed in central section of the FIG. 11b for more clarity. Connectivity between the tapered connector 10-1 and the chip 7-5 is made with the tips 8-13. FIG. 11d shows a further close up of the central section of the connector assembly showing the tips 8-13 of the tapered connector 10-1 as it connects to the device under test 7-5. This view shows the multilayer nature of the construction of the tapered connector 10-1 which will be explained further below.

Figure 12A:
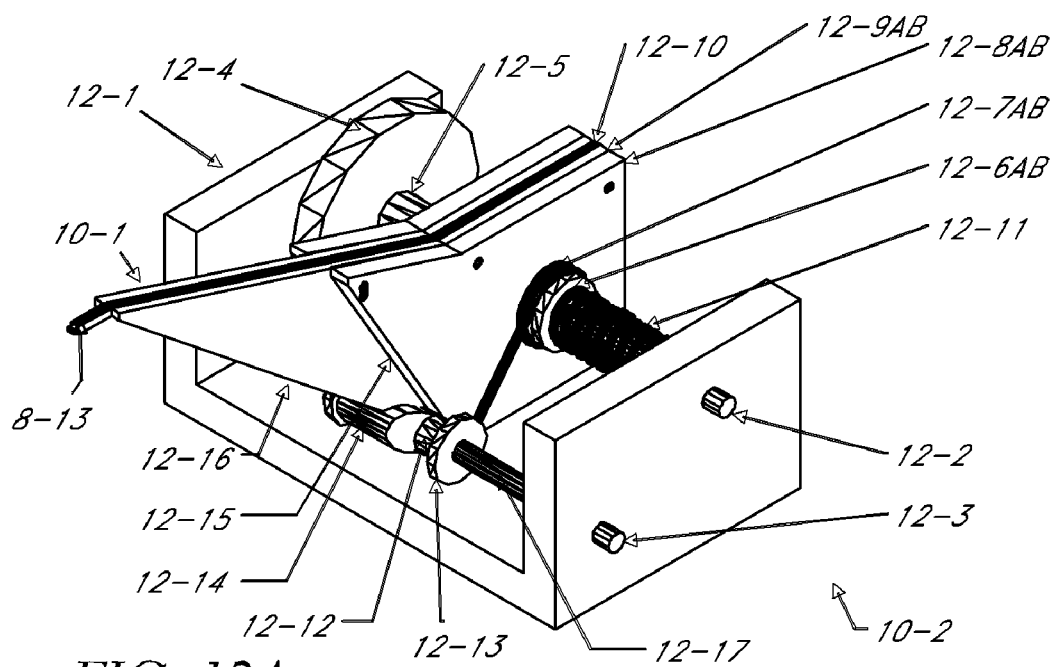
FIG. 12a is an isometric view of the Cannon-like assembly which includes the tapered connector 10-1 and the various elements to allow its lateral positioning in Y direction and rotation of the tip about axle 12-2.

FIG. 12 shows two isotropic views of the module 10-2 the hub assembly. This unit 10-2 includes a U shaped bracket 12-1 that provides mounting holes to hold two axles 12-2 and 12-3. The first axle 12-2 serves as a shaft for holding the connector 10-1 and the elements to allow the lateral positioning of the tapered connector 10-1, and rotation motions of the tip of the connector for connecting disconnecting to pads of DUT 7-5. Some elements include a thumb knob 12-4, a motion transfer tube 12-5, the central PCB section of connector 12-10. The sheet metal layer is on both sides, 12-9A and B, the thicker sheet metal bracket on both side of connector 12-8A and B, two torsion springs in either side 12-7A and B, two auxiliary washers 12-6A and B, and a compression spring 12-11. There is also a threaded tube behind the knob 12-5 which is visible and will be shown in other views in future Figures.

Figure 12B:
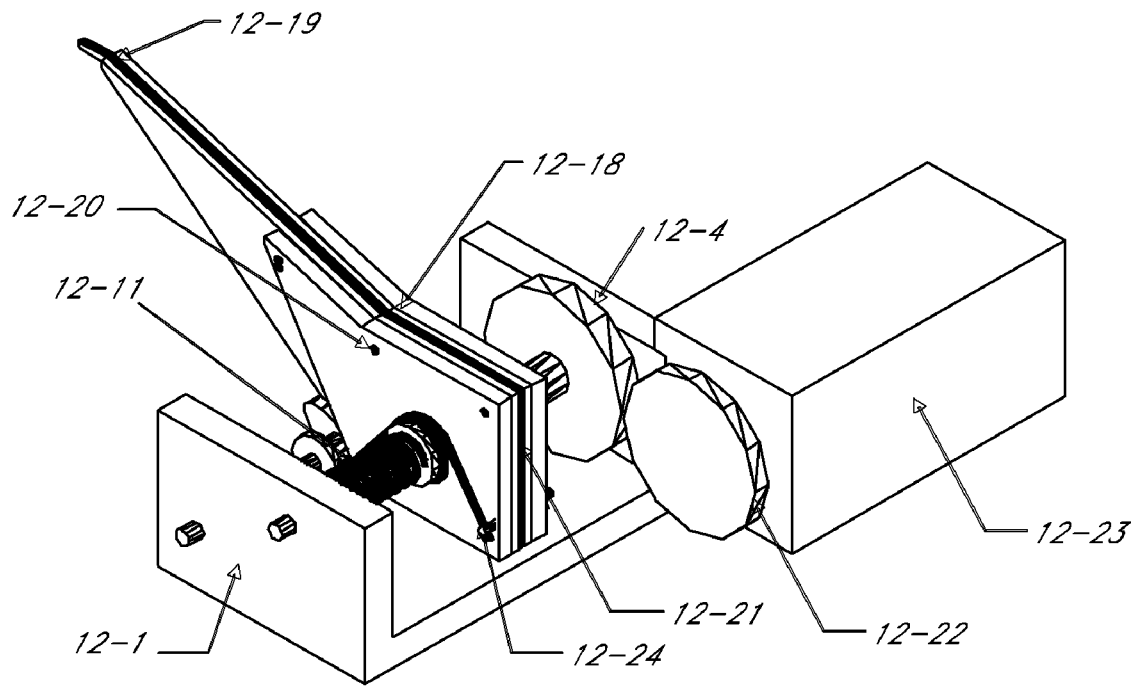
FIG. 12b is an isometric view showing another embodiment with a stepping motor shown to illustrate that the movements can be automated using stepping motors and/or other actuators.

On the second axle 12-3, the various elements include a cam mechanism 12-14 in the center of a tube 12-12. The two side of the tube 12-12 has washer-like walls 12-13. The one end of the torsion springs 12-7A and B fit under this mechanism and is anchored between wall 12-13 and cam 12-14 on tube 12-12 as will be more clearly illustrated below. The other ends of the torsion springs 12-7A and B are anchored on a pin fixed at the lower end of the connector bracket 12-8A and B which are shown in FIG. 12b as 12-24. The entire cam mechanism is free to move on the shaft 12-3 as the connector is moved laterally.

FIG. 12b further shows a different isotropic view of the hub assembly 10-2, showing a stepping motor 12-23 and possible mechanism 12-22 for driving the thumb knob 12-4 for lateral position variations. The cross section of embedded PMTL is also shown as 12-21, and two bend points of the taper connector mechanism as 12-18 and 12-19, and some through holes 12-20 which can be used for alignment and fastening purposes at various locations of the tapered connector.

Figure 13A:
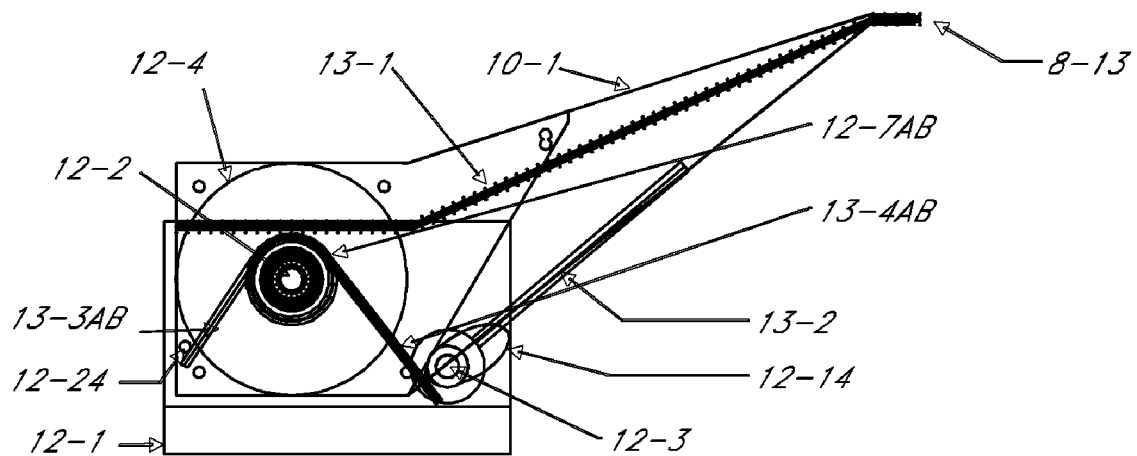
FIG. 13a shows the hidden elements of the assembly and connector and the PMTL 13-1, and the various elements including a thumb knob to move the connector in Y direction on two axles. Also shown are the cam and the cam shaft.

FIG. 13a shows a side view of this hub assembly 10-2 exposing some hidden elements. As is shown in FIG. 13a, the hub assembly 10-2 includes 10-1, the tapered connector, a U shaped bracket 12-1 holding the two axles 12-2, and 12-3. The tapered connector 10-1 itself include an integrated periodic micro coaxial transmission line PMTL 13-1 embedded in its central layers, leading to the tips of the connector 8-13. The Main axle 12-2 serves as axis about which the connector 10-1 can be rotated up and down, via a handle 13-2 and an integrated cam 12-14 mechanism that can be rotated against the belly of the connector by rotating the handle 13-2 thus, raising the tip 8-13.

Axle 12-2 holds several other ancillary components to allow the proper operation of the hub mechanism 10-2, which includes a thumb knob 12-4 for effecting the lateral positioning of the connector 10-1 and thus tips 8-13, a pair of torsion spring 12-8 A and B mechanism for exerting an appropriate force or torque for retracting the connector 10-1 rotation about the axis 12-2 for applying precise pressure for making good electrical connection at the tip 8-13 to the connection pads of DUT 7-5. The torsion spring 12-7A and B have ends 13-3A and B secured to a pin 12-24 on left side and another end 13-4A and B secured under the cam shaft tube 12-12 on the right side. As is shown in FIG. 13a, this torsion spring 12-7A and B is in the position to provide an opposing torque clockwise (cw) to the connector 10-1 and thus apply predesigned pressure to the tips of 8-13 as it rests on the connection pads of the DUT 7-5. This assembly includes other ancillary parts explained below.

Figure 13B:
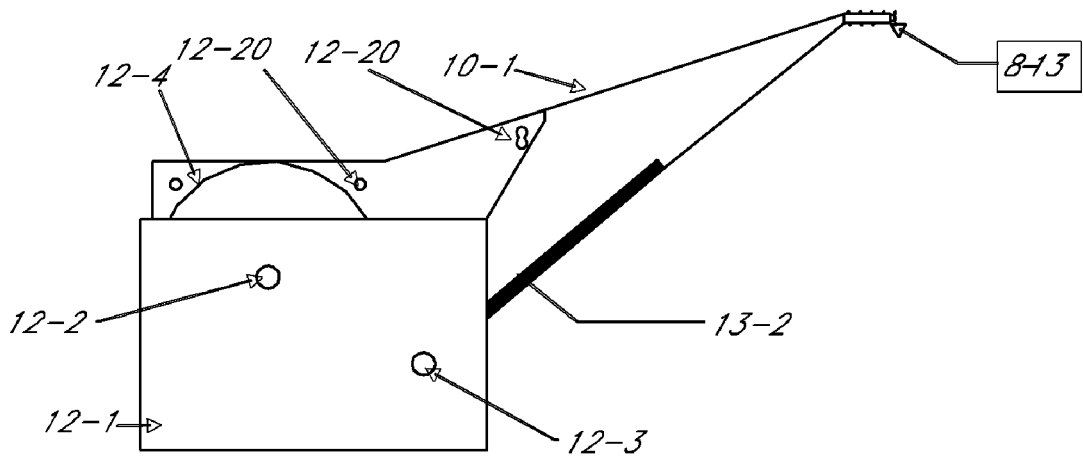
FIG. 13b shows the external parts of the cannon-like assembly showing the handle 13-2 that is used to rotate the tips about axis of 12-2 as shown in FIG. 13c.
Figure 13C:
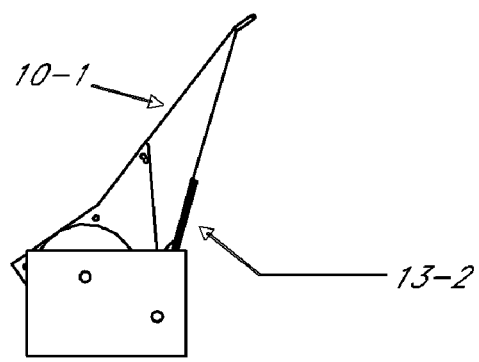
FIG. 13c shows rotation of the tips from FIG. 13b.

FIG. 13b shows the view of the exterior of the hub mechanism 10-2 as seen from the side. The holes 12-20 on the side of the connector 10-1 can be used for alignment and threading and fastening the multiple layers of the connector 10-1. By moving lever 13-2, counter-clockwise (ccw) one exerts force in the opposite direction of the torsion springs 12-7A and B to disengage the tips 8-13 of the connector 10-1 from the DUT. FIG. 13c shows the rotated up position of the connector 10-1. The connector 10-1 can be returned to its connection position by rotating the lever 13-2 back in the cw direction thus allowing the cam 12-14 to lower the connector 10-1 down to allow the tip 8-13 to rest on connection pads of the DUT 7-5. The cam 12-14, and torsion spring support tube 12-12, and the washers-like walls of 12-13 on which the Handle 13-2 is also mounted.

Figure 14A:
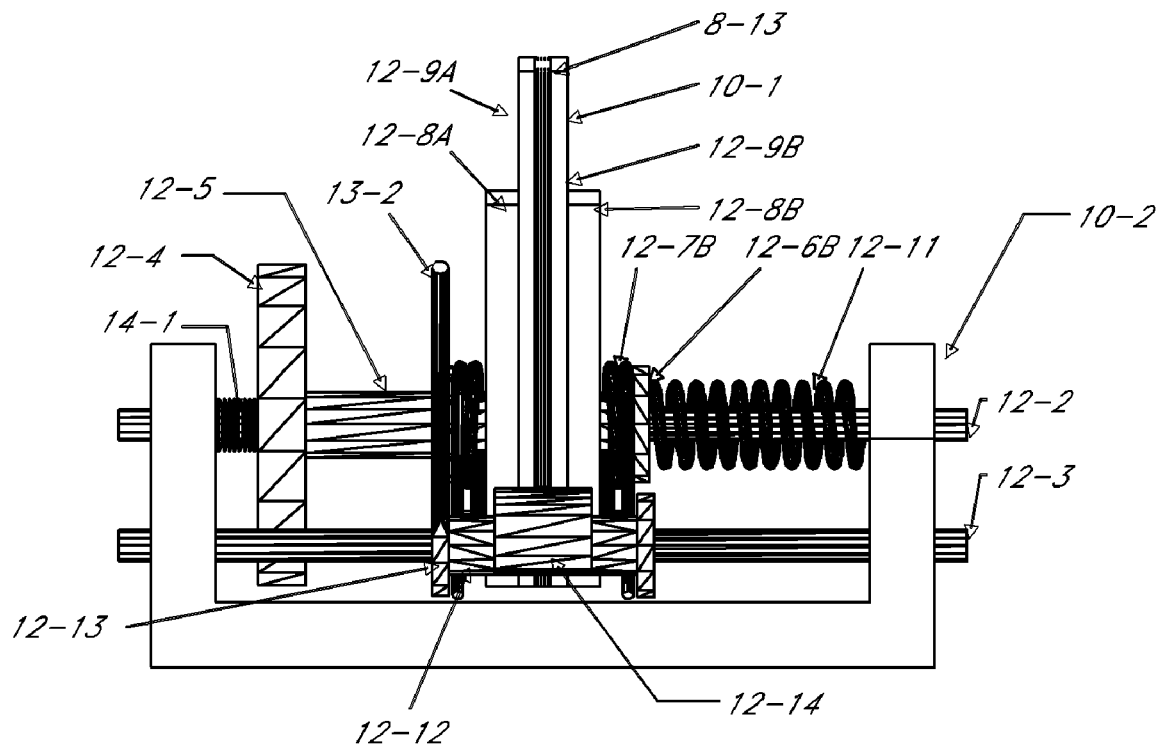
FIG. 14a is a front view of the cannon-like assembly showing various elements and mechanism.
Figure 14B:
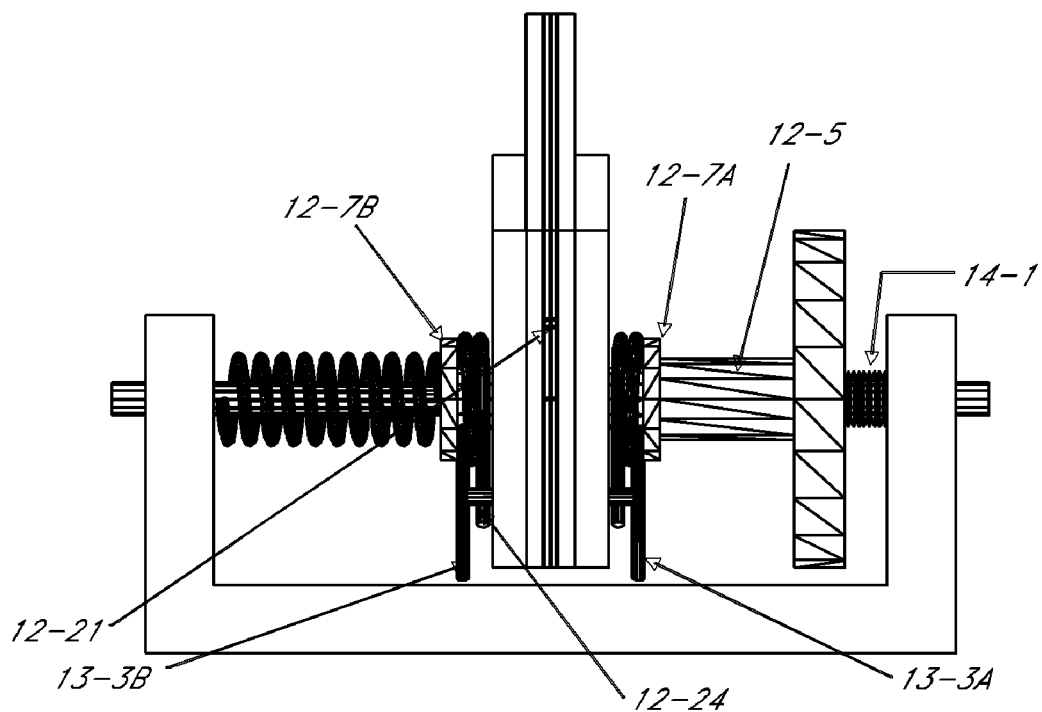
FIG. 14b is a back view of the Cannon-like assembly, showing the connection point and various springs and washers and other movement mechanisms.

FIG. 14b shows the back view of FIG. 14a, to more clearly show the anchor pin 12-24 which anchors the ends of the torsion springs 12-7 A and B, designated as 13-3A and B, finally 12-21 which is the back side of the embedded micro periodic coaxial connector PMTL is shown.

Figure 15A:
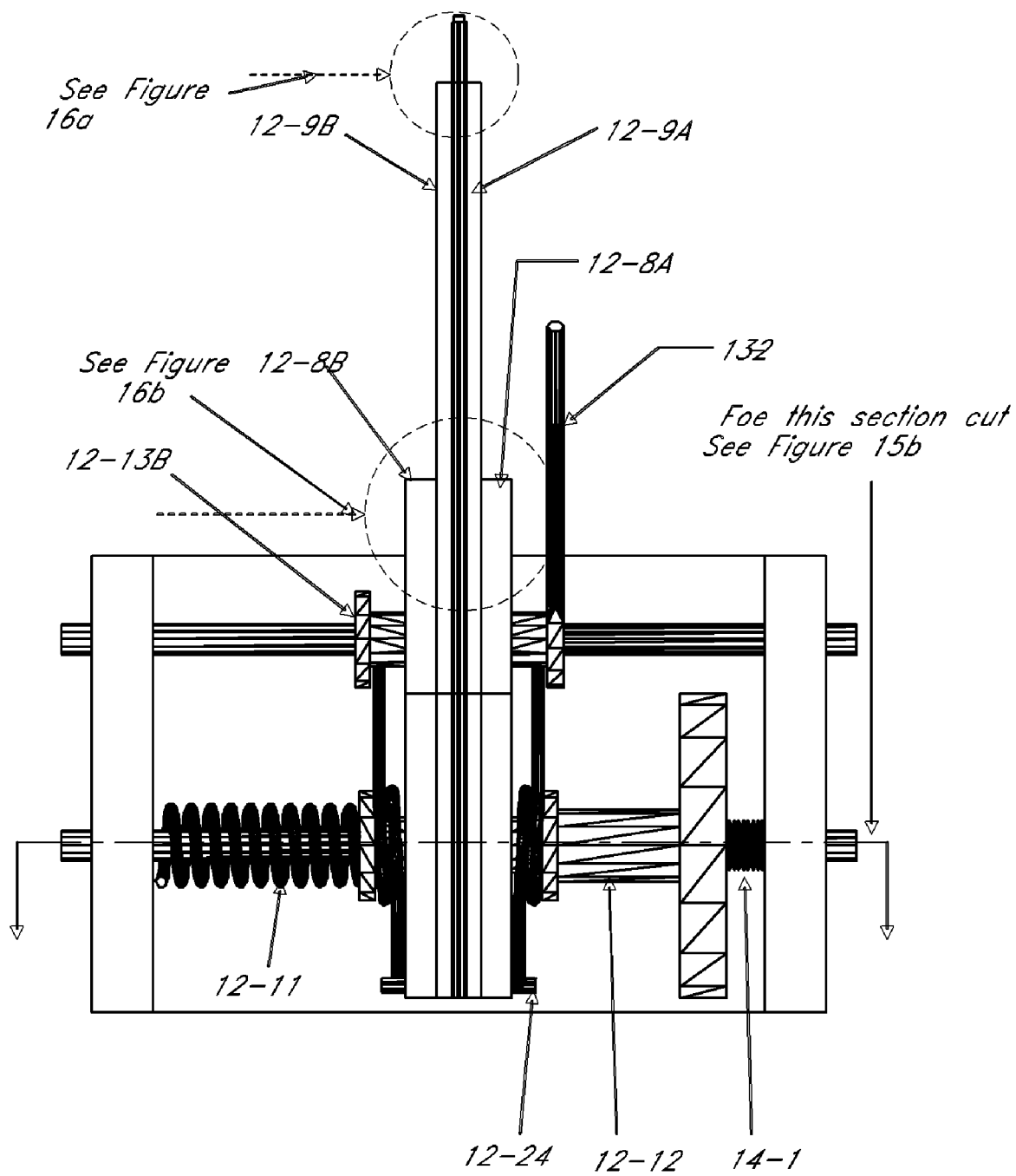
FIG. 15a shows the top view of the Cannon-like connector assembly, indicating a sectional cut through the rotation axle 12-2 shown in FIG. 15b, and close up of tip area of the connector and the middle sections shown in FIGS. 16a and 16b respectively.

FIG. 15a shows the top view of the FIG. 14 hub assembly 10-2. This Figure shows additional elements of the assembly and some zoomed in sections that will be shown in the next few Figures for more clarity. A sectional cut view of the main axle 12-2 is shown in FIG. 15b, and a zoomed view of the tip of the connector is shown in FIG. 16a, and a close up of the mid section of the connector sandwich is shown in FIG. 16b.

Figure 15B:
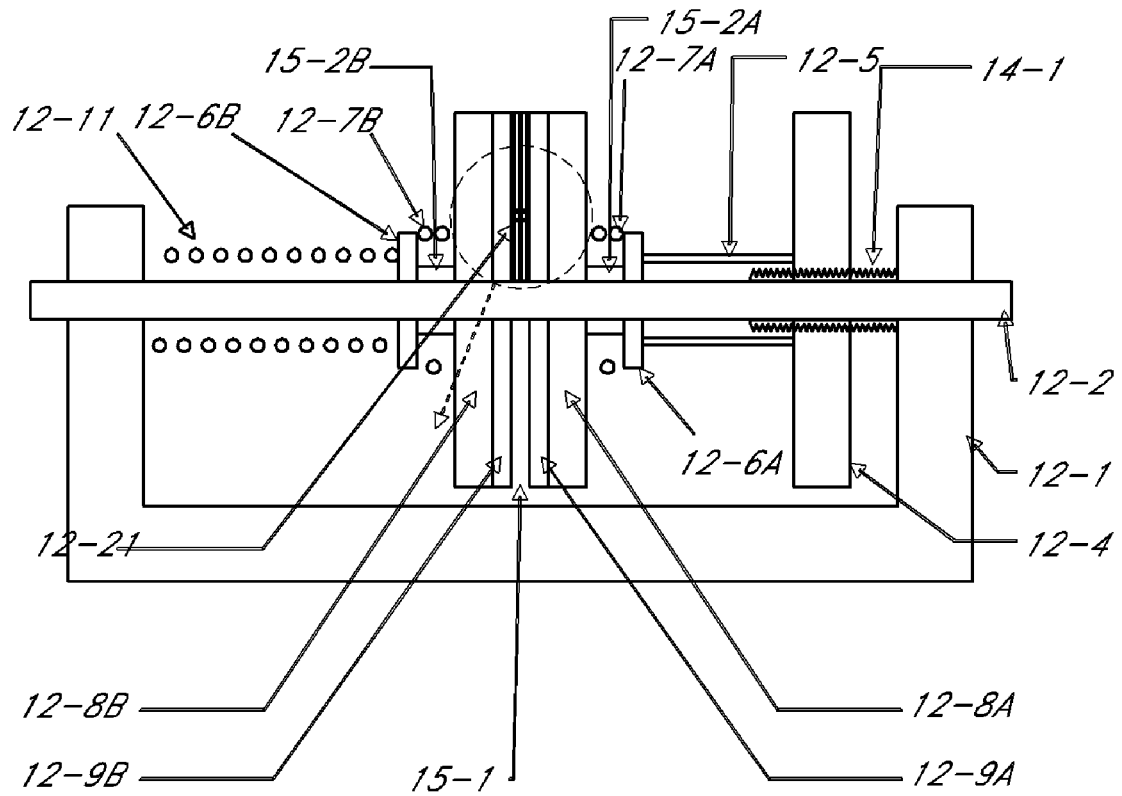
FIG. 15b shows sectional cut through the axle 12-2 exposing the mechanical details and operation. As shown, the rotation of the thumb knob 12-4 and threaded cylinder and tube 12-5 works against the compression spring 12-11 to allow fine movement and lateral position of connector in Y direction.
Figure 15C:
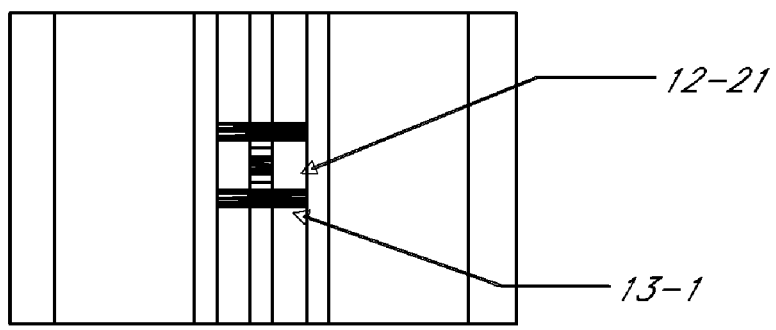
FIG. 15c shows a close up view of the PMTL Transmission Line embedded in central layers.

The sectional cut view through the main axle 12-2 of FIG. 15a shown in FIG. 15b exposes some possible arrangement of the various parts of this mechanism to provide the lateral positioning of the connector 10-1 and its rotation about the axis of 12-2. as is shown from left to right, the compression spring 12-11 provides an opposing force on the central section connector 10-1 which includes washer 12-6A and B, the spacer tube 15-2 A and B, the torsion spring mechanism 12-7A and B, and sandwiched layers, 12-8 A and B, 12-9A and B, and the much thinner central sections which provide for providing a micro coaxial transmission line 12-21. This assembly can move laterally (left and right) on the axle designed to be tight and precise and or rotate about the axle 12-2. On the right side, the components including the motion transfer tube 12-5, the thumb knob 12-4, with insider holes threads riding on the externally threaded tube 14-1 provide a lateral force on the connector assembly in the center against the force of compression spring 12-11 provided on the left side to move the central connector assemble laterally left or right directions tightly. Many different implementation of this objective are possible, this is merely one possible embodiment to achieve this goal. 15-1 shows an opening slot in the connector to allow the entire central part of the connector which is designed to be disposable to be removed from between the outer sandwich support for various applications. This allows the UTF to be used over and over for different connection patterns on the DUT and many variation of devices to be tested. FIG. 15c show a close up of the periodic micro coaxial transmission line PMTL 12-21 embedded between other circuit layers, or sheet metal layers.

Figure 16A:
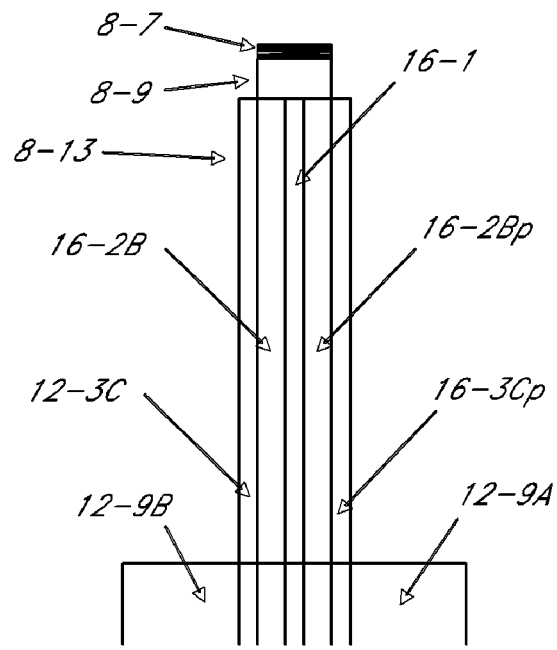
FIG. 16a is a close-up of the top view of the tip of the tapered connector 10-1 exposing more clearly the multilayer construction of the connector tips.

FIG. 16a shows a close up view of the tip of the tapered transmission line connector 8-13. As it is shown, this view reveals even thinner central layers. Specifically, a microwave laminate 16-1 sandwiched between another two layers 16-2 B and Bp, and again between another two thin circuit materials substrates 16-3 C and Cp. These are then sandwiched between sheet metals of moderate thickness 12-9 A and B for strength and rigidity. These are aligned by some alignment pins not shown and held together by fine fasteners or screws not shown. Embodiments above show a periodic micro coaxial transmission line PMTL in the central multilayer microwave substrates. Namely, substrate 16-1, 2 and 3 which provides a way to print a strip conductor pattern on its surfaces, these two strips which are not shown are then electrically connected by a blind via as is seen in the tip of 8-7, and in 8-9.

Figure 16B:
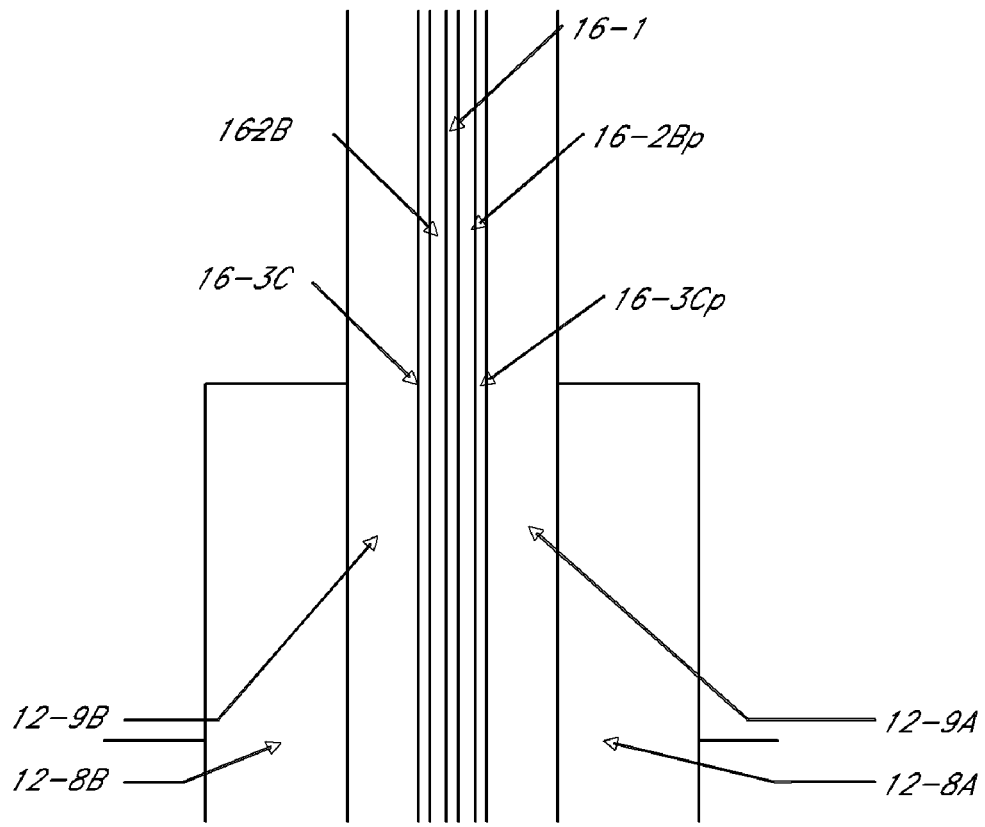
FIG. 16b is a close-up of the top view of the mid-section of the tapered connector to expose the nature of sandwiching a multilayer connector between sheet metal parts for strength and rigidity and low profile.

FIG. 16b shows the zoomed view of the mid section of the FIG. 15a. As is shown, the thin delicate central substrate 16-1, sandwiched between 16-2 B and Bp, and then between layers 16-3 C and Cp, then between sheet metal layers 12-9 A and B, and then between sheet metal layers 12-8 A and B.

FIG. 17 shows various parts and stages of the tapered connector assembly. The disclosure starts from a fully assembled connector part 10-1 that includes the fine electrical components in middle to the outer sheet metal parts. FIGS. 17a-i show the assembly as successive layers removed from outer sheets a layer at a time to get to the central layer thus, exposing various components and features of the connector. FIG. 17a shows that the connector 10-1 is made from sheet metal like parts 12-8 A and B cut to a pre-designed shape with various hole patterns 12-20n for alignment and fastening and any other required purpose. A central hole 17-1 extends through the layers and is used to put the axle 12-2 through.

The outer parts have shaped and tapered forms such as 12-16 and 12-15 and the cut outs 17-2 as needed.

The outer sheets sandwich inner layers such as 12-8A and B of sheet metal type or other types, or material with different intermediate thickness and strength and taper shape 12-16, and 12-15 and possible cut off sections 17-2 to accommodate a cam mechanism for lifting the connector tip from the DUT. These sections in turn serve to hold a more precision printed circuit board material that supports a most central layer 16-1, these serve to support an embedded PMTL to ultimately provide a tip 8-13 with connection points 8-9. This connection tip on the other side is fed from a set of flex or versatile type of micro coaxial line 8-1 realized as an integral part of the central circuit layers such as 16-1.

Figure 17A:
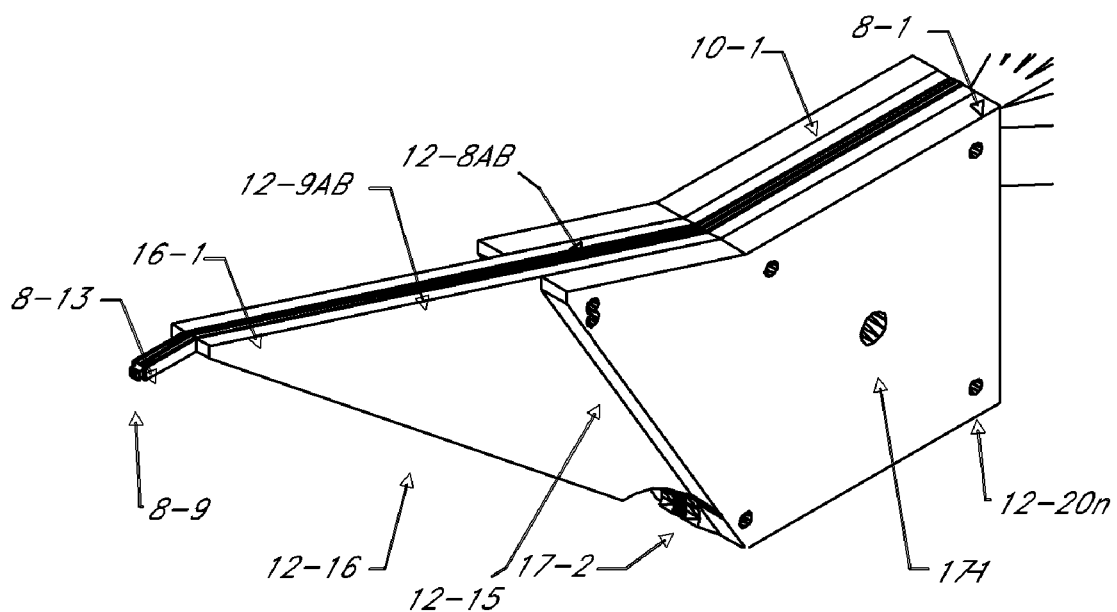
FIG. 17a shows the peacock-like tapered connector showing the multi-layers including the Thick Sheet metal plates.
Figure 17B:
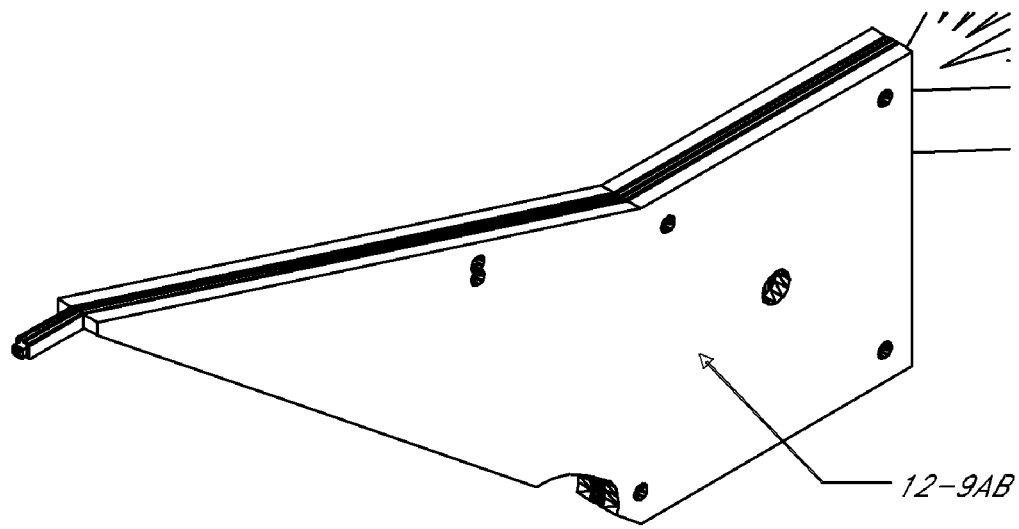
Figure 17C:
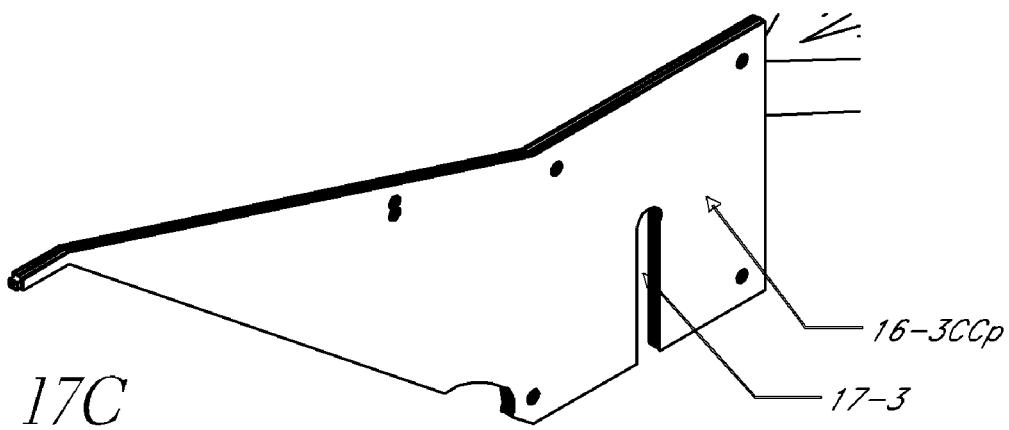
FIG. 17c shows removal of a layer from the multilayer connector of FIG. 17b.

FIG. 17b shows the connector of FIG. 17a with the outer sheet metal bracket removed to expose the 12-9 A (and B in the back). FIG. 17c shows another view of the tapered connector of FIG. 17b with the thinner layer sheet metal removed, thus exposing the first layer of printed circuit substrate 16-3 C and Cp. It also shows a vertical cut out slot 17-3 of region below the axial hole 17-1. This is the same opening 15-1 cut out view of FIG. 15b. This type of opening provides the unique ability to remove the disposable part of the connector which mainly consists of the microwaves substrate layers housing the PMTL and its extension 8-1 from the connector assembly 10-1 inner layer without the need to remove the axle 12-2 and any of the other parts from U shaped bracket 12-1. This provides a convenient way of changing connector types, or older connectors as they wear off and/or other types of connections. As will be shown, this is a part that is integrated with the micro coaxial transmission lines 8-1. These disposable circuit parts can be made from a combination of hard microwave substrates and flexible or soft microwave substrate using normally used multi-layer PCB circuit technologies readily available which inherits the accuracy of photolithographic processes and avoids the need for high precision and costly machining. Thus lowering the cost of test and providing ample availability.

Figure 17D:
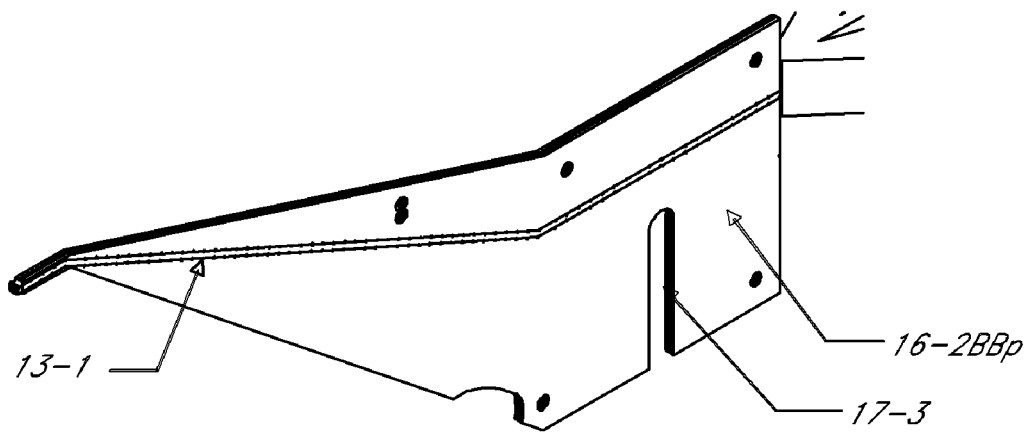
FIG. 17d shows removal of a layer from the multilayer connector of FIG. 17c.

FIG. 17d shows the next layer of printed circuit board substrate from that of FIG. 17c to expose 16-2 B and Bp. This exposes the first layer on which a metalized layer or metal cladding can exist. The metal cladding on the exposed surface of the 16-2B and Bp, can cover the entire surface or can be an etched metal pattern that becomes part of the outer shield of an embedded PMTL transmission line. As will be shown below, periodic array of such plated through via holes are incorporated to connect these two metallic shields across the other central layers to constitute the outer shield of the micro coaxial transmission line PMTL 13-1. The outline of this is shown as 13-1 in FIG. 17d. The periodic via holes on top and bottom of these traces are connecting the metalized surfaces of these substrates on either side of the outer surfaces of these substrates together. Note that this is only one way to providing a coaxial line shield through printed circuit technology. Alternatively, this can be developed by chemical etching of thick material and using a combination of thin central layer printed circuits like 16-1 and chemical machining of the U tunnels in the outer metal sheets with strategic depth and width to provide 50 Ohm rectangular micro coaxial transmission lines.

Figure 17E:
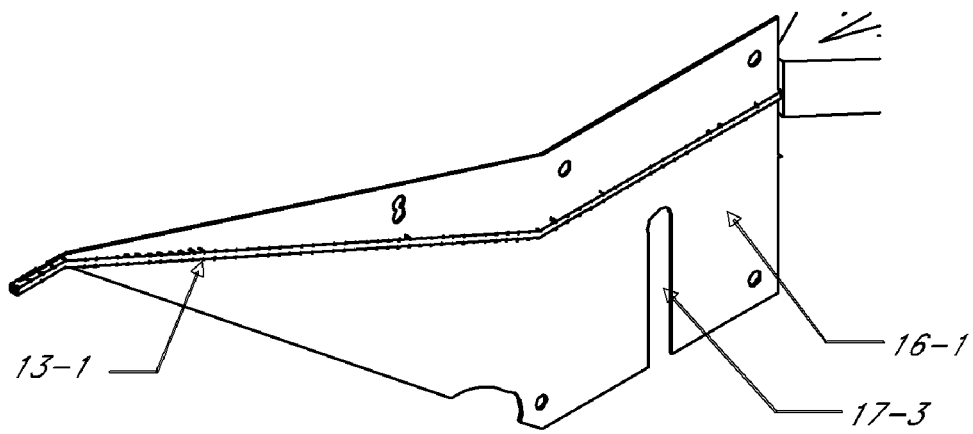
FIG. 17e shows removal of a layer from the multilayer connector of FIG. 17d.

FIG. 17e shows another layer removed from the connector assembly of FIG. 17d. As is shown, this exposes the most central layer of substrate namely 16-1 on whose surfaces a strategically designed parallel strips are printed. These parallels strips are connected through a periodic set of plated through via holes thus together emulating a thicker center conductor for the periodic micro transmission line PMTL

13-1. Several additional views of this emulated transmission line PMTL is shown in FIGS. 17*f-i*.

FIG. 17*f* shows the periodic emulated micro coaxial transmission line PMTL 13-1 connected at right to the flexible micro coaxial lines 8-1 which in turn fans out to individual lines 8-3 as shown if FIG. 8*a* to connect each individual PMTL 8-3 to a set of external connectors 8-5 which are mounted on a bracket strip 8-4 at the edge of the UTF to connect to the outside world. On the other end, this PMTL 13-1 converges to the tips 8-9 at the end of the tip section as is shown in FIG. 8*b* to connection pads 7-9 at the edge 8-10 of the DUT 7-5. FIG. 17*f* also shows some additional details of the PMTL, namely, bends on the line 17-4 and 17-5 shows another level of versatility of this design. The PMTL is so versatile that it can accommodate any number of these bends in any orientation with no additional cost. One embodiment uses a vertical pen-tip-like wafer probe that can be mounted on a high speed XYZ positioning device to allow testing any die foot print with any complex connection pad pattern.

FIG. 17*g* shows a close up view of front section of the cage-like periodic micro transmission line PMTL 13-1 showing the long outer via holes 8-7 A and B, First elements of a periodic array of such via holes 17-6 A and B as shown in FIG. 17*h*, and the central shorter plated through via hole periodic array 8-8, as first element of a periodic array of such via holes 17-9. Thus, FIG. 17*g* shows how the outer conductive strips 17-8A and 17-7B are connected by conducting members (shown as plated-through via holes 8-7A and 8-7B) to form a cage-like structure around the center conductor. The center conductor if formed by inner conductive strips 17-7A and 17-7B connected by conducting members (shown as plated-through via holes 8-8). The center conductor can also be a single conductive strip. The center conductor can also be a plurality of conducting strips without conducting members (e.g., the conducting members 8-8 can be omitted). The plated-through via holes electrically connect the metallic strips-line-like printed trace on both surfaces of the central substrate layer 16-1 as shown in FIG. 17*j* as 17-A and B, thus providing a quasi-rectangular center conductor. As shown in FIG. 17*h*, The via arrays 17-6 A and B serve to connect the metal cladding outer surfaces of the 17-8A and B shown in FIG. 17*j* to emulate a cage like rectangular cross section which serves as a outer shield of a emulated rectangular coaxial transmission line that supports a well behaved TEM propagation mode as a essence of the PMTL technology for a very wide bandwidth as was illustrated in FIG. 6 by EM simulation.

Figure 18A:
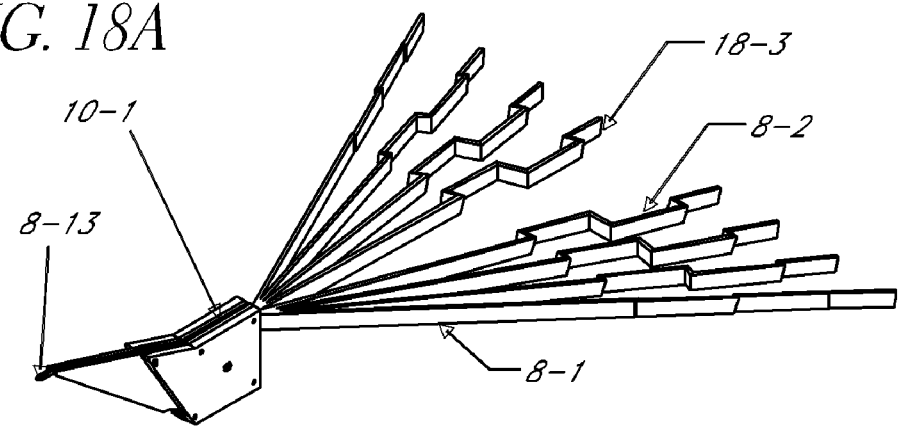
FIG. 18a shows the overall peacock-like tapered connector assembly with external sheet metals for rigidity and strength and mounting purposes.

FIG. 18*a* shows a peacock-like connector assembly with the beak being the tip 8-13 that connects to the DUT, and tail fan 8-1 that provides an efficient way to connect to larger scale external world of the DUT. The body of the peacock being the connector 10-1 with its external fortified metal sheet brackets and internal fine featured substrate layers housing the embedded PMTL 13-1 transmission line.

Figure 18B:
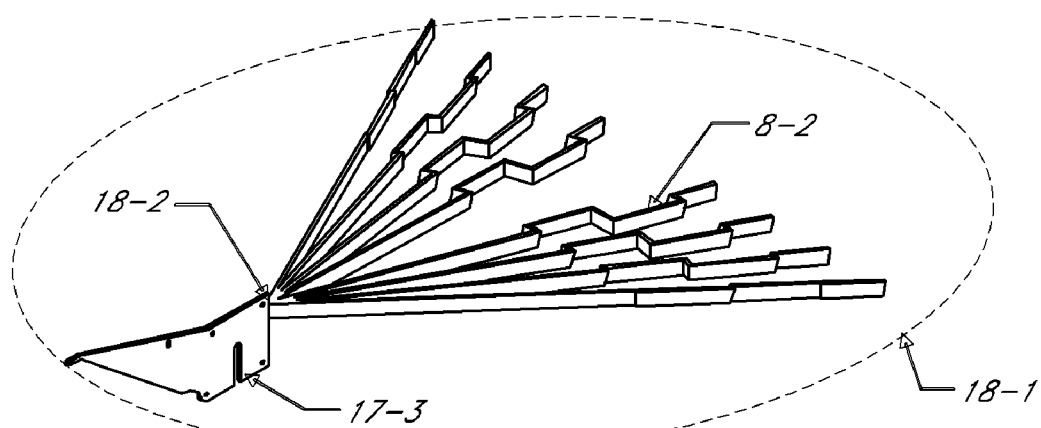
FIG. 18b shows a single disposable assembly of the connector to include multilayer printed circuits substrates of a combination of rigid or flexible nature.

FIG. 18*b* shows the fan shaped peacock-like connector, with the permanent sheet metal bracket parts removed, designated as 18-1. This assembly 18-1 can be disposable. It can be thrown away, replaced, modified or standardized. The assembly 18-1 can be manufactured uniformly using highly established and low cost multi-layer PCB processing steps, which can use flexible microwave circuit materials, rigid microwave PCB substrates, or a combination of two or more types of circuit materials, thin metal sheets with chemical machining, metal stamping, etc. One implementation of this embodiment can provide the tails of the peacock as flexible micro coaxial transmission line, each strand being a PMTL from end to end, from the beak to the end of the tail of the peacock. This is significant, since no soldering or connection modification is required at the junction 18-2, where the tail connects to the back of the body of the peacock. Since the UTF provides feature of xyz-alpha, movement flexibility as part of the design, 18-2 could be the point of highest mechanical stress, so the design provides a way to replace it quickly if it breaks. The assembly 18-1 can be disposed of and a new one installed quickly. The opening 17-3 allows this feature. To remove it one can open the fastener holding the sandwich structure of 10-1 together, open up the gap between metal sheet brackets 12-8A and B, and 12-9A and, and pull up 18-1 and through it away, and replace it with new one. Third, the back end of tails 18-3 can be implemented using a hard PCB or flex connect with a quick connect disconnect mechanism (not shown). The special bend areas 8-2 can accommodate any generic phase adjustment sections, or loops to relieve mechanical stress, or dampen vibration and decouple the movements of the connecter, on the DUT side and tails fins as they are fixed to strip 8-4 on the other side. This feature is also very significant, as it allows us to develop a pen-like vertical wafer probe that can be as agile as a high speed plotter pen, that can be mounted on a simple xyz mechanism to allow on-the-fly connection to any die pattern on a wafer, thus eliminating the need for the entire wafer chuck to move violently in X, Y, and Z to make connection to a fixed probe head, as is practiced currently. This approach allows the most valuable part of the test, namely the wafer to remain stationary and safe, and the least costly part of the test, namely the probe to take the wear and tear.

Figure 18C:
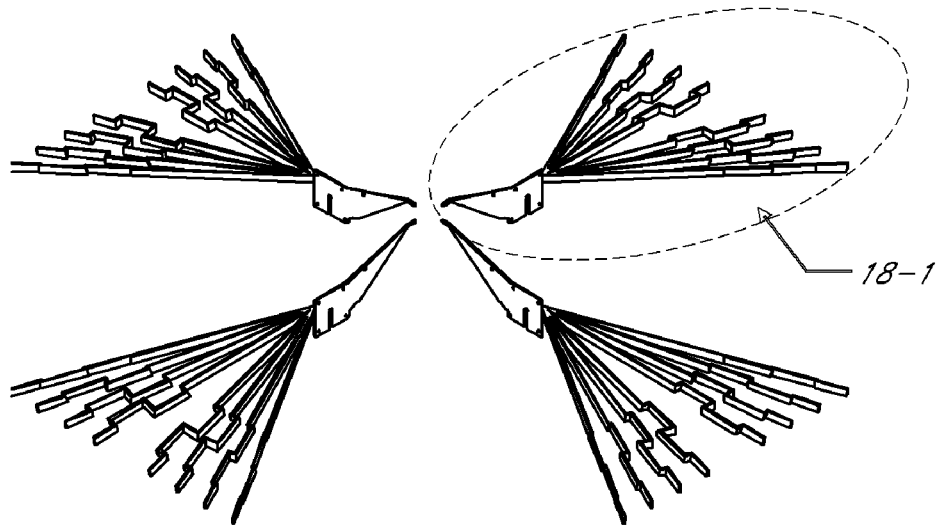
FIG. 18c shows a quad arrangement of the disposable parts of the peacock-like connector 18-1 of FIG. 18b.

Furthermore, the disposable connector assembly unit 18-1 can be repeated in any configuration for the UTF. FIG. 18*c* shows how this connector pattern is used in four sides as in the UTF of FIG. 10 to accommodate connection to four sides of a DUT.

With this development and the development of the UTF of FIG. 10, the testing can be automated. This is possible by providing a set of stepping motors for possible motion and movement for automating the test as per the block diagram of FIG. 1. Each assembly 10-3 of the UTF provides xyz-alpha movement capabilities, this includes position adjustments in x, y, and z directions, plus an angular positioning designated as alpha, thus XYZ-alpha. Although the design provides much versatility and modularity, one could use a minimal set of the modules to build a test set up that allows manual adjustment of connector position adjustment. Or one can make an automated set up as needed. The various levels of modularity that is built into the UTF makes this versatility possible. In order to fully automate the UTF, some stepping motors and controllers can be accommodated.

Figure 19A:
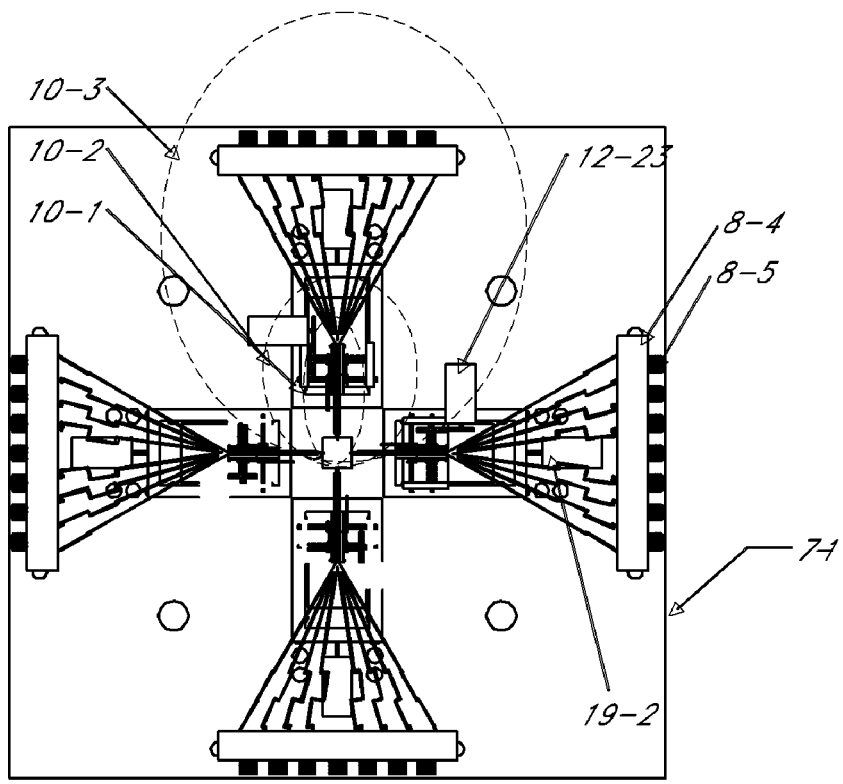
FIG. 19a is a top view of the Universal Test Fixture with possible arrangement of stepping motors for controlling of various movement.

FIG. 19*a* shows a top view of the UTF of FIG. 10 with some possible stepping motor locations and couplings. For example, stepping motors 19-2 shows a mechanism for X positioning, and motors 12-23 can be used for the lateral Y positioning of the connector 10-1.

Figure 19B:
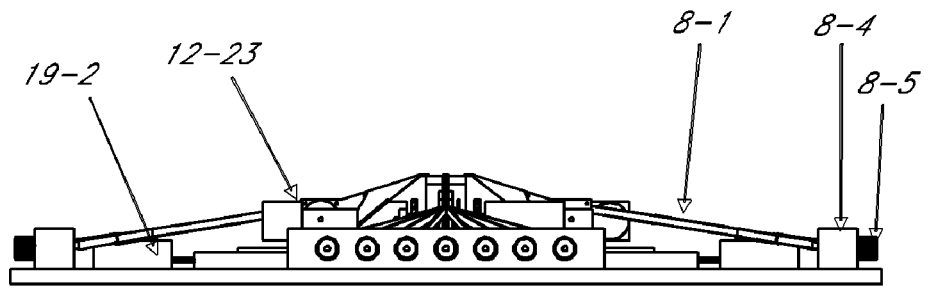
FIG. 19b is a side view showing that the design provides much room for stepping motors without interference to any other parts of the fixture.
Figure 19C:
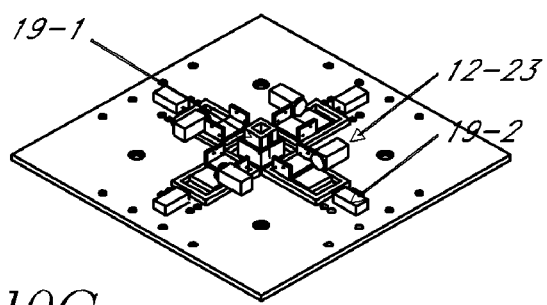
FIG. 19c is an isometric view of the UTF with motors, overall 13 such motors can provide full motion automation for XYZ and alpha rotation for the quadrants assemblies 10-3.

FIG. 19*b* shows a side view of the motorized UTF allowing position adjustments automation and programming. For more clarity, FIG. 19*c* shows an isometric view of the FIG. 19*a* with motors only to provide a better view of location of various motors and the fact that the modularity of units are still maintained. Overall, to fully automate the motions of a fully functional UTF with connector assembly 10-3 on four sides, uses thirteen stepping motors. This includes three for each 10-3 assemblies, one controlling X, one for Y, and one for rotational alpha. For four assemblies on four sides of the UTF, this requires total of 4×3=12 motors. A vertical Z positioning that is centrally located in the UTF with a rotational shaft for up and down position adjustment is described below. An additional motor is used to achieve this task, bringing the total number of stepping motors to 13. These motors can be controlled by a programmable controller that can be interfaced with the test process of FIG. 1, and as an interface to or an integral part of the controller block 1-1 in FIG. 1, with control signaling provided through the control cabling 1-2 and 1-4 to the test instrumentation 1-3 and test fixture assembly (UTF) 1-6. These motors and motor controller are generic and any of the commercially available systems can be used to accomplish this. In addition to the motors shown in FIG. 19, other motors can be added.

Figure 20:
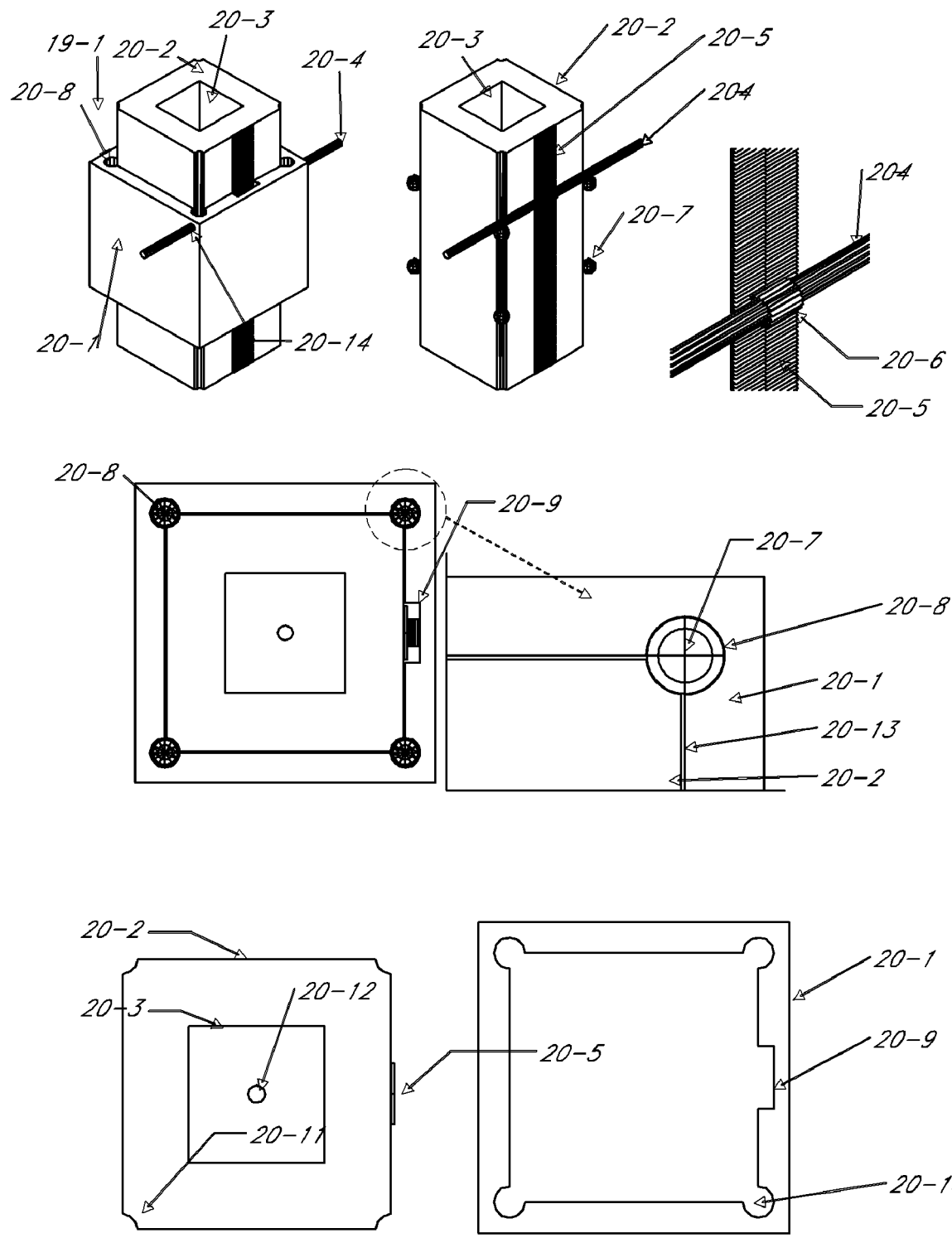
FIG. 20 shows various views of the versatile vertical position (Z dimension) slider uniquely designed to fit snugly in a central opening hole 7-7 in the UTF base 7-1. The vertical slider includes a square based cylindrical slider that fits tightly in a square tube with special ball bearing on four corners to provide minimum friction for vertical movement and tight fit for lateral stability. It also includes linear sprocket and axle that can be motorized to position the DUT vertically. The slider is equipped with coupling mechanism for a large variation of chips carriers and DUT's with vacuum hole and connector, integrated heater and thermocouple for environmental testing of the chip under thermal conditions.

As mentioned previously, to provide full capability to connect to the DUT one additional degree of motion can be added to the capability of the UTF of FIG. 10. FIG. 20 presents a unique and highly precise vertical positioning module that provides vacuum pump connection for holding the DUT in place and heating and cooling elements and thermo couples to thermally stimulate the DUT and to monitor the temperature while monitoring the electrical response of the DUT in the UTF. The vertical positioning assembly 19-1 is designed to fit as a modular central part of the base 7-1 with an appropriate mounting hole 7-7. The mechanism includes a stator-type block 20-1, a moving slider section 20-2, with a opening on top 20-3 for accommodating an auxiliary chip carrier or chip or package 7-5. This hole also can serve as a part of vacuum hole or extension of a vertical vacuum hole to the bottom to connect to a vacuum hose connection 20-12. The slider section 20-2 of the vertical positioning is equipped with a toothed linear strip (Linear sprocket) serving as a rotational to linear motion transfer mechanism working with an axle 20-4 which is connected to a sprocket 20-6 held together in strategic holes 2-14 on the sides of the housing of 20-1.

Turning the axle 20-4 moves the slider 20-2 up and down thus providing a vertical positioning of the DUT mounted on the top of 20-2 with a complementary coupling mechanism (7-8 extrusion type in FIG. 7b) that fits snugly in opening 20-3. The chip carrier type can have a hole in the center to match the vacuum hole 20-12 to provide suction holding to any DUT mounted on top of it. The slider part of the positioning mechanism 20-2 is held tightly in center of the 20-1 outer section through a unique arrangement of linear motion mechanism that holds the slider 20-2 fixed laterally but allowing almost frictionless sliding motion vertically, up and down by implementing a slider bearing mechanism on four corners of the system, i.e., using four strategically located circular or similar cut off 20-8 in four corners as shown in FIG. 20 inset. The pieces 20-1 and 20-2 fit together snuggly with precision cut pieces and insertion of precision bearing balls 20-7 in holes 20-8 held together in strategic positions along the length of the outer holder 20-1. The pieces 20-1 and 20-2 are designed to fit very snugly with a predetermined gap 20-13 which is held tightly with the appropriate size holes of 20-8 and ball bearing 20-7 and the gap 20-13. Slider 20-2 can be moved up and down by the linear sprocket 20-5 and circular sprocket 20-6 rotated by shaft 20-4 fit snugly in a opening 20-9 on the inside of stator 20-2. The lower left corner of FIG. 20 shows the Slider 20-2 removed from stator 20-1 to show a quarter of a circular cut off on the four corner 20-11, which is complementary to the corresponding three quarter of a circular cut offs 20-10 on four corners of the stator unit 20-1 shown in the lower right corner of FIG. 20.

The precision of the vertical positioning mechanism 19-1 can be improved as required by the proper design of the elements of the bearing mechanism implemented in each corner shown in the inset of middle right part, and bearing 20-7 fits snugly in vertical hole 20-8 established by the inner cut out 20-10 in stator 20-1, and 20-11 in slider 20-1, and the gab 20-13. The positioning of the bearing balls 20-7 can be fixed and maintained by a very thin sheet metal with orthogonal bend along its length, and with two strategic holes sized properly to hold the bearing ball 20-7 in a fixed position in the slider mechanism. This thin sheet metal holder is not shown. There are many possible ways to achieve this functionality. In one embodiment, this thin sheet metal piece is designed to fit in four corners and in the gap 20-13.

Figure 21A:
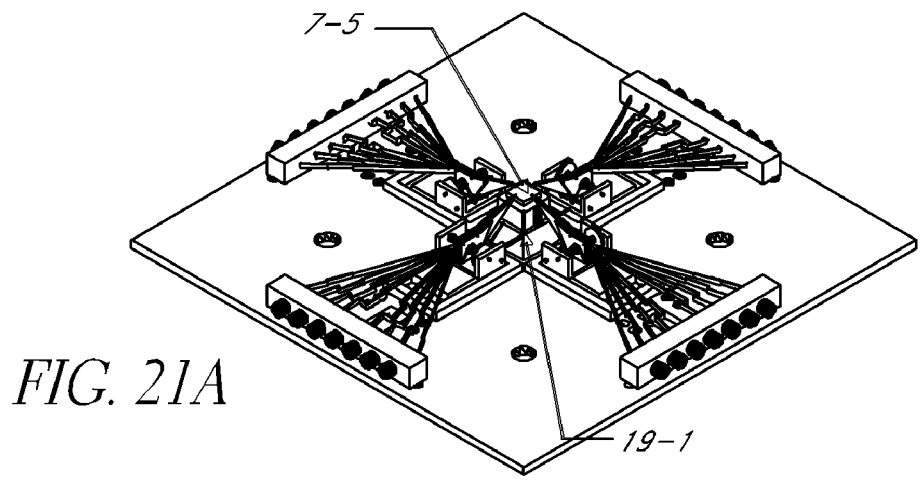
FIG. 21a is an isometric view of the UTF with the +/−Z positioning pedestal in the center.
Figure 21B:
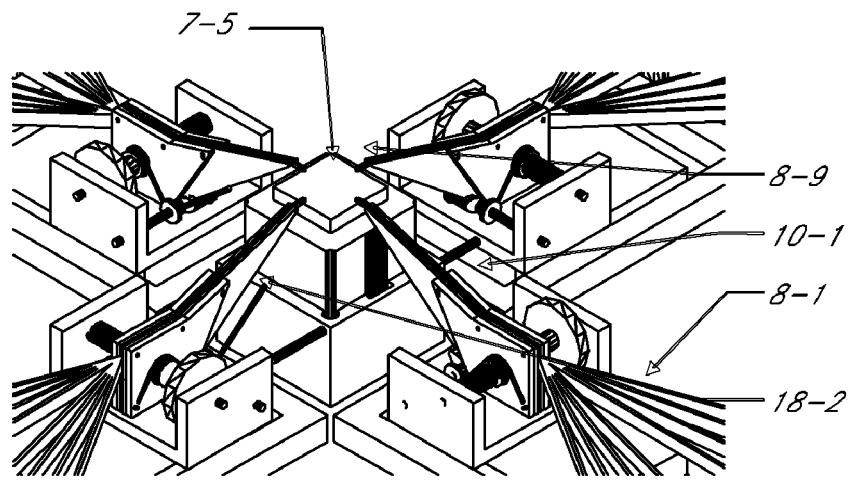
FIG. 21b shows a close-up of the central section of the UTF with vertical positioning.

FIG. 21a shows the UTF of FIG. 10, except the central pedestal 7-6 is now replaced by a vertical positioning mechanism 19-1. The UTF of FIG. 21a is capable of movements to allow complete and highly versatile connectivity of the external signals on the periphery to the central DUT 7-5 on top of 19-1. FIG. 21b shows a close up of the central region of the UTF with the vertical positioning mechanism 19-1 and the DUT 7-5 with four connector tips 8-9 engaged. A lever 18-2 is also shown that will be used to illustrate another feature of the UTF.

Figure 21C:
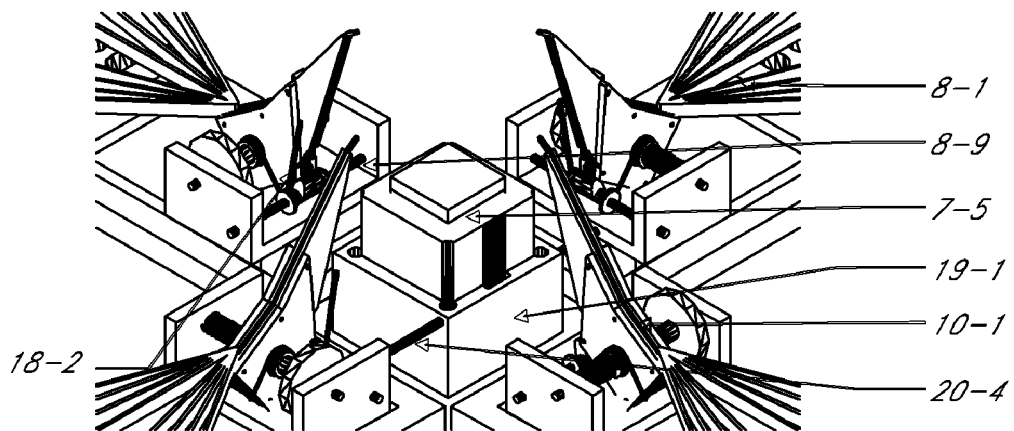
FIG. 21c shows the UTF of b) with connector rotated up to disengage the DUT, demonstrating the versatility of the design.

FIG. 21c shows rotational motion of the connector 10-1. By moving the lever 18-2 away from the tip, the cam mechanism 12-14 pushes the connector up and thus rotates the taper connector 10-1 up about the center of axle 12-2, thus disengaging the tips 8-9 of the connector from the DUT 7-5. The DUT 7-5 can be moved up or down by rotating the axle 20-4 cw and ccw, and or removed entirely from the top of the slider 20-2.

Figure 22A:
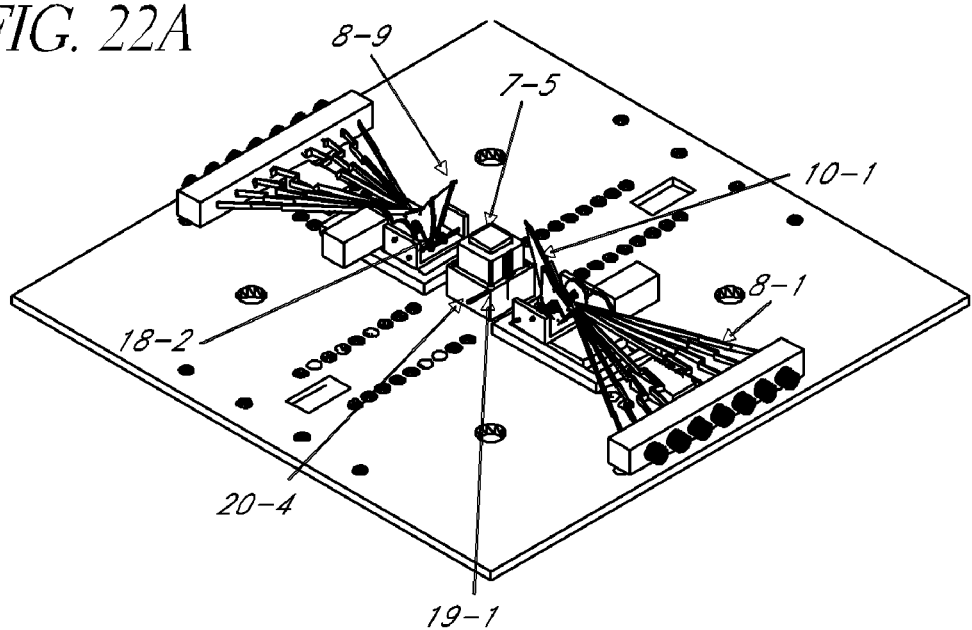
FIG. 22a is an isotropic view of a dual sided UTF with connectors disengaged from the DUT.

FIG. 22a shows an alternative dual connector UTF shown with connectors rotated up to disengage the DUT.

Figure 22B:
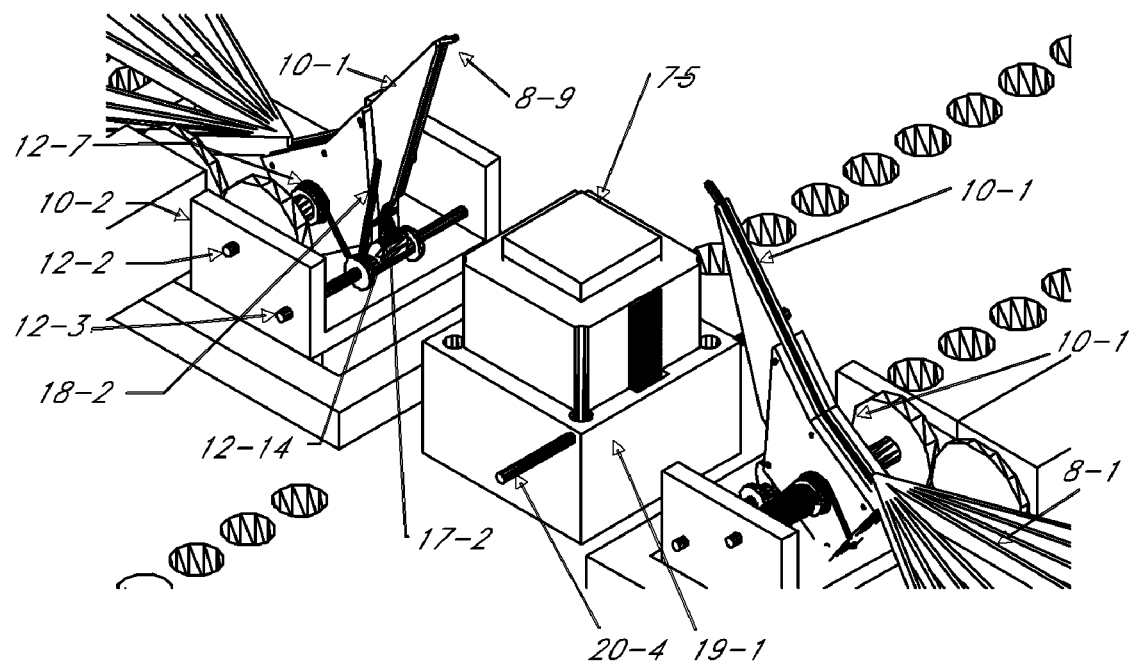
FIG. 22b shows a close up view of the central DUT area.

FIG. 22b shows a close up view of the central regions of FIG. 22a that shows the connectors 10-1 rotated up to disengage from the DUT 7-5. This view shows more clearly the mechanism of operation, by rotating the handle 18-2 about the axis 12-3, the cam 12-14 pushes the connector 10-1 about axis of 12-2 thus, rotating the 10-1 and thus moving the tip 8-9 away from the DUT 7-5 mounted on top of the positioning mechanism 19-1. In this configuration, the torsion springs 12-7 A and B act against the forces of lever 18-2, but the opening 17-2 can be designed to provide a temporary locking mechanism to hold the rotation in pre defined place until the lever 18-2 is used to return the rotation to its original position. In the up position, the DUT can be changed, or the entire vertical mechanism 19-1 can be replaced, or the intermediate types of DUT carriers and coupler can be installed, or removed. These operations can be automated. The rotation force of the shaft 20-4 to move the slider 20-2 up and down can be provided by a stepping motor (not shown) strategically positioned.

Figure 22C:
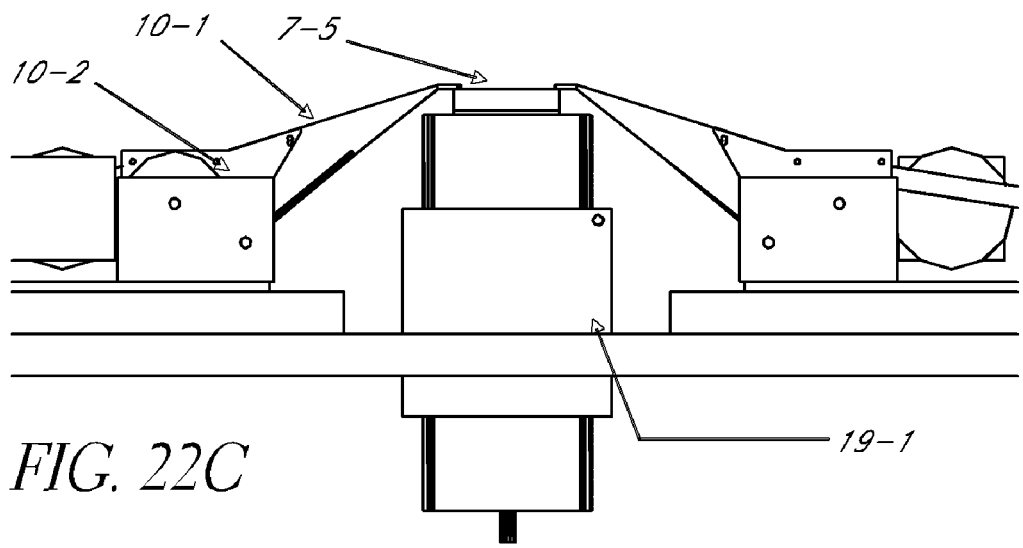
FIG. 22c is a side view and close up of the dual connector UTF with vertical positioning detail and CHIP/CHIP carrier DUT, and motors, with the connectors engaged.

FIG. 22c shows the side view of the dual connector assembly of FIG. 22a which more clearly reveals the positioning mechanism 19-1 and DUT.

Figure 22D:
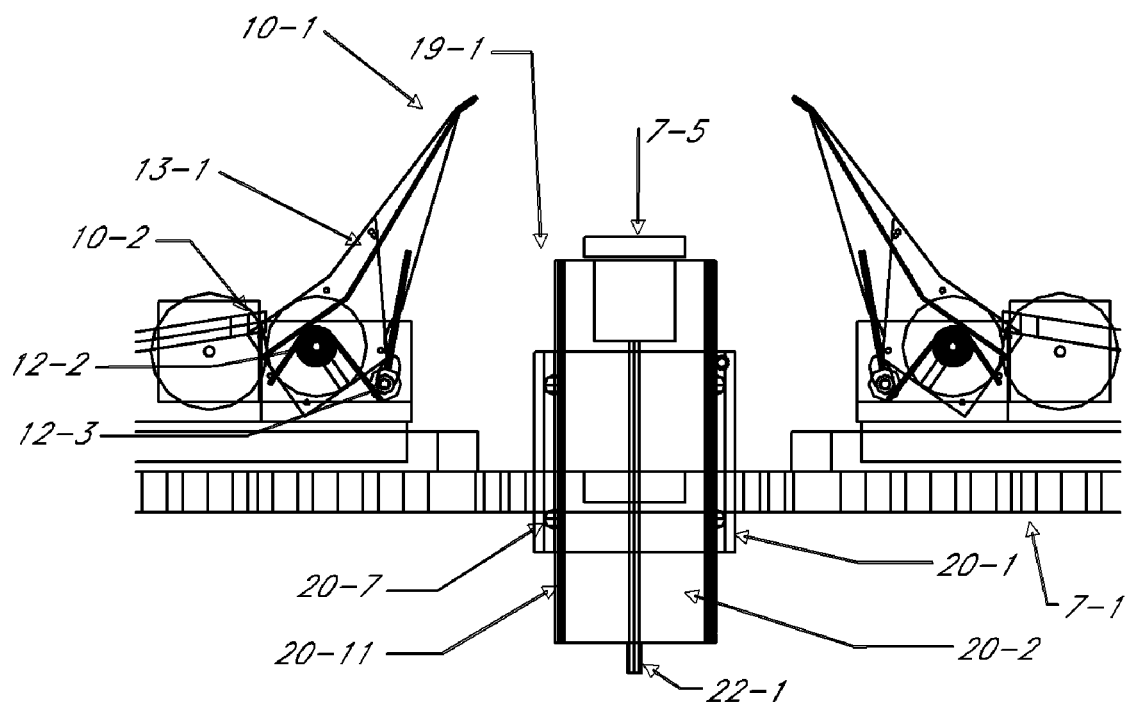
FIG. 22d is a side view with connector tips disengaged showing the hidden elements of the connection including the PMTL on both sides, further showing the other hidden detail of the vertical positioning with ball bearing and linear sprocket and motors, and torsion spring and handle, and the vacuum suction hose for keeping the DUT CHIP carrier in place.

FIG. 22d shows a similar view as the FIG. 22c, except the connector 10-1 is rotated up to disengage the tips 8-9 from the DUT 7-5. This view also shows many of the internal hidden elements of the UTF that provide great flexibility in connectivity to a tiny DUT from the outside world thus achieving the objectives of the process outlined in FIG. 1, and used in a fixed wired package of FIG. 9. The hidden integrated elements include PMTL. The micro coaxial transmission line 13-2 is embedded in the connector 10-1 on both sides. The rotational mechanism and some of the supporting mechanical elements, the axle 12-2, and 12-3, the DUT 7-5, and the central vertical positioning units 19-1 including the stator 20-1 and the slider 20-2, with bearing mechanism 20-7, and the complementary cuts 20-11 in the corners of slider 20-2, and the vacuum hose connector 22-1 at the bottom.

Figure 23A:
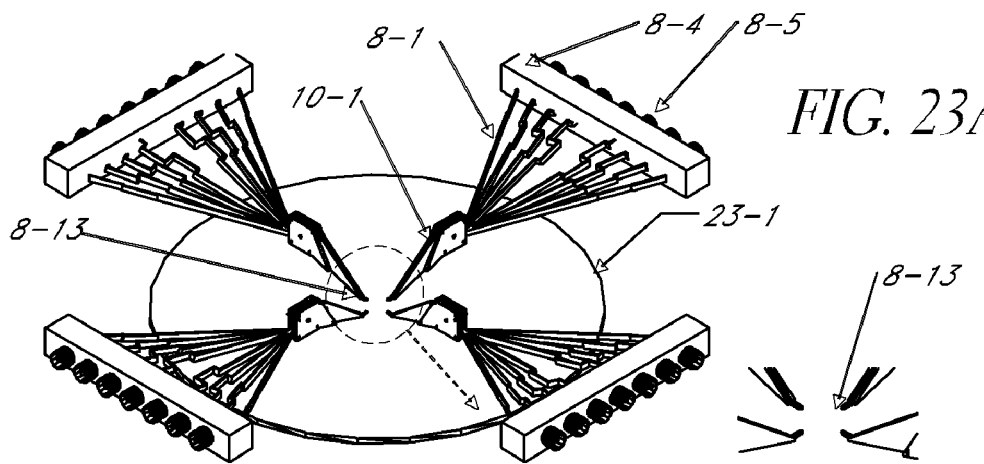
FIG. 23a shows the UTF for wafer probing directly retrofitted to existing test stations, including the inverted peacock connector used for wafer probing, also showing a close up of the tip and detail of micro axial transmission line.
Figure 23B:
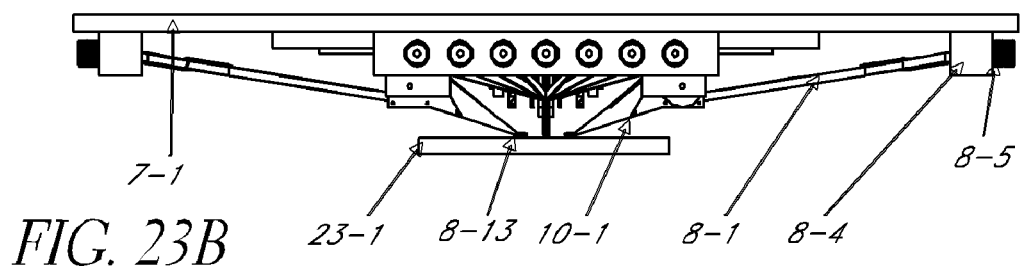
FIG. 23b is a side view of a possible embodiment for retrofitting existing wafer probing stations, with just flipping up side down the UTF embodiment disclosed here.

The micro coaxial transmission line PMTL 13-1 provides many possibilities to provide a versatile connector 10-1. The connector can also be used as a wafer probing mechanism by turning it upside down as shown in FIG. 23. FIG. 23a shows one embodiment as wafer probing device that can be incorporated in existing probing stations. FIG. 23a shows four upside down connectors 10-1 configuration as shown with probe tips 8-13 connected to out side world by 8-1 and 8-4 and connectors array 8-5. A zoomed section of this is also shown as they could possibly be used on a wafer 23-1. FIG. 23b shows a side view of one embodiment of a wafer probing mechanism as provided by just turning the UTF of FIG. 10 upside down on a probe station. This is made possible by the fact that the PMTL transmission line is symmetric and at the tip, connection mechanisms can be implemented on tip ends, top, or bottom as is evident from FIG. 17j. In FIG. 23b, the DUT is now replaced by a wafer 23-1 and rest of the functionalities remain the same or modified slightly. This versatility of the UTF shows that it can be readily incorporated as part of the current wafer probing stations in wide use today thus potentially eliminating many of its shortcomings.

Figure 23C:
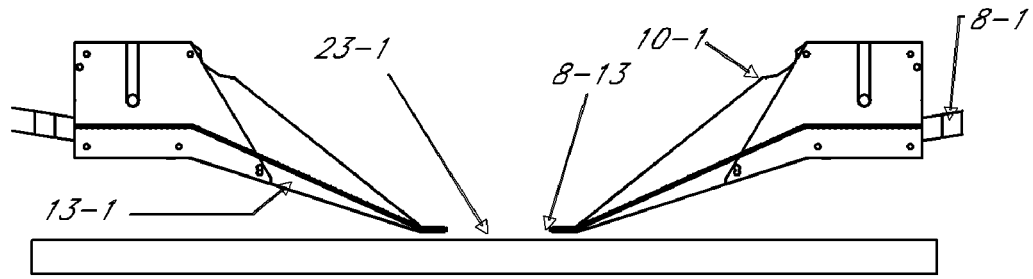
FIG. 23c shows the hidden signal lines including the PMTL micro coaxial transmission line from side coaxial connectors to the wafer pads.

FIG. 23c shows a close up of the central section of the wafer probing 23b, showing some of the hidden elements namely the PMTL 13-1 embedded in connector 10-1 (upside down) connected to the flex coaxial lines 8-1. This view shows that the elements of the UTF are capable of connecting a device on the wafer 23-1 in a Micronics scale to the external world of the wafer, and thus further proves the universality and versatility or the UTF disclosed here.

Figure 23D:
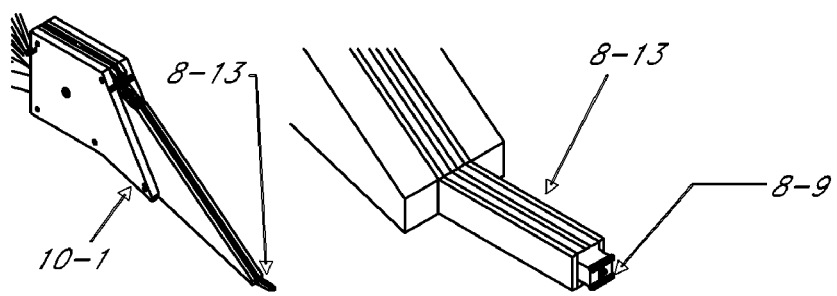
FIG. 23d shows the inverted peacock-like tapered connector and its tips are directly useful for wafer probing applications.

FIG. 23d shows a closer view of the connector 10-1 as a wafer probing device as is turned upside down, and a close up of the tip area of the connector to show that no special modification is required to make this possible.

FIG. 23 demonstrated how one embodiment can be used in the existing wafer probing station. Namely, in prior art wafer probing stations, the probes are fixed on top, and extend into a well down below to the make connection to a wafer that is placed on a heavy and complex chuck that violently moves in XYZ to make connection to tips of the probe. All of these are then housed in an environmental chamber for thermal control. The PMTL probes simplify this process and reduce its mechanical complexities and eliminate the need to move the most valuable part of the test, namely the wafer, and instead move a pen-like wafer tip to any location on the wafer, with high speed and agility and improved precision. This approach further allows incorporation of cooling and heating elements in a micro chamber at the tip of the probe for thermal cycling the DUT, thus eliminating the costly environmental chamber in use today.

Figure 24A:
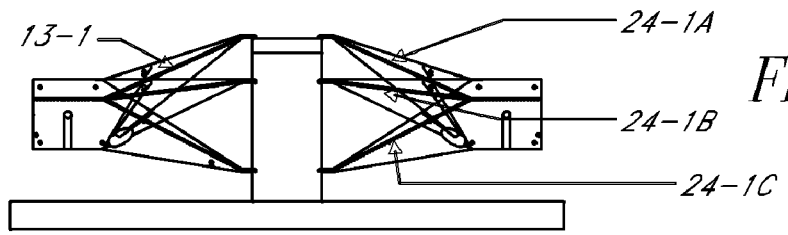
FIG. 24a shows that the PMTL can be printed in any angle and any desired shape. 24-1B shows a case with flat top substrate that can be used to develop new pencil-like wafer probes that can be matched to any wafer chip pad pattern for connection.
Figure 24B:
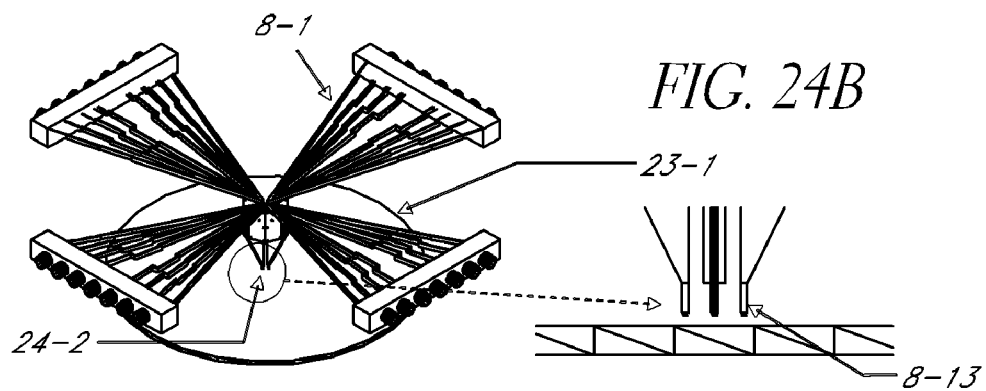
FIG. 24b shows a vertically pointed wafer probe made possible by versatility of PMTL's with tips shown in the inset, can be made programmable for any connection pattern, and any wafer and any frequencies for DC to 220 GHz and beyond.

FIGS. 24a-d show further embodiments of additional wafer probes. FIG. 24a shows the versatility of the PMTL connector technology. As is shown, the PMTL tips can be designed to be at any profile required. For example, FIG. 24a can be printed up like in 24-1A, middle like in 24-1B, or down like in 24-1C. Furthermore, this Figure illustrates that the PMTL transmission line is much smaller than the supported mechanical layers which are there just to support the PMTL and provides rigidity and bracketing for installation in other fixture parts, i.e., in hub brackets 10-2, etc. Providing mechanical support in a more compact manner allows the connector 10-1 to be thinner and lower profile. One implementation of this embodiment is illustrated in FIG. 24b. FIG. 24b shows substantially the same elements of the connector 10-1 as described above turned on their tips, and make connection from the top. This way, the probe tips 24-2 can connect directly from top to any die device on the wafer 23-1. The micro coaxial cables 8-1 are printed circuits and their angle of connection can be changed to any desired configuration. The inset of FIG. 24b shows the possible detail of connection of the tips 8-13 to the wafer 23-1.

Figure 24C:
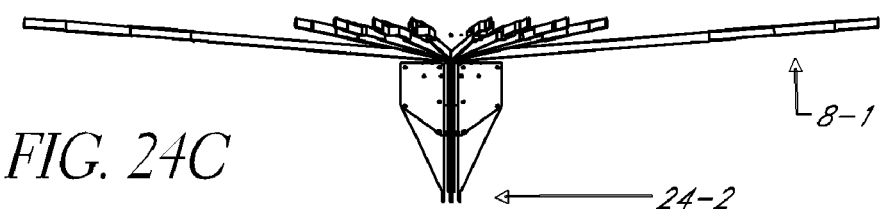
FIG. 24c is a further illustration of the concepts of vertical pencil-like wafer probe with disposable highly flexible PMTL cable that can be mounted on XYZ positioner for automation and eliminating heavy and often bulky XYZ chucks form wafer probing together.

FIG. 24c shows the corresponding disposable printed circuit parts used for the wafer probing. This corresponds to 18-1 in FIG. 18.

Figure 24D:
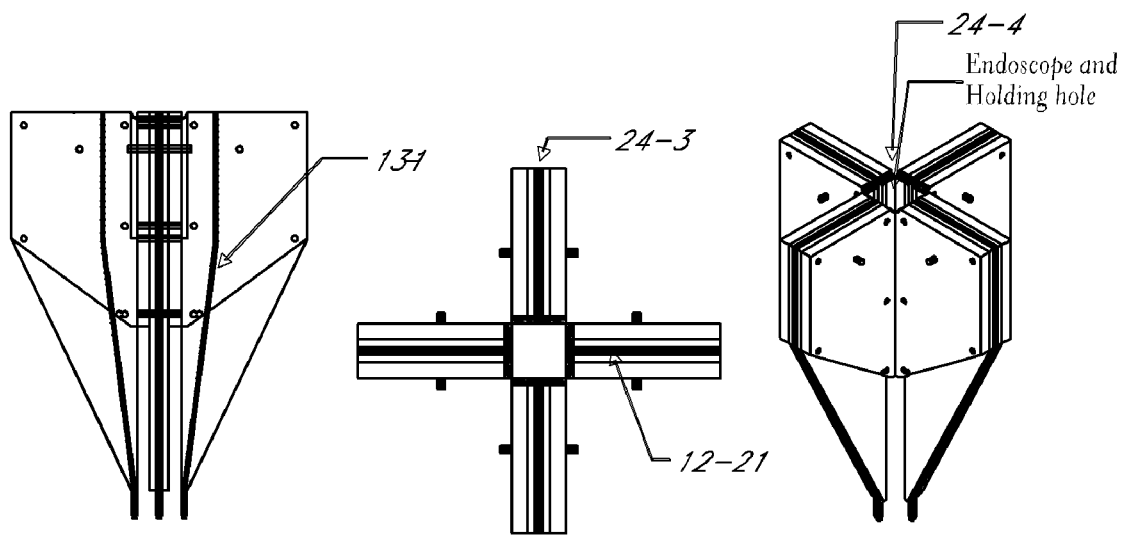
FIG. 24d shows various views of the new pencil probe for versatile probe tips and connection patterns.

FIG. 24d shows a side view of a possible pencil-tip-like wafer probe realized by placing four connector 10-1 with profile of 24-1B with straight upper edge to realize a pen-like wafer probe with PMTL 13-1 carrying a plurality of signals from the external world of the wafer chips to the Micronics pads of the wafer dies. This embodiment would look similar to the tip of a Phillips head screw driver. Note that in this embodiment, it is possible to reduce the structure to a smaller profile, sufficiently large to support the PMTL with adequate mechanical support. So, this could be as small as the needle tips, but with a great number of connection points properly designed to match the connection pattern of the dies on the wafer. This mechanism can be mounted like a tip of a plotter pen onto an ordinary high speed XYZ positioning can serve as a new wafer probe. The wafer can be stationary. FIG. 24d further shows top view 24-3 of the disclosed vertical probe tips. 24-4 shows an isometric close up of the Philips screw driver tip-like wafer probe of the same type connector as 10-1 used for the UTF. This tip can be made relatively small.

The versatility of the new periodic micro axial transmission line PMTL is further illustrated by using it in developing a new type of compact signal launchers that can be used to develop microwave and high speed digital chip test fixtures. The new launcher can be used to more directly connect to the edges of PCB's and other similar applications in high speed digital and microwave circuits boards in R&D circuit boards.

Figure 25A:
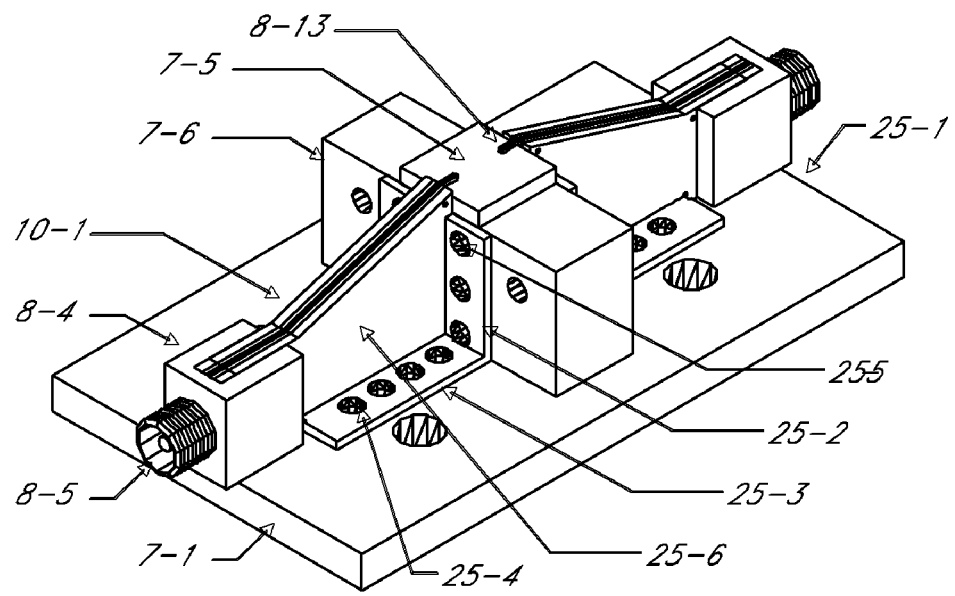
FIG. 25a is an isotropic view of a highly versatile high speed semiconductor chip test fixture using the peacock-like connector and PMTL technology. Many of the elements shown are optional and may be further simplified and made with lower cost.

FIG. 25a shows a test fixture 25-1 that provides signal launcher 10-1 on both sides of a central block 7-6. Each signal is launched through the coaxial connector 8-5 secured to the launcher 10-1 by a block 8-4 through the connector 10-1 to the tip 8-13 of the launcher to the DUT 7-5. The test fixture assembly is mounted on a base 7-1 block. The same elements of original launcher 10-1 first introduced in FIG. 10 is mounted inside a sheet metal fixture 25-6 bracket. The new launcher can be designed to have sections that act as fastening flanges 25-3 with hole pattern 25-4 to be mounted on the test fixture base 7-1. It also can have vertical flanges 25-2 with mounting holes pattern 25-5 to be secured to the block 7-6 with matching hole pattern or alternatively with a wide opening slots along the flanges to allows mounting with adjustable positions.

Figure 25B:
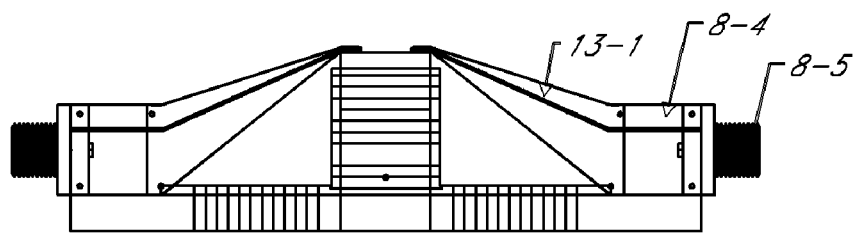
FIG. 25b is a side view of the test fixture showing the hidden PMTL 13-2.

FIG. 25b shows a side view of the elements of the test fixture 25-1 to show the signal path from the right side external coaxial connectors 8-5 to the embedded PMTL 13-1 to the DUT on the top of central pedestal, and back to the PMTL 13-1 and out on the other side to the external coaxial connector on the left side.

Figure 26:
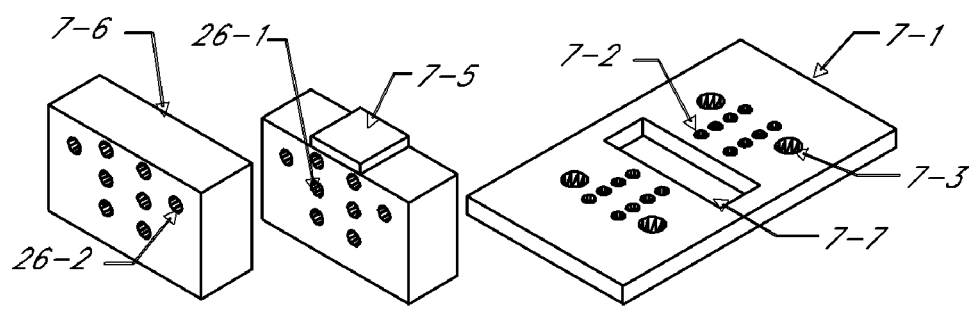
FIG. 26 shows elements of the compact test figure of FIG. 25 similar to the basic elements of the UTF of FIG. 10, for various applications.

FIG. 26 shows some basic elements of the test fixture 25-1. The central block 7-6, with a hole Patten 26-2 and 26-1 for mounting the launchers of 25-6 type brackets on to pedestal. The DUT 7-5 block can be mounted on top of the 7-6. The base block 7-1 is also shown with a threaded hole pattern 7-2 and through holes 7-3 for mounting on a work bench and the like. The opening 7-7 in the center of the base block 7-1 serves as one way of securing the block 7-6 in place.

Figure 27:
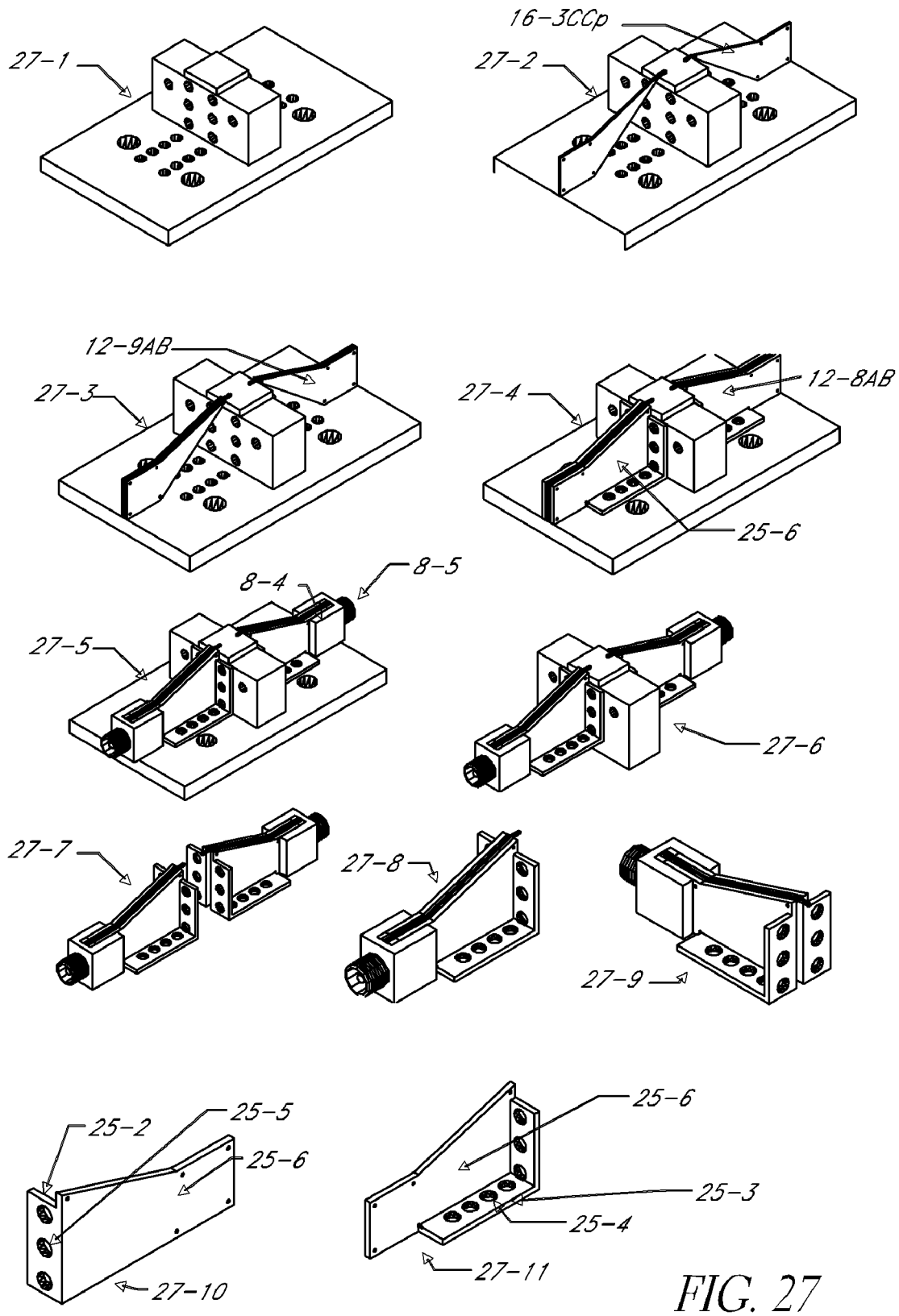
FIG. 27 shows various isometric views of a compact test fixture with exposed elements of the construction.

FIG. 27 shows some basic configurations of the test fixture 25-1. From upper left 27-1 shows the test fixture with basic base block 7-1, the central block 7-6, fit in the opening 7-7 and with the DUT 7-5 mounted on the top of central pedestal 7-6. Next in 27-2, the basic connector layers that house the micro coaxial transmission line PMTL 13-1 is shown as the most central part of the connector 10-1, 16-3 C and Cp. Item 27-3 shows the next layer in the connector sandwich 12-9 A and B. 27-4 shows the next layer 12-8 A and B that is used to hold the connector together and also provide connection brackets 25-6 and flanges to allow securing the launcher assembly to the test fixture base 7-1 and pedestal 7-6. 27-5 shows the assembly with connectors 8-5 and holder block 8-4 to make the fixture complete. To show the additional versatility of the design, 27-6 shows that the launchers blocks can be secured directly to the central pedestal 7-6. Call-out 27-7 shows the pair of launchers separately without connection, 27-8 and 27-9 views of the launcher 10-1 by themselves.

27-10 shows a view of the bracket walls 25-6 and fastening holes patterns 25-5 on a flange 25-2. 27-11 shows another view of the bracket 25-6 with flange part 25-3 and holes patterns 25-4.

Figure 28A:
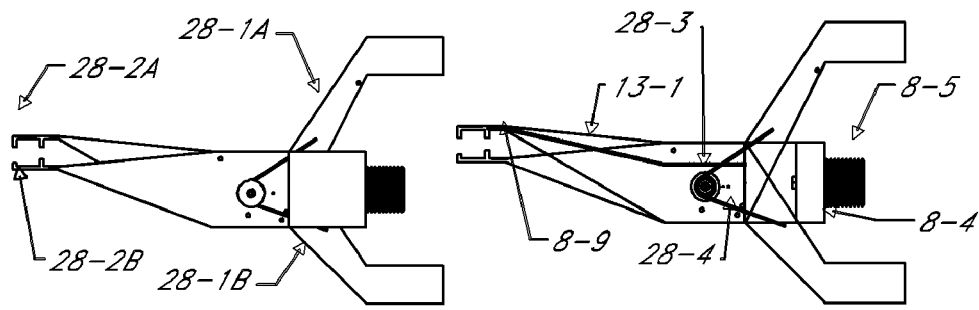
FIG. 28a is a side view of an embodiment with teeth that can engage and clasp a matching set of hole of the edge of PCB to ensure mechanical stability and good electrical contact.
Figure 28B:
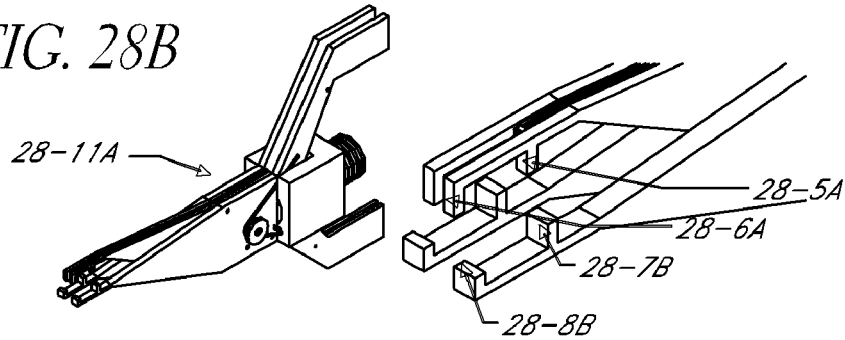
FIG. 28b is an isometric view of the RF alligator clip, and close up of the tips teeth.
Figure 28C:
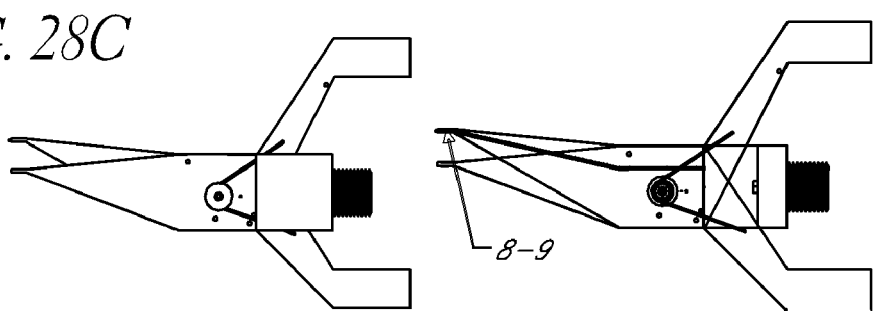
FIG. 28c is a side view of an embodiment without tooth.
Figure 28D:
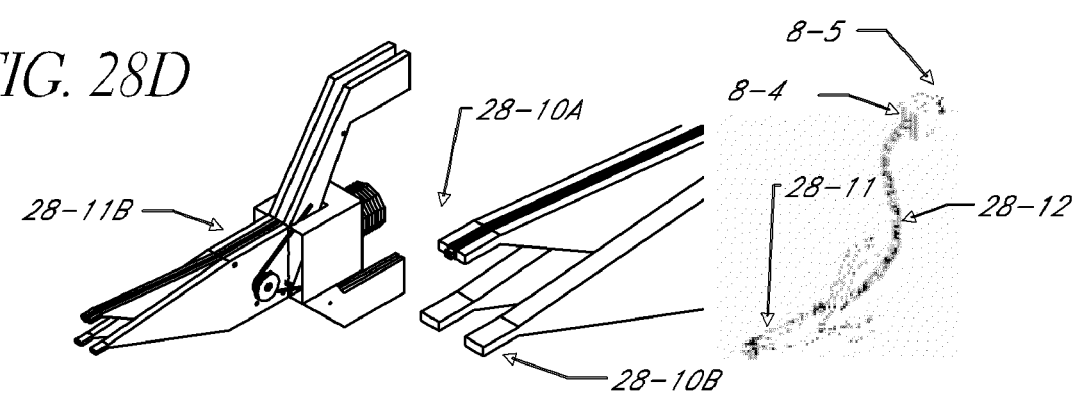
FIG. 28d is an isometric view and close up of tips and a clip with flexible PMTL cable and connector.

The PMTL provides yet another capability that has not been possible previously. In low frequencies, an alligator clip provides a connection mechanism for circuit elements for testing and moderate connection from DC to a few hundred MHz. One embodiment of the PMTL allows provides performance from DC to 220 GHz and higher. FIG. 28 shows one possible embodiment of the wideband RF alligator Clip intended to connect to edge or some strategic points on a PCB or Chips or test fixtures. As is shown, the clip includes two handle 28-1 A and B which are anchored by a axle 28-3. The torsion springs 28-4 provide force to close the jaws of clip tip 28-2 A and B. Squeezing the clip handles 28-1 A and B opens the jaws so that it can be clipped to the edge of PCB with a matching terminal trace for a specific impedance. The PMTL 13-1 provides a way of connecting a signal (or plurality thereof) from coaxial connector 8-5 (or a plurality thereof) secured to a special block 8-4 that is electrically connected to the PMTL that takes the signal to the tip(s) 8-9 which it then couples to a matching terminal pads pattern on the DUT. FIG. 28-*b* shows an isometric view of the RF clip with zoomed in regions of the tip shown to the right. The tip has teeth on the bottom jaw 28-8B and 28-7B and the upper jaw 28-5A and 28-6A, are designed to match a set of holes on the PCB. The jaws of the RF Clip are opened to connect to the PCB. The torsion spring 28-4 provides a force to close the jaws tightly on the PCB where the tip 8-9 connection makes contact with the transmission line pads on the PCB thus making quick connect/disconnect contacts with the PCB or DUT. FIG. 28*c* shows another embodiment of the RF Clip with simple tips. Many other variations are possible. These embodiments can be made to connect at any angle, pen-like to any pad location on the PCB/DUT with strategic jaws and teeth and complementary holes on the PCB for clasping. FIG. 28*d* also shows another possible embodiment made including a flexible type PMTL cable 28-12 connected between the coaxial connector block 8-5 and the alligator type RF Clip 28-11 thus providing a flexible way of connecting to terminals of a instrumentation on one side using the coaxial connector interface 8-5, and on the other side using the RF Clip 28-11 connecting to edge or any points on a PCB.

Figure 29A:
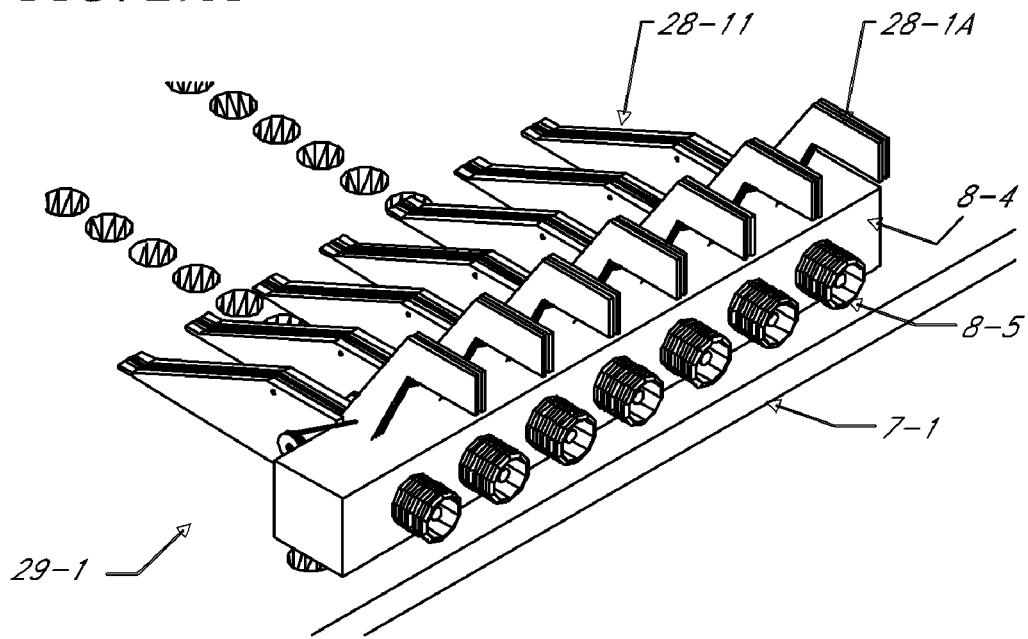
FIG. 29 shows an array of RF Clips mounted on a base board to provide an RF Clipboard for testing High Speed Evaluation PCB's.
Figure 29B:
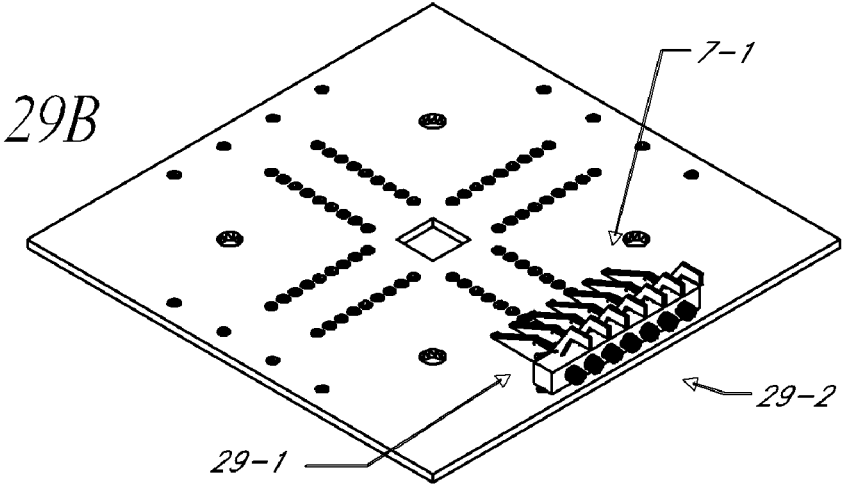
Figure 29C:
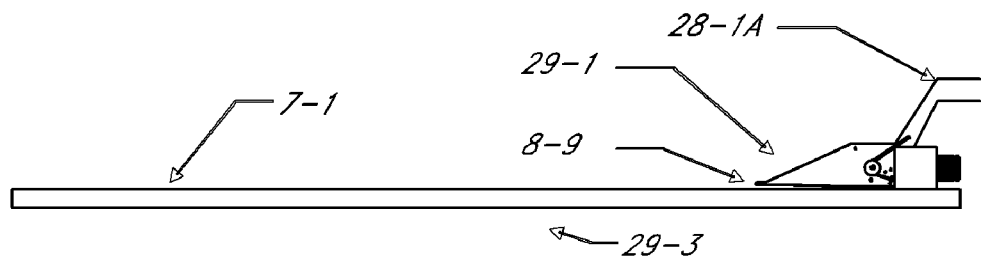

An arraying of several PMTL connector slices can be made that can connect to a connector strip as in 8-4 in FIG. 8, for a multi-connector wide alligator type RF clip for making multi point connections to an array of G-S-G-S-G-S-G . . . (or any combination thereof) pads on a board or a chip. One embodiment combines the generic base 7-1 and the an array of RF-Clip 28-11 to provide a Strip of RF Clips 29-1 shown in FIG. 29 to provide a Clipboard 29-2 type of test fixture, where a wide jawed RF-Clip array on edge of 7-1 secured with some bolt to hole strip 7-4 (FIG. 7) can be implemented to quickly insert a PCB on to the RF-Clip-Board 29-2, as easily as a sheet of paper is put on a clipboard. These are facilitated by the modularity of the PMTL transmission line. In another embodiment, a flexible PMTL 28-12 can be used similar to FIG. 28*d* with one end connected to the PMTL 13-1 of RF Clip 28, and the other end connected to a connector strip of 8-4 and 8-5, constituting an array clip 29-1 secured to the base 7-1, as in FIG. 10*a*. The RF alligator clip 28-11 connected to the flexible PMTL 28-12 is free to connect to any point of a PCB, e.g., on an RF-Clipboard 29-2, while the external connections, i.e., test cables can be connected to the connector which are securely mounted on the base 7-1, thus decoupling the RF Clip motions from the environment and provide flexibility to connect to any point of the PCB/DUT. A plurality of RF-clips can connect to a multiplicity of points on a circuit board. The RF alligator clip and the RF clipboard can provide excellent RF connections for a very wide band up to 220 GHz. FIG. 29 shows several views of the RF Clipboard 29-2, specifically, at the lower section a side view of the RF Clipboard 29-2, as 29-3.

Figure 30:
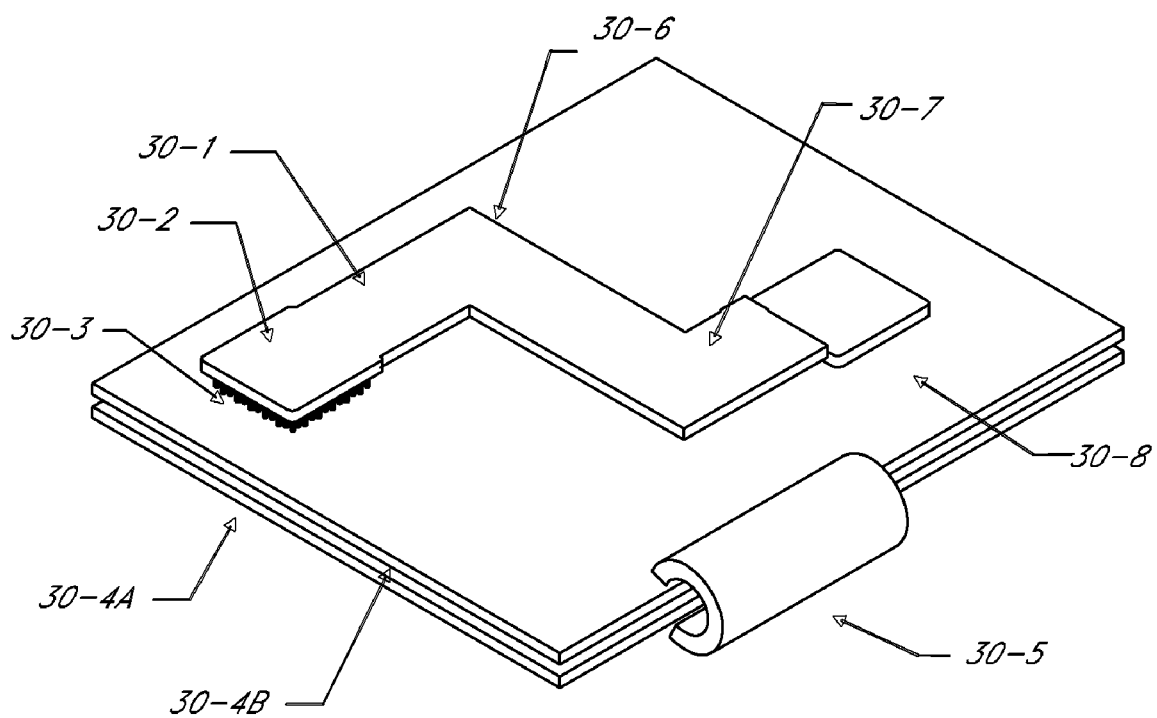
FIG. 30 shows a flexible PMTL connector arrays for connecting multilayer boards on the edge and connecting chips and packages on PCB boards made from inexpensive boards such as FR4.

One application of the PMTL transmission lines is implementation in a multilayer/multislice flexible circuit technology thus, providing new ways for interconnecting chips to chips and/or board to board. This way it is possible to use cheap FR4 PCB materials to place the very expensive and fast chips to just house them on a rigid structure, then use the Flexible PMTL structure or flexible cables to interconnect them. One possible embodiment of this is illustrated in FIG. 30, where two layers of inexpensive FR4 PCB's 30-4A and 30-4B are connected on the edge using such an array of flexible PMTL's 30-5. FIG. 30 further illustrates another type of flexible array PMTL connector 30-1 that connects a high speed packaged chip, e.g., a BGA 30-8 to another packaged chip 30-2 with a special multi pin array connector 30-3, with several possible bends 30-6 and 30-7. The flexible connector strip can be designed to bend in any random planes, i.e., 30-5 for between layers, and 30-1 for connections in the same layer of PCB, thus providing a great range of possibilities of high speed interconnections.

Figure 31A:
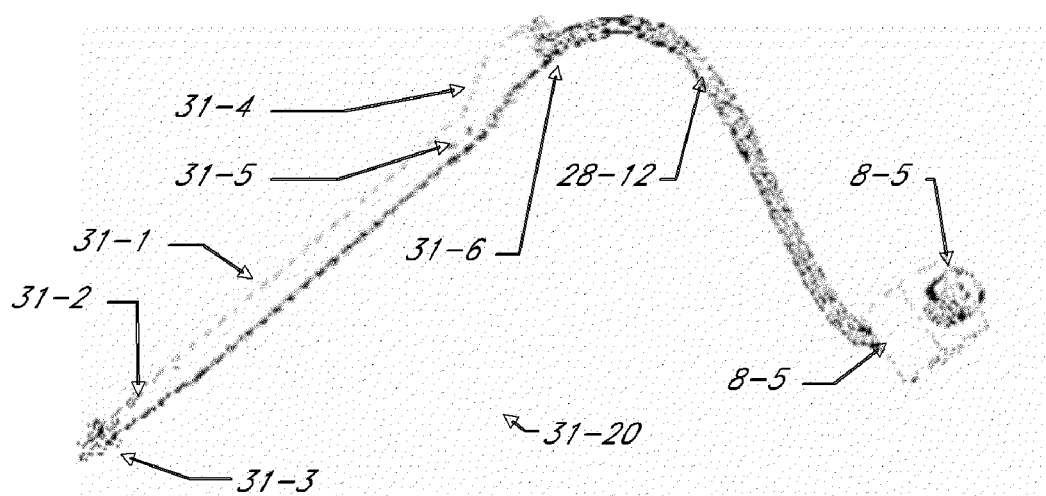
FIGS. 31a and 31b show a PMTL based high performance with a flexible DC-220 GHz PMTL Hand Held Probe with high terminal impedance with minimal loading of the test transmission lines on the high speed PCB's.
Figure 31B:
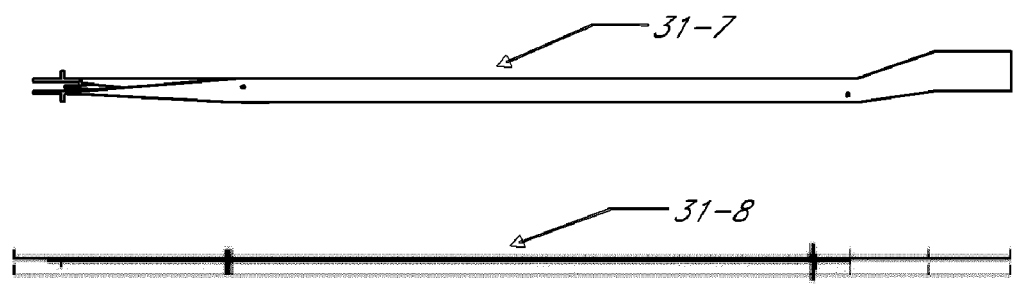
Figure 31B:
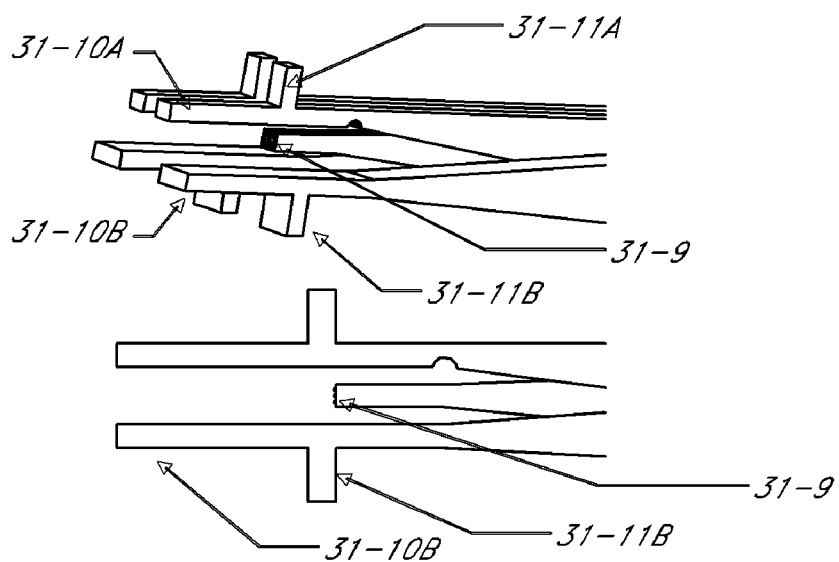

In addition to the RF Clip 28-11, and the RF Clipboard 29-2, the PMTL allows for a hand held pencil-like probe 31-20 shown in FIG. 31 as for high speed circuit board testing and development of strategic Test Points on the PCB. The Hand held probe 31-20 can provide a single or a multiplicity of embedded PMTL that can connect on one end to flexible PMTL 28-12 which is then connected to a coaxial connector 8-5 through a holding block 8-4. On the other end, the flexible PMTL transitions into the body of the hand-held probe 31-20 at the junction 31-6 which extends to the tips 31-3 with GSG configuration or any other types with controlled impedance. The hand held probe includes the handle end 31-4, the main body 31-1, the transition region 31-2 and the tip region 31-3. It is made from the basic multi layer PMTL technology with alignment and fastening mechanism 31-5. The Hand held probe can accommodate at least one impedance transformer that converts the terminal impedance of the instrumentation side, e.g., 50 ohms to a high impedance, e.g., 500 Ohm, so that when connected to a test transmission line on the PCB, will not load the PCB line. The Hand Held 31-20 Probe can include various elements such as capacitors, inductors, Active IC's, including amplifiers, mixer, to condition the signal that can be connected to ATE instrumentations such as Spectrum Analyzers, Network Analyzers, Signal analyzers, Sampling Oscilloscope etc. Call-out 31-7 shows a side view of the Hand held probe of 31-20, and the 31-8 shows the top view of the Hand held probe exposing the multi layer nature of its construction. FIG. 31*b* shows a close up view of the tips 31-3 of Hand Held Probe 31-20 which shows the end tips 31-9 of the embedded PMTL, surrounded by the metallic layers that terminate to a set of strategic whiskers 31-11 A and B, and the tip Whiskers 31-10 A and B that can be used to align and secure the PMTL tips 31-9 onto a test line on a PCB.

Microwave sockets can be used to insert the packaged chips, such as Ball Grid Arrays (BGA), or Land Grid Arrays (LGA) and many other types of packages to connect to ATE system for fast automated testing in the production line. The fully automated ATE machines provide a tower on which a Socket can be mounted and dismounted. The automatic action of picking and placing of packaged on to the socket is performed by robotic arms called handlers. The handlers takes a package to be tested and installs it in a socket. The socket is then placed on top of a load card with a matching connection pad that connects the terminals of the socket to traces on top of the load card. These contact points from the socket normally in the central region of the load card, fans out through radial traces to the edges of a circular shaped load card PCB where these traces terminate to connection pads that match the connection terminals on the top of ATE test tower. The connection between the ATE tower top, and the load card is normally made using springy POGO pins. The connection between the DUT package pins or pads and the top of the load card are normally made with POGO pins or other pressure-type connectors. After the handler places a DUT in a socket, it exerts a moderate force to the top of the DUT to make the pressure contact. Since the mechanism of making good electrical contact is complex, and uses metal to metal rubbing and scratching, these mechanisms fail very often. Normally, this stops the production testing to allow the tips and POGO pins to be replaced, and/or repaired. This entire process is very costly, and time consuming, and creates a huge limitation to production testing. These mechanical issues are further exacerbated by high inductance and capacitance parasitic and other electrical limitations of the POGO pins and other contact points. In the process, since there are four strategic points of contacts that are constantly taking a beating from the forces exerted by the handler robotic arm, they fail after tens of thousands of cycles, it is desired to test millions of packages without interruptions.

The PMTL transmission line provides a solution to this problem.

The sockets in use today are either delicately machined parts and or injection molded. They are expensive to manufacture. A new "s" type contact has been developed by JohnsTech, Inc. with elastomer support that provides some solution, but still suffers from down time and expensive repairing of the "s" contact points. One embodiment includes a universal socket that allows a very large array of contact say M×N Confined Filed Contact (CFC) points in the form of an M×N matrix of embedded PMTL transmission lines. This is made possible by the arraying M slices of the tri-level multi layer substrate of the cellular structure of a linear array of N PMTL transmission lines. By stacking M slices of each slice having N lines, construct a M×N matrix of CFC contact points as shown in FIGS. 32, 33, 34 and 35. The natural way these slices are constructed and the PMTL lines are printed in each slice can provide many possible and clever ways of making contracts to the top of ATE tower as shown. FIGS. 32, 33, 34, and 35 show one possible embodiment. Note that the profile of each slice can be made in any shape required. In this case, the outer slices are merely sheet metal with profiles to hold the central slices together. The PMTL carrying slices profiles are made strategically to house a range of DUT's and provides for alignment and fastening similar to the way the peacock connector 10-1 is made.

Figure 32:
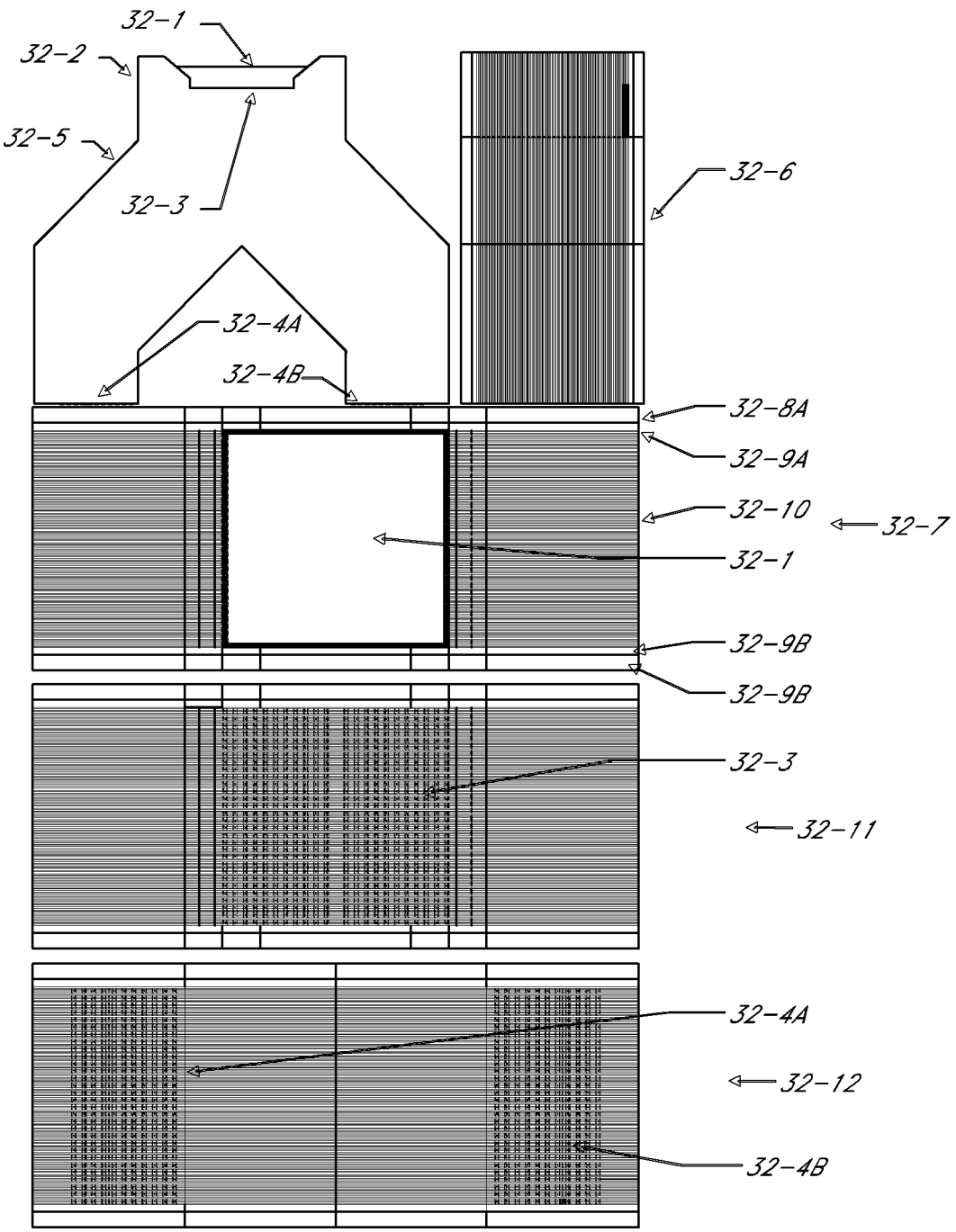
FIG. 32 shows various plan views of a Universal Test Socket (UTS) made from stratified layers consisting of PMTL's arrays forming a M×N Matrix of Confined Field Connection (CFC) on top and two half matrices M×N/2 of CFC on bottom to connect to the top of ATE towers.

FIG. 32 shows some plan views of one embodiment of a universal socket to provide equal electrical paths to the top of the ATE. In FIG. 32, 32-2 shows the front view of a universal socket. The profile shows a package DUT 32-1 setting on top of the socket on the array of M×N CFC matrix 32-3 (Between these some interposers can be inserted that are not shown, which can mask a connection pattern in the M×N array of CFC's. These interposers can be constructed from microwave laminates with vertical vias hole pattern for the connection pattern, and terminated/loaded vias for those CFC not to be used.) 32-6 shows the side view of the universal socket 32-2, exposing the multi slice nature of the construction. 32-7 shows the top view of the socket of 32-2 with the DUT package 32-1 in position. This view shows the sandwich of various slices of 32-10 between thicker outer slices 32-8 A and B and 32-9 A and B. 32-11 shows the same view as 32-7, but without the DUT thus, exposing the underneath matrix of M×N Confined Field Connection (CFC) 32-3 on the top of the socket. As shown in the profile of 32-2 front view, the top array of M×N Matrix 32-3 Array of connection CFC on top of M×N PMTL array is split into two separate M×n, where n=N/2, to the bottom sides 32-4A and 32-4B which is also illustrated in 32-12, in the bottom view of the universal socket 32-2. As is illustrated in FIG. 32, each sub array extends to the sides at a desired angle. (By way of example only, and not limitation, an angle of 45° is shown in the drawings.) 32-5 is shown in a manner that will bend the PMTL's outward to a certain distance and then another turn brings the PMTL array back in line vertically (also see FIG. 34). This way, the two sub-array of M×n connector 32-4A and B on either side provide a equal path connection with two M×n array of CFC terminals of PMTL's on bottom, which is the point of contact with the top of the ATE tower. These two arrays 32-4 A and B can be connected to the top of the ATE in a array type of CFC connector in a fixed and secure manner, perhaps with special types of interposers. Once this mechanism is connected to the top of the ATE, the signals are available at the top matrix 32-3 of M×N CFC. on which a BGA or LGA package DUT can directly sit to make contact with the ATE, thus allowing it to be tested. This modular mechanism has eliminated the four problematic contact points, to a single one, since the mechanism can be contacted via two sub matrix 32-4A and B in the bottom and secured on top of the ATE tower for millions of cycles without repair and mechanical beating. In this case, a handler robot needs to place the DUT packaged on the top of the mechanism Stratified Socket, and exerts a very minimal force to make contact. The wear and tear of the mechanism compared to what is being used today is completely removed. This can further be helped by using specially design interposers on top and bottom, of 32-3 and 32-4 contact matrices (not shown).

Figure 33:
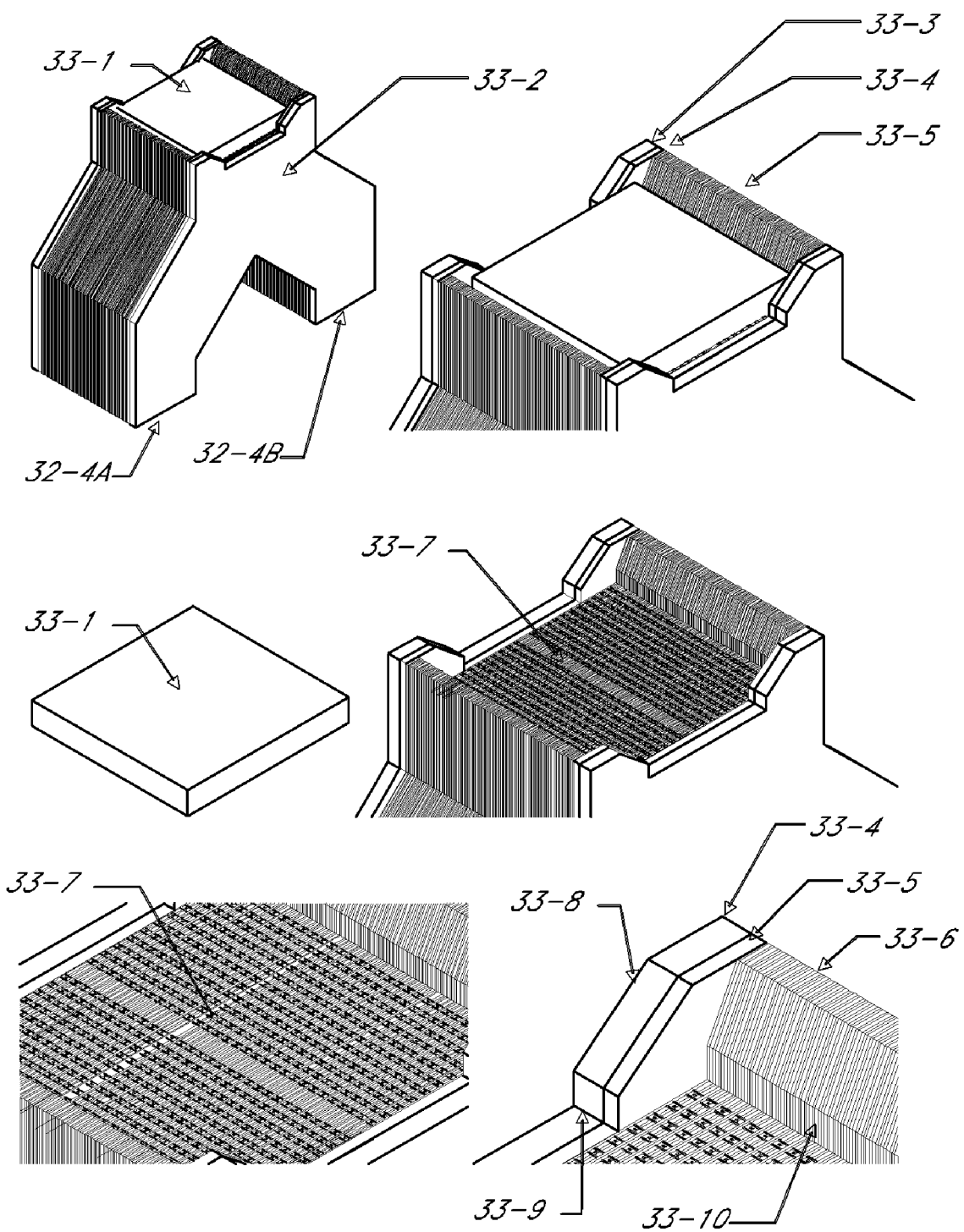
FIG. 33 shows various isotropic views of the UTS showing the details of top connection Matrix and with and without the DUT. Close ups showing the nature of the construction of the M×N CFC and PMTL arrays.

FIG. 32 illustrated some plan views of one embodiment of a universal socket. FIG. 33 shows some isometric views of the universal socket 32-2 to further illustrate more of its features. As shown, 33-2 Universal Test Socket (UTS) is shown with a DUT 31-1 mounted on top. The points of bottom contact sub matrices 32-4 A and B is also shown. The close up of the top of the UTS 33-2 further reveals the stratified nature of the design by showing the shaping of profile 33-3, 33-4, and 33-5 slices with the DUT 32-1 in position. Next, the DUT is removed to allow inspection of the top contact matrix 33-7 of the UTS socket. Additional zoomed in sections of the top of UTS reveals the CFC features of the matrix 33-7. As illustrated in FIG. 33d, each slice can be independently profiled to provide a unique feature of the UTS. For example, the outer slices 33-4 and 33-5 provide a cut out in their profile 33-8 and 33-9 to provide access for the DUT handler. The internal slices 33-6 provide strategic cutout profiles to allow placement and alignment device 33-10 for the DUT. This merely illustrates one useful feature of the universality of this UTS embodiment.

FIG. 34 shows various features of a single slice 33-6. 34-1 represents a typical slice which is the basic building block of UTS 33-2. As explained previously, the PMTL transmission lines on each slice starts from the top 33-7 from the CFC matrix flow down vertically 34-3, then makes a turn 34-4, and then another turn 34-5 thus, having split at 34-6 and terminating to two sub matrix connection points at the bottom of 32-4 A and B. While the top part of FIG. 34 shows a plan view of a slice, 34-10 shows an isometric view of the slice of 34-1. 34-11 shows a close up of the top of this slice to show the nature of a linear array of PMTL's 34-12 which is supported by a single slice. As illustrated in FIG. 34, close up, each slice is primarily constructed from the basic building block of three (At least, but more generally, a multiplicity of layers) primary layers that supports a PMTL 34-12 transmission line (13-1), the 34-16 sandwiched between 34-15 and 34-17. Another layer 34-14 can be on both sides of these assemblies, but near one is intentionally removed to show the ends of the holes 34-13. As is shown, the exposed face is metalized, that the array of plated through via holes 34-13 service as connecting the two metalized surfaces that together thus constituting an outer conductor confining the fields around the center conductions.

FIG. 35 presents another variation of the UTF adapted to a socket application. FIG. 35 shows 35-1 illustrates that a DUT package 33-1 can be mounted on the top of the z-micro positioner 19-1, with a connector type 10-1 with special inner part 35-3 hosting an array of PMTL's each of these lines can provide alignment whiskers 35-2 to keep a DUT 33-1 in place. Removing the DUT 33-1 from the assembly 35-1 exposes the underneath mechanism where the contact tips 8-9 are exposed. The bottom of the FIG. 35 illustrates that a UTF can be adapted to have the various modules, 10-1, 10-2, and 10-3 surrounding a 19-1 positioner with DUT, to be setting on top of a currently expositing ATE load cards 35-5, thus further illustrating the universality and versatility of the embodiments.

The universality of this type of socket is illustrated by the fact that although a large matrix M×N of contact points are available, some points can be left unused or blinded by a strategic low cost interposer that can be made specifically for each type of package with termination loads for top and bottom of the UTS. The job of this interposer is to blind or match unused PMTL and properly connect the PMTL CFC points by connecting the center connector and bring the ground contract around each CFC, essentially provide a Micronics length coaxial transmission line from top of UTS to the bottom of the DUT, and from the top of the ATE tower to the bottom of the UTS. Another function of this interposer is to be the only part that suffers from wear and tear that can be made cheap, and disposable, and simply replaceable even during automated testing, without the need to halt the testing process. In its simplest form, this can be a thin Kapton film with a pattern of vias, and vertical coaxial vias.

Another feature of the UTS is that by selecting a combination of strategic angles and length, the bottom ends of the PMTL array can be spread out to achieve a desired pitch that is much greater than the CFC array pitch on top. Furthermore, this can be achieved by a mechanism similar to the peacock-like system, where part of the connector is sandwiched between end brackets, and the rest are flexible PMTL arrays that can be connected to a much wider spread area. This may be a way to connect the UTS to existing ATE tower top patterns with no modification.

Vertical via made coaxial via arrays for inter slice connection, and a single slice cross over for crossing PMTLs on a single slice.

The UFT also provide a way to be mounted on top of the ATE and be used to test packages thus eliminating the need for any of the existing sockets.

Some of these possibilities include an M×N array of connectors strips of such as stack of 8-5, 8-4 (FIG. 8) combo connecting to a multiplicity of pads, that can be multiplicity of 12-21 the PMTL in the wide areas of the tapered multilayer 10-1, and that these multi connectors could serve to feed a multiplicity of embedded chips, and sub components that then provide outputs to the tip as desired for various situations, these include imbedded lumped passive elements, such as capacitors, inductors, bias tees, filters, amplifiers, mixers, other multi functional active and passive IC chips. The above connectors 8-4 can be designed to be quick connect/disconnect by design, the traces terminating to a single rigid PCB that with matching pin connector pattern that can be installed in a single action in much the same way a tradition PCB card are installed in mother boards.

One embodiment provides a unit cell of a single PMTL, it is understood that the design allows stacking a multiplicity of these units to establish a multiplicity of tips for connecting to a multiplicity M×N of connectors to a multiplicity of die pad m×n on the die. The PMTL's basic tri layer constitution to emulate a coaxial line, more generically can be obtained by a plurality of layers and other means of emulating center conductor, and the shields.

A unified piece of flex terminated to a section of rigid, and other microwave laminates to construct the disposable part of the connector, with uniform connection at 18-2. It can be useful to construct this in separate sections and have a quick-connect mechanism at 18-2 or any other embodiments.

It is the common practice to provide die pads 7-9 of GSG pattern. This disclosure describes a microscopic Confined Field Connector (CFC) in the form of PMTL to these pads. The open pads 7-9 can be made into Confined Field Pads (CFP) instead for naturally mating with the CFC tip. The CFP has an "S" always surrounded by coaxial rings of "G" to naturally make CFC connections thus providing a coaxial pad. This reduces leakage current flow in the probe structure, as outlined in U.S. Pat. No. 7,148,711. This is similar to putting two coaxial connectors back to back, instead of a coaxial line with a center connector and just a portion of shield. This also works well with the vertical probe technology 24-44, which is capable of making connection directly from top of the pad. This type of pad pattern can be made by simple modification of the tip trace pad masks.

The vertical tip probe 24-43 shows a probe top view that provides a convenient opening in the center. In one embodiment, a vacuum hose is provided to the tip, for pick-up and release of the chips, at least one fiber optic strand to act as an endoscope with a light emitting strand for illumination, and another with lens for viewing the chip and tips (optionally). This can be connected to a computer for automatic alignment and or visualization, a micro tube for spraying with squirts of a cleaning agent such as Freon, and another micro tube to send an air puff to dry it and blow away small dust particles and other sediments of the chip and wafer to prepare them for testing. A strand of heater element can be provided to locally change the temperature of the chip and a thermocouple to report the temperature for environmental testing. It is possible to incorporate a micro freezer tip that allows the full temperature variation of for example −40° C. to +150° C. of junctions of the DUT. It is possible to incorporate a micro chamber at the end of the tip, thus eliminating the need for bulky thermal chambers as is used today.

One embodiment incorporates a heat sinking cooling fin at the bottom of 20-2, and around the probe of 24-44 to remove heat if desired. Because the probing system is now compact, it is possible to enclose the test system in an environmental enclosure for environmental testing and or for sealing the entire structure from outside. In 24-44, the end hole could serve as a holding mechanism for an XYZ arm, that could rotate in phi. Standard calibration technique can be used to move the reference point to tip of the PMTL.

After reading the details of the disclosure, it should become apparent to those skilled in the art that, a feature of the manufacturing process is to trade in tight tolerances associated with circuit boards trace patterns for the looser thickness tolerances of stacked multilayer circuits. This avoids the tight manufacturing tolerances of the process on traces widths, gaps, pitches, etc., that are so critical in controlling precision of impedance, cross talk, and leakage out of the equation. Instead, use the highly controllable features of microwave laminates, namely the thickness, uniformity, cladding thickness, dielectric constant, rigidity or flexibility into the design. The PMTL provides a highly confined and well-defined TEM fields which is so scalable that can be made in dimensions of a micro meter, or dimensions of centimeters, which can follow any propagation paths pattern that is desired, that uses looser tolerances in manufacturing processes, and can literally be printed or chemically machined or stamped out in high volumes. In addition, the multi layer nature of the PMTL allows crossovers easily, so a number of PMTL's can exist on the same basic tri layer which can cross one another thus providing additional freedom in design.

Figure 36A:
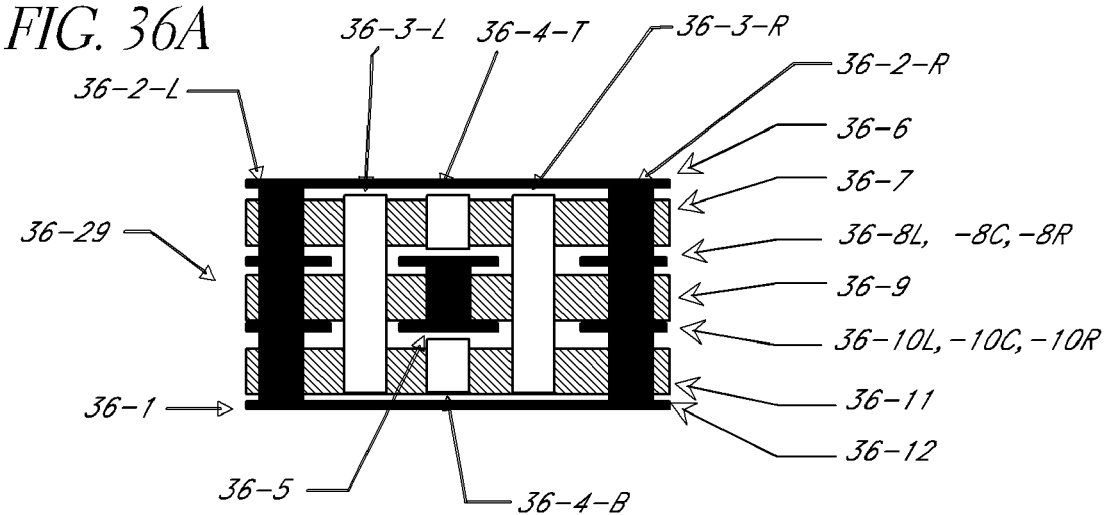
FIG. 36A shows one fabrication method for the PMTL.

The basic elements of the PMTL are further illustrated in FIG. 36. At least three alternatives are shown for its fabrication. The PMTL provides the low signal loss while providing well-controlled impedance from DC to THz, to reduce the cross talk, and eliminate radiation. The embodiment of FIG. 36A shows one fabrication method for the PMTL. It shows a cross section of a PMTL transmission line comprised of three dielectric layers 36-7, 36-9, and 36-11 and four metal layers 36-6, 36-8, 36-10 and 36-12. As shown, any of the metal layers can be comprised of a multiplicity of strips, and any of the dielectric layers can be comprised of multiplicity of sub layers.

The stack of PMTL 36-1 can accommodate a multiplicity of VIA holes, including air (or other gas) filled regions, or other materials filled, or plated through holes (PTH) The VIAS 36-3, 36-4 can be filled with low-loss dielectrics such as air (or other gas), foam, etc. While, the VIA 36-2, and 36-5 are plated through VIA holes (PTH's). In this case, the PTH's 36-2-L and 36-2-R serve to electrically connect the top metal layer 36-6 to the bottom metal layer 36-12. As illustrated, the PTH 36-2-L can further connect intermediate strip 36-8L and 36-10L (at the left side of FIG. 3A) to the top and bottom metal layers 36-6 and 36-12. Similarly, the PTH 36-2-R can further connect intermediate strip 36-8R and 36-10R (at the right side of FIG. 36A) to the top and bottom metal layers 36-6 and 36-12. Furthermore, the central strips 36-8C and 36-10C are electrically connected by PTH 36-5. The embodiment of 36-1 is a cross section of one PMTL topology. The Air Holes, PTHs, and strip pattern can continue into the plane of the drawing along the propagation path and out of the plane of the drawing too. The relative hole pattern can be repeated periodically with a desired lattice such as crystal structures, with a multiplicity of combination of PTH and Air VIAs. Any of the VIA, air filled, other filling, and Plated Through Holes PTH can be slots, openings, corrugations and any other general shape that serve to remove materials, or connect strips. The embodiment of 36-1 is but one possible illustration of the PMTL. There are large numbers of possible combinations for which this disclosure encompass. The embodiment of PMTL illustrated by 36-1 in FIG. 36A is more suitable for the standard PCB and CMOS photolithographic fabrication processes. It allows for a wide variation of material such as FR4, Flexible material, Semiconductor material and many yet to be invented materials and processes.

Figure 36B:
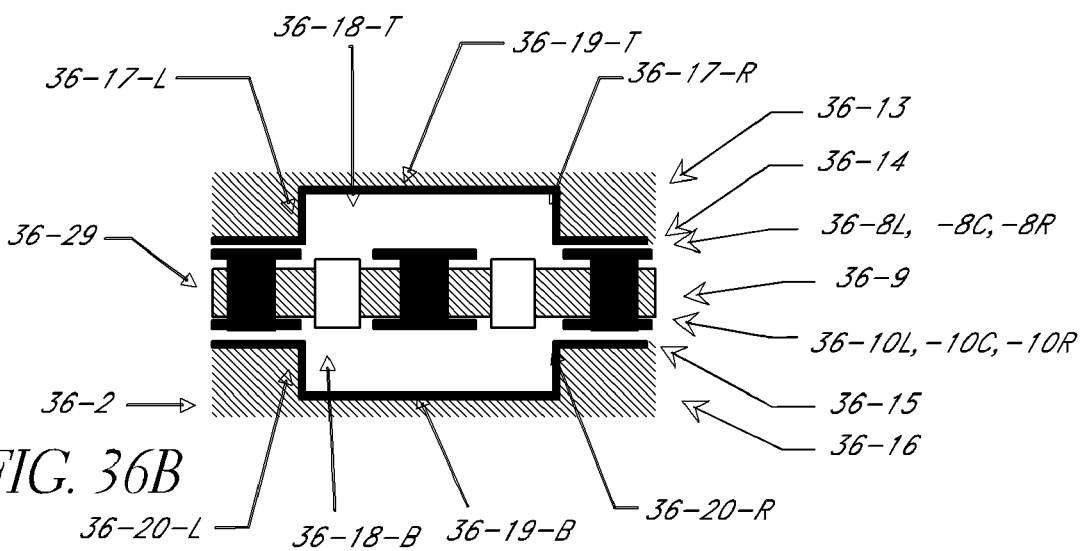
FIG. 36B shows another alternative fabrication of a PMTL.

FIG. 36B shows another alternative fabrication of a PMTL 36-2. In this embodiment, 36-2, the middle layers 36-9, and its corresponding PTH's 36-5, and strips 36-8C and 36-10C, and the side PTH's connecting side 36-8L and 36-10L, on left and 36-8R and 36-10R on the right side strips and air VIA's as shown in FIG. 36A is designated as unit 36-29, which is substantially the same as the corresponding middle layer in FIG. 36A embodiment 36-1

The embodiment of 36-29 in FIG. 36B is sandwiched between two other dielectric layers 36-13 and 36-16. The dielectric layer 36-13 and 36-16 each have a air channel (or filled with other materials) 36-18-T and 36-18-B respectively. Each channel 36-18-T and 36-18-B has a metalized walls 36-17-L, 36-17-R, and 36-20-L, 36-20-R pairs respectively. The dielectric layers have a metalized top and bottom of channel 36-19-T and 36-19-B, as well as surface metalization layers 36-14 and 36-15 respectively that is used to electrically connect the side PTH's of 36-29 middle layer. This is but one possible embodiment more suitable for modern semiconductor fabrication processes and newer technologies of imprinting technologies. Many other combinations of possibilities can be fabricated that remains within the scope of this disclosure.

Figure 36C:
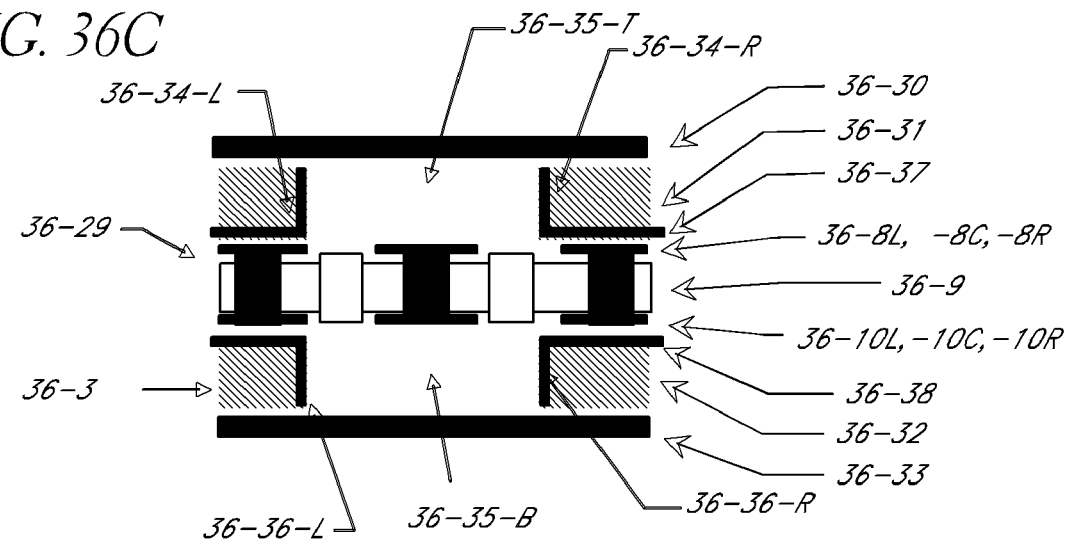
FIG. 36C shows the top and bottom dielectric layers.

An alternative method of manufacture of PMTL is illustrated in FIG. 36C and embodiment 36-3. Again, in embodiment of 36-3, the middle layer embodiment 36-29 could be reused with an alternative process of sandwiching. As illustrated in FIG. 36C, the top and bottom dielectric layers 36-31 and 36-32 can accommodate two etched through openings 36-35-T and 36-35-B respectively. The walls of the open channels 36-35-T and 36-35-B can be plated illustrated by 36-34-L, 36-34-R, and 36-36-L, 36-36-R respectively. Furthermore, the surfaces of dielectric layers 36-31 and 36-32 can be metalized as in 36-37 and 36-38, that can make electrical connection to the side VIAs of the sandwiched layer 36-29 designated by 36-8L, 36-8R and 36-10L, 36-10R. The open channels are then closed with a top metal layer 36-30 and bottom metal layer 36-33 to complete the embodiment of PMTL of 36-3. This alternative embodiment is more suitable for metal stamping and material stamping fabrication processes, as well as CMOS and PCB fabrication processes. Many other possible alternative are possible that fall within the scope of this disclosure.

Although various embodiments have been described above, other embodiments will be within the skill of one of ordinary skill in the art. Thus, for example, one of ordinary skill in the art will recognize that the PMTL can be constructed using various conductive materials for the conductors (e.g., copper, aluminum, etc.) and various dielectric materials the dielectrics (e.g., microwave circuit boards, Teflon, FR4, fiberglass circuit boards, kapton, etc.). Moreover, although various embodiments universal test fixtures are described, one of ordinary skill will recognize that other embodiments are within the scope of the claims. Thus, the invention is limited only by the claims that follow.

What is claimed is:

1. A micro coaxial transmission line comprising:
   an outer conductor comprising:
      a first conducting strip extending substantially along a first axis;
      a second conducting strip extending substantially parallel to said first axis; and
      a plurality of conductive members, each of said members electrically connecting said first conducting strip to said second conducting strip, said conductive members arranged along said first and second conducting strips;
   an inner conductor substantially between the first and second conducting strips of the outer conductor, and extending substantially parallel to said first axis; and
   a dielectric located between and extending roughly parallel to the inner conductor and the outer conductor, said dielectric extending roughly parallel to the first axis,
   wherein the dielectric comprises dielectric material with a plurality of cavities therein, said cavities being separated from one another by dielectric material and spaced periodically along the extent of the dielectric in a direction roughly parallel to the first axis.

2. The periodic micro coaxial transmission line of claim 1, wherein said conductive members comprise plated-through holes.

3. The periodic micro coaxial transmission line of claim 1, wherein said inner conductor comprises:
   a first inner conducting strip;
   a second inner conducting strip substantially parallel to said first conducting strip; and
   a plurality of inner conductive members electrically connecting said first inner conducting strip to said second inner conducting strip, said inner conductive members arranged along said first and second inner conducting strips.

4. The periodic micro coaxial transmission line of claim 3, wherein said inner conductive members comprise plated-through holes.

5. The periodic micro coaxial transmission line of claim 1, wherein said first and second conducting strips and said conductive members comprise a cage enclosing said inner conductor.

6. The periodic micro coaxial transmission line of claim 1, wherein said conductive members are arranged in two rows substantially along first and second edges of said first conducting strip and said second conducting strip.

7. The periodic micro coaxial transmission line of claim 1, wherein said cavities are filled with a low-loss dielectric.

8. The periodic micro coaxial transmission line of claim 7, wherein said low-loss dielectric comprises air.

9. The periodic micro coaxial transmission line of claim 7, wherein said low-loss dielectric comprises a gas.

10. The periodic micro coaxial transmission line of claim 7, wherein said low-loss dielectric comprises a foam.

11. The periodic micro coaxial transmission line of claim 1, wherein said at least one inner conductor comprises a single conductive strip.

12. The periodic micro coaxial transmission line of claim 1, wherein said cavities comprise one or more pockets of vacuum or low pressure gas.

13. The periodic micro coaxial transmission line of claim 1, comprising two or more inner conductors, wherein said inner conductors form one or more signaling pair units.

14. The periodic micro coaxial transmission line of claim 1, wherein said outer conductor further comprises at least two dielectric layers each comprising a channel extending along the first axis, wherein the channel comprises metalized walls, and wherein said metalized walls substantially shield said inner conductor.

15. The periodic micro coaxial transmission line of claim 1, wherein the pattern of cavities are formed by evenly spaced holes.

16. The periodic micro coaxial transmission line of claim 1, wherein the pattern of cavities repeats periodically.

17. The periodic micro coaxial transmission line of claim 1, wherein the dielectric comprises a plurality of dielectric layers.

18. The periodic micro coaxial transmission line of claim 1, wherein the plurality of cavities are located above and below the inner conductor.

19. The periodic micro coaxial transmission line of claim 1, wherein the plurality of cavities are located beside the inner conductor.

* * * * *